US011076507B2

(12) United States Patent
Morgan et al.

(10) Patent No.: US 11,076,507 B2
(45) Date of Patent: Jul. 27, 2021

(54) METHODS AND SYSTEMS FOR MANAGING FACILITY POWER AND COOLING

(71) Applicant: SCHNEIDER ELECTRIC IT CORPORATION, Foxboro, MA (US)

(72) Inventors: Jane E. Morgan, Glasnevin (IE); Neil Rasmussen, Concord, MA (US); James William VanGilder, Pepperell, MA (US); Mikkel Dalgas, Winchester, MA (US); Edward M. Ives, Exeter, RI (US); Morten Bock, Broager (DK); Brad T. Hammond, North Kingstown, RI (US); Todd J. Giaquinto, Cumberland, RI (US)

(73) Assignee: SCHNEIDER ELECTRIC IT CORPORATION, Foxboro, MA (US)

( * ) Notice: Subject to any disclaimer, the term of this patent is extended or adjusted under 35 U.S.C. 154(b) by 0 days.

(21) Appl. No.: 16/019,052

(22) Filed: Jun. 26, 2018

(65) Prior Publication Data
US 2019/0008072 A1 Jan. 3, 2019

Related U.S. Application Data

(63) Continuation of application No. 12/121,113, filed on May 15, 2008, now abandoned.
(Continued)

(51) Int. Cl.
*G06Q 10/06* (2012.01)
*H05K 7/20* (2006.01)
*H01H 21/24* (2006.01)

(52) U.S. Cl.
CPC .......... *H05K 7/2079* (2013.01); *G06Q 10/06* (2013.01); *G06Q 10/06313* (2013.01); *H01H 21/24* (2013.01); *H05K 7/20836* (2013.01)

(58) Field of Classification Search
CPC ................................................. G06Q 10/06313
See application file for complete search history.

(56) References Cited

U.S. PATENT DOCUMENTS

| 1,025,243 | A | 5/1912 | Carpenter et al. |
| 1,941,258 | A | 12/1933 | Gordon |

(Continued)

FOREIGN PATENT DOCUMENTS

| AU | 38553/95 A | 6/1996 |
| AU | 56011/98 A | 7/1998 |

(Continued)

OTHER PUBLICATIONS

Vanessa Lopez and Hendrik Hamann, Heat Transfer Modeling in Data Centers, Aug. 2, 2011, International Journal of Heat and Mass Transfer, vol. 54, pp. 5306-5318 (Year: 2011).*

(Continued)

*Primary Examiner* — Amanda Gurski
(74) *Attorney, Agent, or Firm* — Lando & Anastasi, LLP

(57) ABSTRACT

Systems and methods are provided for determining data center resource requirements, such as cooling and power requirements, and for monitoring performance of data center resource systems, such as cooling and power systems, in data centers. At least one aspect provides a system and method that enables a data center operator to determine available data center resources, such as power and cooling, at specific areas and enclosures in a data center to assist in locating new equipment in the data center.

17 Claims, 27 Drawing Sheets

Related U.S. Application Data

(60) Provisional application No. 60/938,034, filed on May 15, 2007.

(56) References Cited

U.S. PATENT DOCUMENTS

| | | |
|---|---|---|
| 2,254,914 A | 9/1941 | Rugg |
| 2,455,022 A | 11/1948 | Schmidt |
| 3,102,184 A | 8/1963 | Sherron |
| 3,317,798 A | 5/1967 | Chu et al. |
| 3,559,728 A | 2/1971 | Lyman et al. |
| 3,643,007 A | 2/1972 | Roberts et al. |
| 3,665,725 A | 5/1972 | Barlass et al. |
| 3,681,936 A | 8/1972 | Park |
| 3,742,725 A | 7/1973 | Berger |
| 3,810,138 A | 5/1974 | Thompson et al. |
| 3,995,446 A | 12/1976 | Eubank |
| 4,055,053 A | 10/1977 | Elfving et al. |
| 4,065,711 A | 12/1977 | Kawabata |
| 4,127,008 A | 11/1978 | Tyree, Jr. |
| 4,197,716 A | 4/1980 | Nussbaum |
| 4,223,535 A | 9/1980 | Kumm |
| 4,275,570 A | 6/1981 | Szymaszek et al. |
| 4,285,205 A | 8/1981 | Martin et al. |
| 4,338,794 A | 7/1982 | Haasis, Jr. |
| 4,349,879 A | 9/1982 | Peddie et al. |
| 4,352,274 A | 10/1982 | Anderson et al. |
| 4,419,865 A | 12/1983 | Szymaszek |
| 4,515,746 A | 5/1985 | Brun et al. |
| 4,521,645 A | 6/1985 | Carroll |
| 4,535,598 A | 8/1985 | Mount |
| 4,564,767 A | 1/1986 | Charych |
| 4,568,934 A | 2/1986 | Allgood |
| 4,590,538 A | 5/1986 | Cray, Jr. |
| 4,599,873 A | 7/1986 | Hyde |
| 4,636,652 A | 1/1987 | Raes |
| 4,637,020 A | 1/1987 | Schinabeck |
| 4,650,347 A | 3/1987 | Shigemura et al. |
| 4,665,322 A | 5/1987 | Eishima et al. |
| 4,668,939 A | 5/1987 | Kimura et al. |
| 4,673,826 A | 6/1987 | Masson |
| 4,683,529 A | 7/1987 | Bucher, II |
| 4,686,450 A | 8/1987 | Pichat |
| 4,696,168 A | 9/1987 | Woods et al. |
| 4,709,202 A | 11/1987 | Koenck et al. |
| 4,718,025 A | 1/1988 | Minor et al. |
| 4,718,249 A | 1/1988 | Hanson |
| 4,747,041 A | 5/1988 | Engel et al. |
| 4,751,648 A | 6/1988 | Sears, III et al. |
| 4,763,013 A | 8/1988 | Gvoth, Jr. et al. |
| 4,774,631 A | 9/1988 | Okuyama et al. |
| 4,816,208 A | 3/1989 | Woods et al. |
| 4,816,982 A | 3/1989 | Severinsky |
| 4,823,247 A | 4/1989 | Tamoto |
| 4,823,290 A | 4/1989 | Fasack et al. |
| 4,827,151 A | 5/1989 | Okado |
| 4,827,733 A | 5/1989 | Dinh |
| 4,831,508 A | 5/1989 | Hunter |
| 4,837,663 A | 6/1989 | Zushi et al. |
| 4,840,811 A | 6/1989 | Bayerlein et al. |
| 4,851,965 A | 7/1989 | Gabuzda et al. |
| 4,911,231 A | 3/1990 | Horne et al. |
| 4,935,861 A | 6/1990 | Johnson, Jr. et al. |
| 4,937,505 A | 6/1990 | Deglon et al. |
| 4,943,902 A | 7/1990 | Severinsky |
| 4,944,158 A | 7/1990 | Akiike et al. |
| 4,962,734 A | 10/1990 | Jorgensen |
| 4,964,029 A | 10/1990 | Severinsky et al. |
| 4,964,065 A | 10/1990 | Hicks et al. |
| 4,980,812 A | 12/1990 | Johnson, Jr. et al. |
| 5,017,800 A | 5/1991 | Divan |
| 5,019,717 A | 5/1991 | McCurry et al. |
| 5,043,807 A | 8/1991 | Rabii |
| 5,045,989 A | 9/1991 | Higaki et al. |
| 5,047,913 A | 9/1991 | De Doncker et al. |
| 5,047,961 A | 9/1991 | Simonsen |
| 5,057,698 A | 10/1991 | Widener et al. |
| 5,057,968 A | 10/1991 | Morrison |
| 5,061,916 A | 10/1991 | French et al. |
| 5,063,477 A | 11/1991 | Paggen et al. |
| 5,086,385 A | 2/1992 | Launey et al. |
| 5,089,974 A | 2/1992 | Demeyer et al. |
| 5,095,712 A | 3/1992 | Narreau |
| 5,097,328 A | 3/1992 | Boyette |
| 5,099,410 A | 3/1992 | Divan |
| 5,109,278 A | 4/1992 | Erickson et al. |
| 5,126,585 A | 6/1992 | Boys |
| 5,148,043 A | 9/1992 | Hirata et al. |
| 5,150,580 A | 9/1992 | Hyde |
| 5,153,837 A | 10/1992 | Shaffer et al. |
| 5,157,732 A | 10/1992 | Ishii et al. |
| 5,158,132 A | 10/1992 | Guillemot |
| 5,168,171 A | 12/1992 | Tracewell |
| 5,168,724 A | 12/1992 | Gilbertson et al. |
| 5,173,819 A | 12/1992 | Takahashi et al. |
| 5,177,666 A | 1/1993 | Bland et al. |
| 5,181,653 A | 1/1993 | Foster et al. |
| 5,184,025 A | 2/1993 | McCurry et al. |
| 5,189,394 A | 2/1993 | Walter et al. |
| 5,195,706 A | 3/1993 | Allen |
| 5,210,680 A | 5/1993 | Scheibler |
| 5,216,623 A | 6/1993 | Barrett et al. |
| 5,220,522 A | 6/1993 | Wilson et al. |
| 5,225,997 A | 7/1993 | Lederer et al. |
| 5,227,262 A | 7/1993 | Ozer |
| 5,229,850 A | 7/1993 | Toyoshima |
| 5,234,185 A | 8/1993 | Hoffman et al. |
| 5,241,217 A | 8/1993 | Severinsky |
| 5,254,928 A | 10/1993 | Young et al. |
| 5,262,758 A | 11/1993 | Nam et al. |
| 5,269,372 A | 12/1993 | Chu et al. |
| 5,272,382 A | 12/1993 | Heald et al. |
| 5,281,955 A | 1/1994 | Reich et al. |
| 5,289,275 A | 2/1994 | Ishii et al. |
| 5,291,383 A | 3/1994 | Oughton |
| 5,302,858 A | 4/1994 | Folts |
| 5,315,533 A | 5/1994 | Stich et al. |
| 5,319,571 A | 6/1994 | Langer et al. |
| 5,349,282 A | 9/1994 | McClure |
| 5,367,670 A | 11/1994 | Ward et al. |
| 5,381,554 A | 1/1995 | Langer et al. |
| 5,382,893 A | 1/1995 | Dehnel |
| 5,382,943 A | 1/1995 | Tanaka |
| 5,384,792 A | 1/1995 | Hirachi |
| 5,388,422 A | 2/1995 | Hayashida et al. |
| 5,395,042 A | 3/1995 | Riley et al. |
| 5,400,246 A | 3/1995 | Wilson et al. |
| 5,404,136 A | 4/1995 | Marsden |
| 5,409,419 A | 4/1995 | Euchner et al. |
| 5,410,448 A | 4/1995 | Barker, III et al. |
| 5,414,591 A | 5/1995 | Kimura et al. |
| 5,422,558 A | 6/1995 | Stewart |
| 5,440,450 A | 8/1995 | Lau et al. |
| 5,457,377 A | 10/1995 | Jonsson |
| 5,458,991 A | 10/1995 | Severinsky |
| 5,462,225 A | 10/1995 | Massara et al. |
| 5,465,011 A | 11/1995 | Miller et al. |
| 5,475,364 A | 12/1995 | Kenet |
| 5,477,091 A | 12/1995 | Fiorina et al. |
| 5,488,430 A | 1/1996 | Hong |
| 5,491,511 A | 2/1996 | Odle |
| 5,497,288 A | 3/1996 | Otis et al. |
| 5,504,415 A | 4/1996 | Podrazhansky et al. |
| 5,507,529 A | 4/1996 | Martins |
| 5,508,941 A | 4/1996 | Leplingard et al. |
| 5,510,690 A | 4/1996 | Tanaka et al. |
| 5,519,306 A | 5/1996 | Itoh et al. |
| 5,528,507 A | 6/1996 | McNamara et al. |
| 5,533,357 A | 7/1996 | Voorhis |
| 5,540,548 A | 7/1996 | Eberhardt et al. |
| 5,544,012 A | 8/1996 | Koike |
| 5,548,659 A | 8/1996 | Okamoto |
| 5,553,609 A | 9/1996 | Chen et al. |
| 5,561,476 A | 10/1996 | Kershaw et al. |
| 5,563,493 A | 10/1996 | Matsuda et al. |

(56) References Cited

U.S. PATENT DOCUMENTS

| | | |
|---|---|---|
| 5,566,339 A | 10/1996 | Perholtz et al. |
| 5,572,195 A | 11/1996 | Heller et al. |
| 5,572,873 A | 11/1996 | Lavigne et al. |
| 5,579,197 A | 11/1996 | Mengelt et al. |
| 5,581,478 A | 12/1996 | Cruse et al. |
| 5,582,020 A | 12/1996 | Scaringe et al. |
| 5,586,202 A | 12/1996 | Ohki et al. |
| 5,586,250 A | 12/1996 | Carbonneau et al. |
| 5,588,067 A | 12/1996 | Peterson et al. |
| 5,589,764 A | 12/1996 | Lee |
| 5,602,462 A | 2/1997 | Stich et al. |
| 5,602,585 A | 2/1997 | Dickinson et al. |
| 5,621,662 A | 4/1997 | Humphries et al. |
| 5,634,002 A | 5/1997 | Polk et al. |
| 5,642,002 A | 6/1997 | Mekanik et al. |
| 5,649,428 A | 7/1997 | Calton et al. |
| 5,654,591 A | 8/1997 | Mabboux et al. |
| 5,657,641 A | 8/1997 | Cunningham et al. |
| 5,659,470 A | 8/1997 | Goska et al. |
| 5,664,202 A | 9/1997 | Chen et al. |
| 5,682,949 A | 11/1997 | Ratcliffe et al. |
| 5,684,686 A | 11/1997 | Reddy |
| 5,694,780 A | 12/1997 | Alsenz |
| 5,704,219 A | 1/1998 | Suzuki et al. |
| 5,715,160 A | 2/1998 | Plotke |
| 5,718,628 A | 2/1998 | Nakazato et al. |
| 5,731,832 A | 3/1998 | Ng |
| 5,732,074 A | 3/1998 | Spaur et al. |
| 5,732,219 A | 3/1998 | Blumer et al. |
| 5,735,134 A | 4/1998 | Liu et al. |
| 5,742,762 A | 4/1998 | Scholl et al. |
| RE35,793 E | 5/1998 | Halpern |
| 5,749,237 A | 5/1998 | Sandofsky et al. |
| 5,768,430 A | 6/1998 | Takashima et al. |
| 5,794,897 A | 8/1998 | Jobin et al. |
| 5,798,798 A | 8/1998 | Rector et al. |
| 5,802,856 A | 9/1998 | Schaper et al. |
| 5,805,458 A | 9/1998 | McNamara et al. |
| 5,812,055 A | 9/1998 | Candy et al. |
| 5,818,725 A | 10/1998 | McNamara et al. |
| 5,822,302 A | 10/1998 | Scheetz et al. |
| 5,829,130 A | 11/1998 | Miller |
| 5,844,328 A | 12/1998 | Furst |
| 5,845,090 A | 12/1998 | Collins, III et al. |
| 5,850,539 A | 12/1998 | Cook et al. |
| 5,860,012 A | 1/1999 | Luu |
| 5,860,280 A | 1/1999 | Recine, Sr. et al. |
| 5,860,857 A | 1/1999 | Wasastjerna et al. |
| 5,870,698 A | 2/1999 | Riedel et al. |
| 5,872,931 A | 2/1999 | Chivaluri |
| 5,892,440 A | 4/1999 | Bryan |
| 5,896,922 A | 4/1999 | Chrysler et al. |
| 5,901,057 A | 5/1999 | Brand et al. |
| 5,905,867 A | 5/1999 | Giorgio |
| 5,910,045 A | 6/1999 | Aoki et al. |
| 5,914,858 A | 6/1999 | McKeen et al. |
| 5,923,103 A | 7/1999 | Pulizzi et al. |
| 5,926,210 A | 7/1999 | Hackett et al. |
| 5,937,092 A | 8/1999 | Wootton et al. |
| 5,937,097 A | 8/1999 | Lennon |
| 5,940,274 A | 8/1999 | Sato et al. |
| 5,949,974 A | 9/1999 | Ewing et al. |
| 5,953,930 A | 9/1999 | Chu et al. |
| 5,954,127 A | 9/1999 | Chrysler et al. |
| 5,955,946 A | 9/1999 | Beheshti et al. |
| 5,959,240 A | 9/1999 | Yoshida et al. |
| 5,960,204 A | 9/1999 | Yinger et al. |
| 5,963,425 A | 10/1999 | Chrysler et al. |
| 5,963,457 A | 10/1999 | Kanoi et al. |
| 5,968,116 A | 10/1999 | Day, II et al. |
| 5,968,398 A | 10/1999 | Schmitt et al. |
| 5,970,731 A | 10/1999 | Hare et al. |
| 5,970,734 A | 10/1999 | Stillwell et al. |
| 5,972,196 A | 10/1999 | Murphy et al. |
| 5,974,237 A | 10/1999 | Shurmer et al. |
| 5,978,594 A | 11/1999 | Bonnell et al. |
| 5,978,912 A | 11/1999 | Rakavy et al. |
| 5,982,618 A | 11/1999 | Roos |
| 5,982,652 A | 11/1999 | Simonelli et al. |
| 5,984,144 A | 11/1999 | Wyatt |
| 5,987,614 A | 11/1999 | Mitchell et al. |
| 5,991,885 A | 11/1999 | Chang et al. |
| 5,995,729 A | 11/1999 | Hirosawa et al. |
| 5,999,403 A | 12/1999 | Neustadt |
| 6,000,232 A | 12/1999 | Witten-Hannah et al. |
| 6,001,065 A | 12/1999 | DeVito |
| 6,002,237 A | 12/1999 | Gaza |
| 6,006,171 A | 12/1999 | Vines et al. |
| 6,023,935 A | 2/2000 | Okazaki et al. |
| 6,032,472 A | 3/2000 | Heinrichs et al. |
| 6,034,872 A | 3/2000 | Chrysler et al. |
| 6,038,879 A | 3/2000 | Turcotte et al. |
| 6,046,920 A | 4/2000 | Cazabat et al. |
| 6,052,282 A | 4/2000 | Sugiyama et al. |
| 6,052,750 A | 4/2000 | Lea |
| 6,055,480 A | 4/2000 | Nevo et al. |
| 6,057,834 A | 5/2000 | Pickover |
| 6,058,434 A | 5/2000 | Wilt et al. |
| 6,069,412 A | 5/2000 | Raddi et al. |
| 6,075,698 A | 6/2000 | Hogan et al. |
| 6,078,253 A | 6/2000 | Fowler |
| 6,078,957 A | 6/2000 | Adelman et al. |
| 6,081,606 A | 6/2000 | Hansen et al. |
| 6,085,243 A | 7/2000 | Fletcher et al. |
| 6,088,225 A | 7/2000 | Parry et al. |
| 6,088,816 A | 7/2000 | Nouri et al. |
| 6,094,676 A | 7/2000 | Gray et al. |
| 6,100,806 A | 8/2000 | Gaukel |
| 6,101,459 A | 8/2000 | Tavallaei et al. |
| 6,104,607 A | 8/2000 | Behl |
| 6,104,755 A | 8/2000 | Ohara |
| 6,104,868 A | 8/2000 | Peters et al. |
| 6,105,061 A | 8/2000 | Nakai |
| 6,108,782 A | 8/2000 | Fletcher et al. |
| 6,111,036 A | 8/2000 | Wonders et al. |
| 6,112,235 A | 8/2000 | Spofford |
| 6,112,237 A | 8/2000 | Donaldson et al. |
| 6,115,468 A | 9/2000 | De Nicolo |
| 6,121,695 A | 9/2000 | Loh |
| 6,122,603 A | 9/2000 | Budike, Jr. |
| 6,122,639 A | 9/2000 | Babu et al. |
| 6,125,145 A | 9/2000 | Koyanagi et al. |
| 6,128,016 A | 10/2000 | Coelho et al. |
| 6,134,511 A | 10/2000 | Subbarao |
| 6,138,078 A | 10/2000 | Canada et al. |
| 6,138,249 A | 10/2000 | Nolet |
| 6,139,177 A | 10/2000 | Venkatraman et al. |
| 6,139,347 A | 10/2000 | Nebon et al. |
| 6,141,762 A | 10/2000 | Nicol et al. |
| 6,144,770 A | 11/2000 | Lennon |
| 6,145,502 A | 11/2000 | Lyons et al. |
| 6,148,262 A | 11/2000 | Fry |
| 6,157,943 A | 12/2000 | Meyer |
| 6,160,584 A | 12/2000 | Yanagita |
| 6,160,926 A | 12/2000 | Dow et al. |
| 6,164,369 A | 12/2000 | Stoller |
| 6,167,406 A | 12/2000 | Hoskins et al. |
| 6,169,669 B1 | 1/2001 | Choudhury |
| 6,170,007 B1 | 1/2001 | Venkatraman et al. |
| 6,173,323 B1 | 1/2001 | Moghe |
| 6,175,866 B1 | 1/2001 | Holloway et al. |
| 6,175,886 B1 | 1/2001 | Usami |
| 6,175,927 B1 | 1/2001 | Cromer et al. |
| 6,177,884 B1 | 1/2001 | Hunt et al. |
| 6,181,103 B1 | 1/2001 | Chen |
| 6,182,094 B1 | 1/2001 | Humpleman et al. |
| 6,182,157 B1 | 1/2001 | Schlener et al. |
| 6,184,593 B1 | 2/2001 | Jungreis |
| 6,189,109 B1 | 2/2001 | Sheikh et al. |
| 6,191,500 B1 | 2/2001 | Toy |
| 6,195,018 B1 | 2/2001 | Ragle et al. |
| 6,198,628 B1 | 3/2001 | Smith |
| 6,199,204 B1 | 3/2001 | Donohue |
| 6,201,319 B1 | 3/2001 | Simonelli et al. |

(56) References Cited

U.S. PATENT DOCUMENTS

| | | |
|---|---|---|
| 6,201,371 B1 | 3/2001 | Kawabe et al. |
| 6,208,261 B1 | 3/2001 | Olstead |
| 6,208,345 B1 | 3/2001 | Sheard et al. |
| 6,208,510 B1 | 3/2001 | Trudeau et al. |
| 6,209,330 B1 | 4/2001 | Timmerman et al. |
| 6,213,194 B1 | 4/2001 | Chrysler et al. |
| 6,215,287 B1 | 4/2001 | Matsushiro et al. |
| 6,215,404 B1 | 4/2001 | Morales |
| 6,216,482 B1 | 4/2001 | Xiao et al. |
| 6,216,956 B1 | 4/2001 | Ehlers et al. |
| 6,219,628 B1 | 4/2001 | Kodosky et al. |
| 6,222,729 B1 | 4/2001 | Yoshikawa |
| 6,223,810 B1 | 5/2001 | Chu et al. |
| 6,229,429 B1 | 5/2001 | Horon |
| 6,236,332 B1 | 5/2001 | Conkright et al. |
| 6,237,353 B1 | 5/2001 | Sishtla et al. |
| 6,246,780 B1 | 6/2001 | Sato |
| 6,246,969 B1 | 6/2001 | Sinclair et al. |
| 6,252,770 B1 | 6/2001 | Yu et al. |
| 6,259,232 B1 | 7/2001 | Douglass et al. |
| 6,259,956 B1 | 7/2001 | Myers et al. |
| 6,266,721 B1 | 7/2001 | Sheikh et al. |
| 6,271,845 B1 | 8/2001 | Richardson |
| 6,274,950 B1 | 8/2001 | Gottlieb et al. |
| 6,276,161 B1 | 8/2001 | Peiffer et al. |
| 6,281,790 B1 | 8/2001 | Kimmel et al. |
| 6,282,546 B1 | 8/2001 | Gleichauf et al. |
| 6,288,897 B1 | 9/2001 | Fritschle et al. |
| 6,292,379 B1 | 9/2001 | Edevold et al. |
| 6,298,144 B1 | 10/2001 | Pucker, II et al. |
| 6,304,900 B1 | 10/2001 | Cromer et al. |
| 6,305,180 B1 | 10/2001 | Miller et al. |
| 6,310,783 B1 | 10/2001 | Winch et al. |
| 6,311,105 B1 | 10/2001 | Budike, Jr. |
| 6,311,214 B1 | 10/2001 | Rhoads |
| 6,317,320 B1 | 11/2001 | Cosley et al. |
| 6,317,348 B1 | 11/2001 | Vackar |
| 6,324,644 B1 | 11/2001 | Rakavy et al. |
| 6,327,143 B1 | 12/2001 | Bonstrom et al. |
| 6,329,792 B1 | 12/2001 | Dunn et al. |
| 6,330,176 B1 | 12/2001 | Thrap et al. |
| 6,332,202 B1 | 12/2001 | Sheikh et al. |
| 6,332,335 B1 | 12/2001 | Kajimoto et al. |
| 6,338,094 B1 | 1/2002 | Scott et al. |
| 6,338,437 B1 | 1/2002 | Kline et al. |
| 6,343,320 B1 | 1/2002 | Fairchild et al. |
| 6,347,627 B1 | 2/2002 | Frankie et al. |
| 6,360,255 B1 | 3/2002 | McCormack et al. |
| 6,363,421 B2 | 3/2002 | Barker et al. |
| 6,363,422 B1 | 3/2002 | Hunter et al. |
| 6,368,064 B1 | 4/2002 | Bendikas et al. |
| 6,373,840 B1 | 4/2002 | Chen |
| 6,374,296 B1 | 4/2002 | Lim et al. |
| 6,374,627 B1 | 4/2002 | Schumacher et al. |
| 6,375,561 B1 | 4/2002 | Nicolai et al. |
| 6,375,614 B1 | 4/2002 | Braun et al. |
| 6,381,156 B1 | 4/2002 | Sakai et al. |
| 6,381,700 B1 | 4/2002 | Yoshida |
| 6,389,464 B1 | 5/2002 | Krishnamurthy et al. |
| 6,396,534 B1 | 5/2002 | Mahler et al. |
| 6,400,043 B1 | 6/2002 | Batson et al. |
| 6,400,103 B1 | 6/2002 | Adamson |
| 6,400,591 B2 | 6/2002 | Reilly et al. |
| 6,400,996 B1 | 6/2002 | Hoffberg et al. |
| 6,402,691 B1 | 6/2002 | Peddicord et al. |
| 6,404,348 B1 | 6/2002 | Wilfong |
| 6,405,216 B1 | 6/2002 | Minnaert et al. |
| 6,406,257 B1 | 6/2002 | Houdek |
| 6,412,292 B2 | 7/2002 | Spinazzola et al. |
| 6,415,628 B1 | 7/2002 | Ahmed et al. |
| 6,424,119 B1 | 7/2002 | Nelson et al. |
| 6,433,444 B1 | 8/2002 | de Vries |
| 6,437,691 B1 | 8/2002 | Sandelman et al. |
| 6,438,978 B1 | 8/2002 | Bessler |
| 6,445,088 B1 | 9/2002 | Spitaels et al. |
| 6,449,745 B1 | 9/2002 | Kim et al. |
| 6,455,954 B1 | 9/2002 | Dailey |
| 6,457,076 B1 | 9/2002 | Cheng et al. |
| 6,459,579 B1 | 10/2002 | Farmer et al. |
| 6,462,944 B1 | 10/2002 | Lin |
| 6,463,997 B1 | 10/2002 | Nicolai et al. |
| 6,474,087 B1 | 11/2002 | Lifson |
| 6,477,667 B1 | 11/2002 | Levi et al. |
| 6,483,730 B2 | 11/2002 | Johnson, Jr. |
| 6,489,561 B2 | 12/2002 | Ziegler et al. |
| 6,493,243 B1 | 12/2002 | Real |
| 6,494,050 B2 | 12/2002 | Spinazzola et al. |
| 6,496,105 B2 | 12/2002 | Fisher et al. |
| 6,505,086 B1 | 1/2003 | Dodd, Jr. et al. |
| 6,505,256 B1 | 1/2003 | York |
| 6,510,350 B1 | 1/2003 | Steen, III et al. |
| 6,529,230 B1 | 3/2003 | Chong |
| 6,529,936 B1 | 3/2003 | Mayo et al. |
| 6,535,382 B2 | 3/2003 | Bishop et al. |
| 6,553,336 B1 | 4/2003 | Johnson et al. |
| 6,553,418 B1 | 4/2003 | Collins et al. |
| 6,557,357 B2 | 5/2003 | Spinazzola et al. |
| 6,557,624 B1 | 5/2003 | Stahl et al. |
| 6,565,428 B2 | 5/2003 | Hsiao |
| 6,574,104 B2 | 6/2003 | Patel et al. |
| 6,574,970 B2 | 6/2003 | Spinazzola et al. |
| 6,575,234 B2 | 6/2003 | Nelson |
| 6,584,329 B1 | 6/2003 | Wendelrup et al. |
| 6,591,279 B1 | 7/2003 | Emens et al. |
| 6,611,428 B1 | 8/2003 | Wong |
| 6,611,866 B1 | 8/2003 | Goldman |
| 6,639,383 B2 | 10/2003 | Nelson et al. |
| 6,640,145 B2 | 10/2003 | Hoffberg et al. |
| 6,640,889 B1 | 11/2003 | Harte et al. |
| 6,654,265 B2 | 11/2003 | Sadler et al. |
| 6,658,595 B1 | 12/2003 | Thamattoor |
| 6,661,678 B2 | 12/2003 | Raddi et al. |
| 6,662,576 B1 | 12/2003 | Bai |
| 6,668,565 B1 | 12/2003 | Johnson et al. |
| 6,672,955 B2 | 1/2004 | Charron |
| 6,681,787 B2 | 1/2004 | Tinsley et al. |
| 6,682,100 B2 | 1/2004 | Wood et al. |
| 6,682,159 B2 | 1/2004 | Compagnucci |
| 6,686,838 B1 | 2/2004 | Rezvani et al. |
| 6,694,759 B1 | 2/2004 | Bash et al. |
| 6,695,577 B1 | 2/2004 | Susek |
| 6,700,351 B2 | 3/2004 | Blair et al. |
| 6,704,196 B1 | 3/2004 | Rodriguez et al. |
| 6,704,199 B2 | 3/2004 | Wiley |
| 6,711,264 B1 | 3/2004 | Matsumoto et al. |
| 6,714,977 B1 | 3/2004 | Fowler et al. |
| 6,718,277 B2 | 4/2004 | Sharma |
| 6,718,364 B2 | 4/2004 | Connelly et al. |
| 6,718,781 B2 | 4/2004 | Freund et al. |
| 6,721,672 B2 | 4/2004 | Spitaels et al. |
| 6,722,151 B2 | 4/2004 | Spinazzola et al. |
| 6,724,624 B1 | 4/2004 | Dodson |
| 6,728,119 B2 | 4/2004 | Reilly et al. |
| 6,737,840 B2 | 5/2004 | McDonald et al. |
| 6,745,579 B2 | 6/2004 | Spinazzola et al. |
| 6,745,590 B1 | 6/2004 | Johnson et al. |
| 6,756,998 B1 | 6/2004 | Bilger |
| 6,757,185 B2 | 6/2004 | Rojas Romero |
| 6,761,212 B2 | 7/2004 | DiPaolo |
| 6,775,137 B2 | 8/2004 | Chu et al. |
| 6,778,386 B2 | 8/2004 | Garnett et al. |
| 6,788,535 B2 | 9/2004 | Dodgen et al. |
| 6,795,928 B2 | 9/2004 | Bradley et al. |
| 6,801,940 B1 | 10/2004 | Moran et al. |
| 6,803,678 B2 | 10/2004 | Gottlieb et al. |
| 6,804,616 B2 | 10/2004 | Bodas |
| 6,804,975 B2 | 10/2004 | Park |
| 6,814,134 B1 | 11/2004 | Pravda |
| 6,819,560 B2 | 11/2004 | Konshak et al. |
| 6,819,563 B1 | 11/2004 | Chu et al. |
| 6,822,859 B2 | 11/2004 | Coglitore et al. |
| 6,827,142 B2 | 12/2004 | Winkler et al. |
| 6,829,630 B1 | 12/2004 | Pajak et al. |
| 6,832,504 B1 | 12/2004 | Birkmann |

(56) References Cited

U.S. PATENT DOCUMENTS

| | | |
|---|---|---|
| 6,838,925 B1 | 1/2005 | Nielsen |
| 6,848,989 B2 | 2/2005 | Miyazaki et al. |
| 6,850,426 B2 | 2/2005 | Kojori et al. |
| 6,853,097 B2 | 2/2005 | Matsuda et al. |
| 6,853,564 B2 | 2/2005 | Kravitz |
| 6,859,366 B2 | 2/2005 | Fink |
| 6,859,882 B2 | 2/2005 | Fung |
| 6,862,179 B2 | 3/2005 | Beitelmal et al. |
| 6,880,349 B2 | 4/2005 | Johnson et al. |
| 6,881,142 B1 | 4/2005 | Nair |
| 6,886,353 B2 | 5/2005 | Patel |
| 6,889,752 B2 | 5/2005 | Stoller |
| 6,889,908 B2 | 5/2005 | Crippen et al. |
| 6,901,767 B2 | 6/2005 | Wood |
| 6,924,981 B2 | 8/2005 | Chu et al. |
| 6,927,977 B2 | 8/2005 | Singer |
| 6,927,980 B2 | 8/2005 | Fukuda et al. |
| 6,944,035 B2 | 9/2005 | Raddi et al. |
| 6,955,058 B2 | 10/2005 | Taras et al. |
| 6,959,558 B2 | 11/2005 | Bean, Jr. et al. |
| 6,964,539 B2 | 11/2005 | Bradley et al. |
| 6,967,283 B2 | 11/2005 | Rasmussen et al. |
| 6,967,841 B1 | 11/2005 | Chu et al. |
| 6,973,797 B2 | 12/2005 | Nemit, Jr. |
| 6,973,801 B1 | 12/2005 | Campbell et al. |
| 6,980,433 B2 | 12/2005 | Fink |
| 6,983,212 B2 | 1/2006 | Burns |
| 6,990,513 B2 | 1/2006 | Belfiore et al. |
| 7,000,416 B2 | 2/2006 | Hirooka et al. |
| 7,000,467 B2 | 2/2006 | Chu et al. |
| 7,005,759 B2 | 2/2006 | Ying et al. |
| 7,012,807 B2 | 3/2006 | Chu et al. |
| 7,012,825 B2 | 3/2006 | Nielsen |
| 7,020,586 B2 | 3/2006 | Snevely |
| 7,031,870 B2 | 4/2006 | Sharma et al. |
| 7,032,119 B2 | 4/2006 | Fung |
| 7,033,267 B2 | 4/2006 | Rasmussen |
| 7,046,514 B2 | 5/2006 | Fink et al. |
| 7,047,300 B1 | 5/2006 | Oehrke et al. |
| 7,051,096 B1 | 5/2006 | Krawiec et al. |
| 7,051,802 B2 | 5/2006 | Baer |
| 7,051,946 B2 | 5/2006 | Bash et al. |
| 7,065,600 B2 | 6/2006 | Papa et al. |
| 7,082,541 B2 | 7/2006 | Hammond et al. |
| 7,085,133 B2 | 8/2006 | Hall |
| 7,086,247 B2 | 8/2006 | Campbell et al. |
| 7,091,625 B2 | 8/2006 | Okusawa et al. |
| 7,104,081 B2 | 9/2006 | Chu et al. |
| 7,106,590 B2 | 9/2006 | Chu et al. |
| 7,112,131 B2 | 9/2006 | Rasmussen et al. |
| 7,120,021 B2 | 10/2006 | Hamman |
| 7,120,689 B2 | 10/2006 | Gonsalves et al. |
| 7,126,409 B2 | 10/2006 | Nielsen |
| 7,140,193 B2 | 11/2006 | Johnson et al. |
| 7,145,772 B2 | 12/2006 | Fink |
| 7,146,353 B2 | 12/2006 | Garg et al. |
| 7,148,796 B2 | 12/2006 | Joy et al. |
| 7,155,318 B2 | 12/2006 | Sharma et al. |
| 7,159,022 B2 | 1/2007 | Primm et al. |
| 7,165,412 B1 | 1/2007 | Bean, Jr. |
| 7,173,820 B2 | 2/2007 | Fink et al. |
| 7,184,269 B2 | 2/2007 | Campbell et al. |
| 7,187,549 B2 | 3/2007 | Teneketges et al. |
| 7,197,433 B2 | 3/2007 | Patel et al. |
| 7,206,824 B2 | 4/2007 | Somashekar et al. |
| 7,207,041 B2 | 4/2007 | Elson et al. |
| 7,228,707 B2 | 6/2007 | Lifson et al. |
| 7,236,363 B2 | 6/2007 | Belady |
| 7,239,043 B2 | 7/2007 | Taimela et al. |
| 7,251,547 B2 | 7/2007 | Bash et al. |
| 7,254,307 B2 | 8/2007 | Xin |
| 7,259,963 B2 | 8/2007 | Germagian et al. |
| 7,270,174 B2 | 9/2007 | Chu et al. |
| 7,272,005 B2 | 9/2007 | Campbell et al. |
| 7,274,112 B2 | 9/2007 | Hjort et al. |
| 7,274,566 B2 | 9/2007 | Campbell et al. |
| 7,278,273 B1 | 10/2007 | Whitted et al. |
| 7,284,379 B2 | 10/2007 | Pham et al. |
| 7,292,898 B2 | 11/2007 | Clark et al. |
| 7,293,666 B2 | 11/2007 | Mattlin et al. |
| 7,298,617 B2 | 11/2007 | Campbell et al. |
| 7,298,618 B2 | 11/2007 | Campbell et al. |
| 7,313,503 B2 | 12/2007 | Nakagawa et al. |
| 7,315,448 B1 | 1/2008 | Bash et al. |
| 7,319,594 B2 | 1/2008 | Nicolai et al. |
| 7,330,886 B2 | 2/2008 | Childers et al. |
| 7,334,630 B2 | 2/2008 | Goodson et al. |
| 7,365,973 B2 | 4/2008 | Rasmussen et al. |
| 7,366,632 B2 | 4/2008 | Hamann et al. |
| 7,378,165 B2 | 5/2008 | Brignone et al. |
| 7,392,309 B2 | 6/2008 | Childers et al. |
| 7,402,921 B2 | 7/2008 | Ingemi et al. |
| 7,403,391 B2 | 7/2008 | Germagian et al. |
| 7,406,839 B2 | 8/2008 | Bean et al. |
| 7,418,825 B1 | 9/2008 | Bean, Jr. |
| 7,421,575 B2 | 9/2008 | Ang et al. |
| 7,426,453 B2 | 9/2008 | Patel et al. |
| 7,462,453 B2 | 12/2008 | Yamada et al. |
| 7,472,043 B1 | 12/2008 | Low et al. |
| 7,500,911 B2 | 3/2009 | Johnson et al. |
| 7,529,838 B2 | 5/2009 | Primm et al. |
| 7,558,649 B1 | 7/2009 | Sharma et al. |
| 7,568,360 B1 | 8/2009 | Bash et al. |
| 7,596,476 B2 | 9/2009 | Rasmussen et al. |
| 7,606,760 B2 | 10/2009 | Hutchison et al. |
| 7,620,480 B2 | 11/2009 | Patel et al. |
| 7,657,347 B2 | 2/2010 | Campbell et al. |
| 7,676,280 B1 | 3/2010 | Bash et al. |
| 7,681,404 B2 | 3/2010 | Bean, Jr. |
| 7,698,389 B2 | 4/2010 | Sesek et al. |
| 7,705,489 B2 | 4/2010 | Nielsen et al. |
| 7,726,144 B2 | 6/2010 | Larson et al. |
| 7,752,858 B2 | 7/2010 | Johnson et al. |
| 7,775,055 B2 | 8/2010 | Bean et al. |
| 7,791,882 B2 | 9/2010 | Chu et al. |
| 7,799,474 B2 | 9/2010 | Lyon et al. |
| 7,832,925 B2 | 11/2010 | Archibald et al. |
| 7,844,440 B2 | 11/2010 | Nasle et al. |
| 7,862,410 B2 | 1/2011 | McMahan et al. |
| 7,878,888 B2 | 2/2011 | Rasmussen et al. |
| 7,881,910 B2 | 2/2011 | Rasmussen et al. |
| 7,885,795 B2 | 2/2011 | Rasmussen et al. |
| 7,908,126 B2 | 3/2011 | Bahel et al. |
| 7,925,389 B2 | 4/2011 | Bradicich et al. |
| 7,975,156 B2 | 7/2011 | Artman et al. |
| 7,979,250 B2 | 7/2011 | Archibald et al. |
| 7,991,592 B2 | 8/2011 | VanGilder et al. |
| 8,143,744 B2 | 3/2012 | Nielsen et al. |
| 8,155,922 B2 | 4/2012 | Loucks |
| 8,201,028 B2 | 6/2012 | Sawczak et al. |
| 8,209,056 B2 | 6/2012 | Rasmussen et al. |
| 8,219,362 B2 | 7/2012 | Shrivastava et al. |
| 8,228,046 B2 | 7/2012 | Ingemi et al. |
| 8,229,713 B2 | 7/2012 | Hamann et al. |
| 8,244,502 B2 | 8/2012 | Hamann et al. |
| 8,249,825 B2 | 8/2012 | VanGilder et al. |
| 8,315,841 B2 | 11/2012 | Rasmussen et al. |
| 8,322,155 B2 | 12/2012 | Tutunoglu et al. |
| 8,327,656 B2 | 12/2012 | Tutunoglu et al. |
| 8,355,890 B2 | 1/2013 | VanGilder et al. |
| 8,425,287 B2 | 4/2013 | Wexler |
| 8,473,265 B2 | 6/2013 | Hlasny et al. |
| 8,509,959 B2 | 8/2013 | Zhang et al. |
| 8,554,515 B2 | 10/2013 | VanGilder et al. |
| 8,639,482 B2 | 1/2014 | Rasmussen et al. |
| 8,725,307 B2 | 5/2014 | Healey et al. |
| 8,825,451 B2 | 9/2014 | VanGilder et al. |
| 8,965,748 B2 | 2/2015 | Iyengar et al. |
| 8,972,217 B2 | 3/2015 | VanGilder et al. |
| 2001/0005894 A1 | 6/2001 | Fukui |
| 2001/0009361 A1 | 7/2001 | Downs et al. |
| 2001/0012579 A1 | 8/2001 | Vackar |
| 2001/0029163 A1 | 10/2001 | Spinazzola et al. |
| 2001/0042616 A1 | 11/2001 | Baer |

(56) References Cited

U.S. PATENT DOCUMENTS

| | | |
|---|---|---|
| 2001/0047213 A1 | 11/2001 | Sepe |
| 2001/0047387 A1 | 11/2001 | Brockhurst |
| 2001/0047410 A1 | 11/2001 | Defosse |
| 2001/0052006 A1 | 12/2001 | Barker et al. |
| 2001/0055965 A1 | 12/2001 | Delp et al. |
| 2002/0003575 A1 | 1/2002 | Marchese |
| 2002/0004912 A1 | 1/2002 | Fung |
| 2002/0007643 A1 | 1/2002 | Spinazzola et al. |
| 2002/0023258 A1 | 2/2002 | Elwahab et al. |
| 2002/0041603 A1 | 4/2002 | Kato |
| 2002/0043969 A1 | 4/2002 | Duncan et al. |
| 2002/0055909 A1 | 5/2002 | Fung et al. |
| 2002/0059804 A1 | 5/2002 | Spinazzola et al. |
| 2002/0062454 A1 | 5/2002 | Fung |
| 2002/0071031 A1 | 6/2002 | Lord et al. |
| 2002/0072868 A1 | 6/2002 | Bartone et al. |
| 2002/0074096 A1 | 6/2002 | Wierer et al. |
| 2002/0083378 A1 | 6/2002 | Nickels |
| 2002/0095971 A1 | 7/2002 | Pawson |
| 2002/0101973 A1 | 8/2002 | Teixeira |
| 2002/0108386 A1 | 8/2002 | Spinazzola et al. |
| 2002/0112054 A1 | 8/2002 | Hatanaka |
| 2002/0119339 A1 | 8/2002 | Ragland et al. |
| 2002/0121555 A1 | 9/2002 | Cipolla et al. |
| 2002/0124081 A1 | 9/2002 | Primm et al. |
| 2002/0129355 A1 | 9/2002 | Velten et al. |
| 2002/0130648 A1 | 9/2002 | Raddi et al. |
| 2002/0134096 A1 | 9/2002 | Shim et al. |
| 2002/0134567 A1 | 9/2002 | Rasmussen et al. |
| 2002/0136042 A1 | 9/2002 | Layden et al. |
| 2002/0149911 A1 | 10/2002 | Bishop et al. |
| 2002/0152298 A1 | 10/2002 | Kikta et al. |
| 2002/0161885 A1 | 10/2002 | Childers et al. |
| 2002/0174223 A1 | 11/2002 | Childers et al. |
| 2002/0191425 A1 | 12/2002 | Geissler |
| 2002/0195997 A1 | 12/2002 | Peek et al. |
| 2003/0019221 A1 | 1/2003 | Rossi et al. |
| 2003/0033550 A1 | 2/2003 | Kuiawa et al. |
| 2003/0042004 A1 | 3/2003 | Novotny et al. |
| 2003/0048006 A1 | 3/2003 | Shelter et al. |
| 2003/0048647 A1 | 3/2003 | Sadler et al. |
| 2003/0052644 A1 | 3/2003 | Nelson et al. |
| 2003/0084357 A1 | 5/2003 | Bresniker et al. |
| 2003/0084358 A1 | 5/2003 | Bresniker et al. |
| 2003/0084359 A1 | 5/2003 | Bresniker et al. |
| 2003/0098789 A1 | 5/2003 | Murakami et al. |
| 2003/0115000 A1 | 6/2003 | Bodas |
| 2003/0115024 A1* | 6/2003 | Snevely ............... G06F 30/00 703/1 |
| 2003/0120780 A1 | 6/2003 | Zhu et al. |
| 2003/0121689 A1 | 7/2003 | Rasmussen et al. |
| 2003/0130912 A1* | 7/2003 | Davis, Jr. ............. G06F 16/21 705/28 |
| 2003/0147214 A1 | 8/2003 | Patel et al. |
| 2003/0147216 A1 | 8/2003 | Patel et al. |
| 2003/0149685 A1* | 8/2003 | Trossman ........... G06F 11/3055 |
| 2003/0154285 A1 | 8/2003 | Berglund et al. |
| 2003/0158718 A1 | 8/2003 | Nakagawa et al. |
| 2003/0184975 A1 | 10/2003 | Steinman et al. |
| 2003/0188208 A1 | 10/2003 | Fung |
| 2003/0190935 A1 | 10/2003 | Pinder |
| 2003/0193777 A1 | 10/2003 | Friedrich et al. |
| 2003/0196126 A1 | 10/2003 | Fung |
| 2003/0200130 A1 | 10/2003 | Kall et al. |
| 2003/0200295 A1 | 10/2003 | Roberts |
| 2003/0200473 A1 | 10/2003 | Fung |
| 2003/0204756 A1 | 10/2003 | Ransom et al. |
| 2003/0206021 A1 | 11/2003 | Laletin et al. |
| 2003/0214507 A1 | 11/2003 | Mawatari et al. |
| 2003/0220026 A1 | 11/2003 | Oki et al. |
| 2003/0232598 A1 | 12/2003 | Aljadeff et al. |
| 2003/0235035 A1 | 12/2003 | Wintersteen et al. |
| 2003/0236822 A1 | 12/2003 | Graupner et al. |
| 2004/0003266 A1 | 1/2004 | Moshir et al. |
| 2004/0010569 A1 | 1/2004 | Thomas et al. |
| 2004/0016243 A1 | 1/2004 | Song et al. |
| 2004/0020224 A1 | 2/2004 | Bash et al. |
| 2004/0031280 A1 | 2/2004 | Martin et al. |
| 2004/0031282 A1 | 2/2004 | Kopko |
| 2004/0057211 A1 | 3/2004 | Kondo et al. |
| 2004/0061030 A1 | 4/2004 | Goodwin et al. |
| 2004/0065097 A1 | 4/2004 | Bash et al. |
| 2004/0065100 A1 | 4/2004 | Jacobsen |
| 2004/0065104 A1 | 4/2004 | Bash et al. |
| 2004/0073597 A1 | 4/2004 | Caveney et al. |
| 2004/0075343 A1 | 4/2004 | Wareham et al. |
| 2004/0075984 A1 | 4/2004 | Bash et al. |
| 2004/0078708 A1 | 4/2004 | Li et al. |
| 2004/0083012 A1 | 4/2004 | Miller |
| 2004/0084967 A1 | 5/2004 | Nielsen |
| 2004/0089009 A1 | 5/2004 | Bash et al. |
| 2004/0089011 A1 | 5/2004 | Patel et al. |
| 2004/0098991 A1 | 5/2004 | Heyes |
| 2004/0099747 A1 | 5/2004 | Johnson et al. |
| 2004/0100770 A1 | 5/2004 | Chu et al. |
| 2004/0104706 A1 | 6/2004 | Ooi et al. |
| 2004/0120331 A1 | 6/2004 | Rhine et al. |
| 2004/0120855 A1 | 6/2004 | Reichel et al. |
| 2004/0155526 A1 | 8/2004 | Naden et al. |
| 2004/0160210 A1 | 8/2004 | Bohne et al. |
| 2004/0160720 A1 | 8/2004 | Yamanashi et al. |
| 2004/0160789 A1 | 8/2004 | Ying et al. |
| 2004/0160897 A1 | 8/2004 | Fowler et al. |
| 2004/0163001 A1 | 8/2004 | Bodas |
| 2004/0163102 A1 | 8/2004 | Fowler et al. |
| 2004/0184232 A1 | 9/2004 | Fink |
| 2004/0186905 A1 | 9/2004 | Young et al. |
| 2004/0189161 A1 | 9/2004 | Davis et al. |
| 2004/0190247 A1 | 9/2004 | Chu et al. |
| 2004/0196853 A1 | 10/2004 | Saito et al. |
| 2004/0223300 A1 | 11/2004 | Fink et al. |
| 2004/0227435 A1 | 11/2004 | Rasmussen |
| 2004/0230848 A1 | 11/2004 | Mayo et al. |
| 2004/0240514 A1 | 12/2004 | Bash et al. |
| 2004/0242197 A1 | 12/2004 | Fontaine |
| 2004/0262409 A1 | 12/2004 | Crippen et al. |
| 2005/0001589 A1 | 1/2005 | Edington et al. |
| 2005/0016189 A1 | 1/2005 | Wacker |
| 2005/0023363 A1 | 2/2005 | Sharma et al. |
| 2005/0036248 A1 | 2/2005 | Klikic et al. |
| 2005/0044882 A1 | 3/2005 | Hong et al. |
| 2005/0048896 A1 | 3/2005 | Shaben |
| 2005/0055590 A1 | 3/2005 | Farkas et al. |
| 2005/0061013 A1 | 3/2005 | Bond |
| 2005/0063542 A1 | 3/2005 | Ryu |
| 2005/0071699 A1 | 3/2005 | Hammond et al. |
| 2005/0108582 A1 | 5/2005 | Fung |
| 2005/0111669 A1 | 5/2005 | Park et al. |
| 2005/0114507 A1 | 5/2005 | Tarui et al. |
| 2005/0132729 A1 | 6/2005 | Manole |
| 2005/0159098 A1 | 7/2005 | Johnson et al. |
| 2005/0162019 A1 | 7/2005 | Masciarelli et al. |
| 2005/0162129 A1 | 7/2005 | Mutabdzija et al. |
| 2005/0162836 A1 | 7/2005 | Briggs et al. |
| 2005/0164563 A1 | 7/2005 | Schuttler et al. |
| 2005/0168073 A1 | 8/2005 | Hjort |
| 2005/0170770 A1 | 8/2005 | Johnson et al. |
| 2005/0177755 A1 | 8/2005 | Fung |
| 2005/0182523 A1 | 8/2005 | Nair |
| 2005/0185654 A1 | 8/2005 | Zadikian et al. |
| 2005/0198247 A1 | 9/2005 | Perry et al. |
| 2005/0198981 A1 | 9/2005 | Arno |
| 2005/0201127 A1 | 9/2005 | Tracy et al. |
| 2005/0205241 A1 | 9/2005 | Goodson et al. |
| 2005/0207909 A1 | 9/2005 | Bean et al. |
| 2005/0210905 A1 | 9/2005 | Burns et al. |
| 2005/0213306 A1 | 9/2005 | Vos et al. |
| 2005/0225936 A1 | 10/2005 | Day |
| 2005/0228618 A1 | 10/2005 | Patel et al. |
| 2005/0235671 A1 | 10/2005 | Belady et al. |
| 2005/0237715 A1 | 10/2005 | Staben et al. |
| 2005/0237716 A1 | 10/2005 | Chu et al. |
| 2005/0246431 A1 | 11/2005 | Spitaels |
| 2005/0247829 A1 | 11/2005 | Low et al. |

(56) References Cited

U.S. PATENT DOCUMENTS

| | | |
|---|---|---|
| 2005/0248922 A1 | 11/2005 | Chu et al. |
| 2005/0251802 A1 | 11/2005 | Bozek et al. |
| 2005/0267639 A1 | 12/2005 | Sharma et al. |
| 2005/0275976 A1 | 12/2005 | Taimela et al. |
| 2005/0278075 A1 | 12/2005 | Rasmussen et al. |
| 2005/0284169 A1 | 12/2005 | Tamura et al. |
| 2006/0002086 A1 | 1/2006 | Teneketges et al. |
| 2006/0015712 A1 | 1/2006 | Ang et al. |
| 2006/0025010 A1 | 2/2006 | Spitaels et al. |
| 2006/0042289 A1 | 3/2006 | Campbell et al. |
| 2006/0043792 A1 | 3/2006 | Hjort et al. |
| 2006/0043793 A1 | 3/2006 | Hjort et al. |
| 2006/0043797 A1 | 3/2006 | Hjort et al. |
| 2006/0044846 A1 | 3/2006 | Hjort et al. |
| 2006/0072262 A1 | 4/2006 | Paik et al. |
| 2006/0080001 A1 | 4/2006 | Bash et al. |
| 2006/0081545 A1 | 4/2006 | Rassmussen et al. |
| 2006/0082263 A1 | 4/2006 | Rimier et al. |
| 2006/0096306 A1 | 5/2006 | Okaza et al. |
| 2006/0102575 A1 | 5/2006 | Mattlin et al. |
| 2006/0108481 A1 | 5/2006 | Riedy et al. |
| 2006/0112286 A1 | 5/2006 | Whalley et al. |
| 2006/0115586 A1 | 6/2006 | Xing et al. |
| 2006/0121421 A1 | 6/2006 | Spitaels et al. |
| 2006/0126296 A1 | 6/2006 | Campbell et al. |
| 2006/0139877 A1 | 6/2006 | Germagian et al. |
| 2006/0144073 A1 | 7/2006 | Lee et al. |
| 2006/0162357 A1 | 7/2006 | Fink et al. |
| 2006/0168975 A1 | 8/2006 | Malone et al. |
| 2006/0170967 A1 | 8/2006 | Maki et al. |
| 2006/0203834 A1 | 9/2006 | Augustinus |
| 2006/0214014 A1 | 9/2006 | Bash et al. |
| 2006/0232945 A1 | 10/2006 | Chu et al. |
| 2006/0238941 A1 | 10/2006 | Ingemi et al. |
| 2006/0242288 A1 | 10/2006 | Masurkar |
| 2006/0250770 A1 | 11/2006 | Campbell et al. |
| 2006/0260338 A1 | 11/2006 | VanGilder et al. |
| 2006/0267974 A1 | 11/2006 | Kato et al. |
| 2006/0271700 A1* | 11/2006 | Kawai ............... H04L 67/1002 709/233 |
| 2006/0276121 A1 | 12/2006 | Rasmussen |
| 2006/0279970 A1 | 12/2006 | Kernahan |
| 2007/0019569 A1 | 1/2007 | Park et al. |
| 2007/0025271 A1 | 2/2007 | Niedrich et al. |
| 2007/0038414 A1* | 2/2007 | Rasmussen ............ G06F 30/13 703/1 |
| 2007/0055409 A1 | 3/2007 | Rasmussen et al. |
| 2007/0064363 A1 | 3/2007 | Nielsen et al. |
| 2007/0072536 A1 | 3/2007 | Johnson et al. |
| 2007/0074537 A1 | 4/2007 | Bean et al. |
| 2007/0076373 A1 | 4/2007 | Fink |
| 2007/0078635 A1 | 4/2007 | Rasmussen et al. |
| 2007/0081302 A1 | 4/2007 | Nicolai et al. |
| 2007/0085678 A1 | 4/2007 | Joy et al. |
| 2007/0088822 A1 | 4/2007 | Coile et al. |
| 2007/0088823 A1 | 4/2007 | Fowler et al. |
| 2007/0091569 A1 | 4/2007 | Campbell et al. |
| 2007/0091570 A1 | 4/2007 | Campbell et al. |
| 2007/0121295 A1 | 5/2007 | Campbell et al. |
| 2007/0129000 A1 | 6/2007 | Rasmussen et al. |
| 2007/0146994 A1 | 6/2007 | Germagian et al. |
| 2007/0150215 A1 | 6/2007 | Spitaels et al. |
| 2007/0150584 A1 | 6/2007 | Srinivasan |
| 2007/0163748 A1 | 7/2007 | Rasmussen et al. |
| 2007/0165377 A1 | 7/2007 | Rasmussen et al. |
| 2007/0167125 A1 | 7/2007 | Rasmussen et al. |
| 2007/0171613 A1 | 7/2007 | McMahan et al. |
| 2007/0174024 A1 | 7/2007 | Rasmussen et al. |
| 2007/0187343 A1 | 8/2007 | Colucci et al. |
| 2007/0190919 A1 | 8/2007 | Donovan et al. |
| 2007/0213000 A1 | 9/2007 | Day |
| 2007/0228837 A1 | 10/2007 | Nielsen et al. |
| 2007/0271475 A1 | 11/2007 | Hatasaki et al. |
| 2007/0274035 A1 | 11/2007 | Fink et al. |
| 2007/0291817 A1 | 12/2007 | Bradicich et al. |
| 2008/0002364 A1 | 1/2008 | Campbell et al. |
| 2008/0004837 A1 | 1/2008 | Zwinger et al. |
| 2008/0037217 A1 | 2/2008 | Murakami et al. |
| 2008/0041076 A1 | 2/2008 | Tutunoglu et al. |
| 2008/0041077 A1 | 2/2008 | Tutunoglu |
| 2008/0042491 A1 | 2/2008 | Klikic et al. |
| 2008/0055850 A1 | 3/2008 | Carlson et al. |
| 2008/0055852 A1 | 3/2008 | Uluc et al. |
| 2008/0061628 A1 | 3/2008 | Nielsen et al. |
| 2008/0067872 A1 | 3/2008 | Moth |
| 2008/0104985 A1 | 5/2008 | Carlsen |
| 2008/0105412 A1 | 5/2008 | Carlsen et al. |
| 2008/0105753 A1 | 5/2008 | Carlsen et al. |
| 2008/0141703 A1 | 6/2008 | Bean, Jr. |
| 2008/0142068 A1 | 6/2008 | Bean et al. |
| 2008/0144375 A1 | 6/2008 | Cheng |
| 2008/0157601 A1 | 7/2008 | Masciarelli et al. |
| 2008/0174954 A1 | 7/2008 | VanGilder et al. |
| 2008/0177424 A1 | 7/2008 | Wheeler |
| 2008/0180908 A1 | 7/2008 | Wexler |
| 2008/0197706 A1 | 8/2008 | Nielsen |
| 2008/0198549 A1 | 8/2008 | Rasmussen et al. |
| 2008/0229318 A1 | 9/2008 | Franke |
| 2008/0245083 A1 | 10/2008 | Tutunoglu et al. |
| 2008/0263150 A1 | 10/2008 | Childers et al. |
| 2008/0272744 A1 | 11/2008 | Melanson |
| 2009/0007591 A1 | 1/2009 | Bean et al. |
| 2009/0019875 A1 | 1/2009 | Fink et al. |
| 2009/0030554 A1 | 1/2009 | Bean, Jr. et al. |
| 2009/0039706 A1 | 2/2009 | Kotlyar et al. |
| 2009/0046415 A1 | 2/2009 | Rasmussen et al. |
| 2009/0064046 A1 | 3/2009 | Childers et al. |
| 2009/0121547 A1 | 5/2009 | Paik et al. |
| 2009/0121860 A1 | 5/2009 | Kimmel et al. |
| 2009/0138313 A1 | 5/2009 | Morgan et al. |
| 2009/0138888 A1 | 5/2009 | Shah et al. |
| 2009/0150123 A1 | 6/2009 | Archibald et al. |
| 2009/0164031 A1 | 6/2009 | Johnson et al. |
| 2009/0168345 A1 | 7/2009 | Martini |
| 2009/0205416 A1 | 8/2009 | Campbell et al. |
| 2009/0210097 A1 | 8/2009 | Sawczak et al. |
| 2009/0223234 A1 | 9/2009 | Campbell et al. |
| 2009/0259343 A1 | 10/2009 | Rasmussen et al. |
| 2009/0268404 A1 | 10/2009 | Chu et al. |
| 2009/0276771 A1 | 11/2009 | Nickolov et al. |
| 2009/0308579 A1 | 12/2009 | Johnson et al. |
| 2009/0309570 A1 | 12/2009 | Lehmann et al. |
| 2009/0326879 A1 | 12/2009 | Hamann et al. |
| 2009/0326884 A1 | 12/2009 | Amemiya et al. |
| 2010/0057263 A1 | 3/2010 | Tutunoglu |
| 2010/0106464 A1 | 4/2010 | Hlasny et al. |
| 2010/0131109 A1 | 5/2010 | Rasmussen et al. |
| 2010/0170663 A1 | 7/2010 | Bean, Jr. |
| 2010/0211669 A1 | 8/2010 | Dalgas et al. |
| 2010/0211810 A1 | 8/2010 | Zacho |
| 2010/0256959 A1 | 10/2010 | VanGilder et al. |
| 2010/0286955 A1 | 11/2010 | VanGilder et al. |
| 2010/0286956 A1 | 11/2010 | VanGilder et al. |
| 2010/0287018 A1 | 11/2010 | Shrivastava et al. |
| 2010/0305718 A1 | 12/2010 | Clark et al. |
| 2011/0040529 A1 | 2/2011 | Hamann et al. |
| 2011/0101116 A1 | 5/2011 | Bash et al. |
| 2011/0213508 A1 | 9/2011 | Mandagere et al. |
| 2011/0215645 A1 | 9/2011 | Schomburg et al. |
| 2011/0246147 A1 | 10/2011 | Rasmussen et al. |
| 2011/0301911 A1 | 12/2011 | VanGilder et al. |
| 2011/0307820 A1 | 12/2011 | Rasmussen et al. |
| 2011/0316706 A1 | 12/2011 | Cash et al. |
| 2012/0015598 A1 | 1/2012 | Bagwell et al. |
| 2012/0041569 A1 | 2/2012 | Zhang et al. |
| 2012/0071992 A1 | 3/2012 | VanGilder et al. |
| 2012/0158387 A1 | 6/2012 | VanGilder et al. |
| 2012/0170205 A1 | 7/2012 | Healey et al. |
| 2012/0221872 A1 | 8/2012 | Artman et al. |
| 2012/0232877 A1 | 9/2012 | Bhagwat et al. |
| 2012/0245905 A1 | 9/2012 | Dalgas et al. |
| 2012/0253769 A1 | 10/2012 | Poondru et al. |
| 2012/0303166 A1 | 11/2012 | Chang |
| 2013/0006426 A1 | 1/2013 | Healey et al. |

(56) References Cited

U.S. PATENT DOCUMENTS

| | | |
|---|---|---|
| 2013/0030585 A1 | 1/2013 | Rasmussen et al. |
| 2013/0095494 A1 | 4/2013 | Neely |
| 2013/0139530 A1 | 6/2013 | Tutunoglu et al. |
| 2013/0297267 A1 | 11/2013 | Liang et al. |
| 2014/0039691 A1 | 2/2014 | Gupta et al. |
| 2014/0098494 A1 | 4/2014 | Downing |
| 2014/0122033 A1 | 5/2014 | VanGilder et al. |
| 2014/0330447 A1 | 11/2014 | VanGilder et al. |
| 2014/0358471 A1 | 12/2014 | VanGilder et al. |

FOREIGN PATENT DOCUMENTS

| | | |
|---|---|---|
| AU | 177375 B2 | 10/2004 |
| AU | 2012201080 A1 * | 3/2012 |
| AU | 2012201080 A1 | 3/2012 |
| CA | 2300053 A1 | 2/1999 |
| CA | 2310275 A1 | 6/1999 |
| CA | 2328939 A1 | 9/1999 |
| CA | 2395450 A1 | 5/2001 |
| CN | 87100353 A | 9/1988 |
| CN | 1294350 A | 5/2001 |
| CN | 1485906 A | 3/2004 |
| CN | 2612211 Y | 4/2004 |
| CN | 101089779 A | 12/2007 |
| CN | 101132688 A | 2/2008 |
| CN | 101589656 A | 11/2009 |
| CN | 201514313 U | 6/2010 |
| CN | 102096460 A | 6/2011 |
| CN | 102224474 A | 10/2011 |
| CN | 102265278 A | 11/2011 |
| CN | 102414685 A | 4/2012 |
| CN | 102414686 A | 4/2012 |
| CN | 102436296 A | 5/2012 |
| CN | 102449606 A | 5/2012 |
| DE | 10128367 A1 | 1/2003 |
| DE | 102006041788 A1 | 3/2008 |
| EP | 0574628 A1 | 12/1993 |
| EP | 0 591 585 B1 | 4/1994 |
| EP | 0602911 A1 | 6/1994 |
| EP | 0444997 B1 | 2/1995 |
| EP | 0575060 B1 | 9/1996 |
| EP | 0738065 A1 | 10/1996 |
| EP | 0741269 A2 | 11/1996 |
| EP | 0744112 A1 | 11/1996 |
| EP | 0859489 A2 | 8/1998 |
| EP | 0917034 A1 | 5/1999 |
| EP | 0926793 A1 | 6/1999 |
| EP | 0 927 933 A2 | 7/1999 |
| EP | 0956680 A1 | 11/1999 |
| EP | 0964551 A1 | 12/1999 |
| EP | 0977112 A2 | 2/2000 |
| EP | 0978780 A1 | 2/2000 |
| EP | 0990986 A2 | 4/2000 |
| EP | 0992100 A2 | 4/2000 |
| EP | 1002268 A1 | 5/2000 |
| EP | 1 009 130 A1 | 6/2000 |
| EP | 1014622 A2 | 6/2000 |
| EP | 1032884 A1 | 9/2000 |
| EP | 1 049 291 A2 | 11/2000 |
| EP | 1 096 724 A1 | 5/2001 |
| EP | 1107519 A2 | 6/2001 |
| EP | 1115264 A2 | 7/2001 |
| EP | 1124301 A2 | 8/2001 |
| EP | 1 150 188 A2 | 10/2001 |
| EP | 1142289 A1 | 10/2001 |
| EP | 0963076 A3 | 11/2001 |
| EP | 1 178 628 A2 | 2/2002 |
| EP | 1291999 A1 | 3/2003 |
| EP | 1610077 A2 | 12/2005 |
| EP | 1672300 A1 | 6/2006 |
| EP | 1705977 A1 | 9/2006 |
| EP | 2147585 A2 | 1/2010 |
| EP | 2482213 A1 | 8/2012 |
| FR | 2193303 A1 | 2/1974 |
| FR | 2624684 A1 | 6/1989 |
| FR | 2831019 A1 | 4/2003 |
| FR | 2864854 A1 | 7/2005 |
| GB | 2335124 A | 9/1999 |
| GB | 2343036 A | 4/2000 |
| GB | 2344718 A | 6/2000 |
| GB | 2351205 A | 12/2000 |
| GB | 2354066 A | 3/2001 |
| GB | 2355163 A | 4/2001 |
| GB | 2359369 A | 8/2001 |
| GB | 2361156 A | 10/2001 |
| JP | 9-64555 A | 3/1974 |
| JP | 54-56503 | 4/1979 |
| JP | 59-151478 A | 8/1984 |
| JP | 62-174397 A | 7/1987 |
| JP | 63-127042 A | 5/1988 |
| JP | 1-163541 A | 6/1989 |
| JP | 3-85797 | 4/1991 |
| JP | 3099398 A | 4/1991 |
| JP | 4-85785 | 7/1992 |
| JP | 5-15423 | 1/1993 |
| JP | 5040889 A | 2/1993 |
| JP | 5-160592 A | 6/1993 |
| JP | 51-55922 A | 6/1993 |
| JP | 6105376 A | 4/1994 |
| JP | 6119581 A | 4/1994 |
| JP | 6-272694 A | 9/1994 |
| JP | 07-044275 A | 2/1995 |
| JP | 7-98781 | 4/1995 |
| JP | 07269926 A | 10/1995 |
| JP | 07270459 A | 10/1995 |
| JP | 8-285421 A | 11/1996 |
| JP | 8307541 A | 11/1996 |
| JP | 09-298377 A | 11/1997 |
| JP | 10-339500 A | 12/1998 |
| JP | 11164035 A | 6/1999 |
| JP | 11-184570 A | 7/1999 |
| JP | 11-187061 A | 7/1999 |
| JP | 11219388 A | 8/1999 |
| JP | 11338666 A | 12/1999 |
| JP | 2000092092 A | 3/2000 |
| JP | 2000-112574 A | 4/2000 |
| JP | 2000134606 A | 5/2000 |
| JP | 2000151606 A | 5/2000 |
| JP | 2000209204 A | 7/2000 |
| JP | 2000278773 A | 10/2000 |
| JP | 2000-315883 | 11/2000 |
| JP | 2000-339260 A | 12/2000 |
| JP | 2001024638 A | 1/2001 |
| JP | 200047757 A | 8/2001 |
| JP | 2001-260640 A | 9/2001 |
| JP | 2001257496 A | 9/2001 |
| JP | 2002-101973 A | 4/2002 |
| JP | 2002-119339 A | 4/2002 |
| JP | 2004-500744 T | 1/2004 |
| JP | 2010233784 A | 10/2010 |
| TW | 0443058 B | 6/2001 |
| TW | 0448349 B | 8/2001 |
| WO | 95/21506 A2 | 8/1995 |
| WO | 96/15615 A1 | 5/1996 |
| WO | 97/30879 A1 | 8/1997 |
| WO | 98/01838 A1 | 1/1998 |
| WO | 9804067 A1 | 1/1998 |
| WO | 98/26541 A1 | 6/1998 |
| WO | 99/01919 A2 | 1/1999 |
| WO | 99/08183 A1 | 2/1999 |
| WO | 9915950 A1 | 4/1999 |
| WO | 99/27456 A1 | 6/1999 |
| WO | 99/45445 A1 | 9/1999 |
| WO | 00/35177 A1 | 6/2000 |
| WO | 00/39724 A2 | 7/2000 |
| WO | 00/54557 A1 | 9/2000 |
| WO | 00/58673 A1 | 10/2000 |
| WO | 00/73866 A1 | 12/2000 |
| WO | 00/79500 A1 | 12/2000 |
| WO | 2000/076158 A1 | 12/2000 |
| WO | 01/01366 A2 | 1/2001 |
| WO | 01/08396 A1 | 2/2001 |
| WO | 01/27763 A1 | 4/2001 |
| WO | 0131849 A1 | 5/2001 |

(56) References Cited

FOREIGN PATENT DOCUMENTS

| | | |
|---|---|---|
| WO | 01/57477 A1 | 8/2001 |
| WO | 01/57631 A1 | 8/2001 |
| WO | 01/61665 A2 | 8/2001 |
| WO | 0162060 A1 | 8/2001 |
| WO | 0169504 A2 | 9/2001 |
| WO | 01/79935 A1 | 10/2001 |
| WO | 01/82028 A2 | 11/2001 |
| WO | 0186217 A1 | 11/2001 |
| WO | 01/93042 A2 | 12/2001 |
| WO | 01/93508 A1 | 12/2001 |
| WO | 01/97907 A2 | 12/2001 |
| WO | 01/99402 A2 | 12/2001 |
| WO | 02/01877 A1 | 1/2002 |
| WO | 02/11391 A2 | 2/2002 |
| WO | 0216854 A1 | 2/2002 |
| WO | 0233980 A2 | 4/2002 |
| WO | 02/37280 A2 | 5/2002 |
| WO | 02/47044 A1 | 6/2002 |
| WO | 02/47369 A1 | 6/2002 |
| WO | 02/48830 A2 | 6/2002 |
| WO | 02/49285 A1 | 6/2002 |
| WO | 02/057925 A2 | 7/2002 |
| WO | 02/065030 A1 | 8/2002 |
| WO | 02060124 A2 | 8/2002 |
| WO | 02093093 A1 | 11/2002 |
| WO | 02093403 A1 | 11/2002 |
| WO | 02099683 A1 | 12/2002 |
| WO | 2003005200 A1 | 1/2003 |
| WO | 03/083631 A1 | 10/2003 |
| WO | 2003081406 A1 | 10/2003 |
| WO | 2004049773 A2 | 6/2004 |
| WO | 2005081091 A2 | 9/2005 |
| WO | 20050122664 A1 | 12/2005 |
| WO | 2006/034718 A1 | 4/2006 |
| WO | 2006119248 A2 | 11/2006 |
| WO | 20060124240 A2 | 11/2006 |
| WO | 2007095144 A2 | 8/2007 |
| WO | 2008144375 A2 | 11/2008 |
| WO | 2009/014893 A1 | 1/2009 |
| WO | 2010023619 A1 | 3/2010 |
| WO | 2010068434 A1 | 6/2010 |
| WO | 2011/019615 A1 | 2/2011 |
| WO | 2012037427 A1 | 3/2012 |
| WO | 2012082985 A2 | 6/2012 |
| WO | 2012135038 A1 | 10/2012 |
| WO | 2013/095494 A1 | 6/2013 |

OTHER PUBLICATIONS

Marwah, M.; Sharma, R.; Shih, R.; Patel, C.; Bhatia, V.; Mekanapurath, M.; Velumani, R.; Velayudhan, S., 2009, Data analysis, visualization and knowledge discovery in sustainable data centers, in Proceedings of the 2nd Bangalore Annual Compute Conference (COMPUTE '09).
Modern Refrigeration and Air Conditioning (18th Edition) Althouse et al. Published by The Goodheart-Willcox Company, Inc. (c)2000.
N. Rasmussen, "Calculating Total Cooling Requirements for Data Centers", White Paper #25, pp. 1-8, American Power Conversion, May 20, 2004, published on World Wide Web.
N. Rasmussen, "Cooling Strategies for Ultra-High Density Racks and Blade Servers", White Paper #46, pp. 1-22, American Power Conversion, Mar. 29, 2005, published on World Wide Web.
N. Rasmussen, "Strategies for Deploying Blade Servers in Existing Data Centers", White Paper #125, pp. 1-14, American Power Conversion, Mar. 29, 2005, published on World Wide Web.
Neil Rasmussen, "Air Distribution Architecture Options for Mission Critical Facilities," White Paper #55, Revision 1, 2003 American Power Conversion, Rev 2003-0, pp. 1-13.
Neil Rasmussen, "Avoidable Mistakes that Compromise Cooling Performance in Data Centers and Network Rooms," White Paper #49, 2003 American Power Conversion, Rev 2003-0, pp. 1-15.
Neil Rasmussen, "Cooling Options for Rack Equipment with Side-to-Side Airflow," White Paper #50, 2004 American Power Conversion, Rev 2004-0, pp. 1-14.
Neil Rasmussen, "Guidelines for Specification of Data Center Power Density," White Paper #120, 2005 American Power Conversion, Rev 2005-0, pp. 1-21.
Norrefeldt, Victor, Gunnar Grun, and Klaus Sedlbauer. "VEPZO-Velocity propagating zonal model for the estimation of the airflow pattern and temperature distribution in a confined space." Building and Environment 48 (Feb. 2012): 183-194.
Pakbaznia, E.; Ghasemazar, M.; Pedram, M.:, "Temperature-aware dynamic resource provisioning in a power-optimized datacenter," Design, Automation & Test in Europe Conference & Exhibition (DATE), 2010, vol., No., pp. 124-129, Mar. 8-12, 2010.
Pinheiro, Eduardo, "Load Balancing and Unbalancing for Power and Performance in Cluster-Based Systems," Internet Citation, May 1, 2001 URL:http://research.ac.upc.es/pact01/colp/paper04.pdf, retrieved on Nov. 17, 2003.
Rambo et al. "Modeling of data center airflow and heat transfer: State of the art and future trends", Distrib Parallel Databases (2007) 21:193-225.
Refai-Ahmed G. et al., "Analysis of flow distribution in power supply using flow network modeling (FNM)", Thermal and Thermomechanical Phenomena in Electronic Systems, 2000, IT HERM 2000, The Seventh Intersociety Conference on May 23-26, 2000, Piscataway, NJ, USA, IEEE, Piscataway, NJ, USA, vol. 1, May 23, 2000 (May 23, 2000), pp. 90-98, ISBN: 978-0-7803-5912-3.
Rittal Catalogue, Aug. 2005, p. 115 and p. 140.
Rittal, <http://www.rittal.com/services_support/downloads/brochures.asp>, download page for catalogue 31.
Rittal, Catalogue 31, front page p. 672 and back page, Apr. 2005.
Schmidt et al., "Best practices for data center thermal and energy management-review of literature," ASHRAE Transactions, vol. 112, pp. 206-218 [2007].
Search Report from corresponding Chinese Application No. 200800234492 dated Feb. 20, 2013.
Sharma, R.K, Bash, C.E., and Patel, C.D, "Dimensionless Parameters for Evaluation of Thermal Design and Performance of Large-Scale Data Centers." 8th ASME/AIAA Joint Thermophysics and Heat Transfer Conference, Jun. 24-26, 2002. St. Louis, Missouri.
Shrivastava S K et al., Optimization of Cluster Cooling Performance for Data Centers, Thermal and Thermomechanical Phenomena in Electronic Systems, May 28, 2008, pp. 1161-1166, 11th Intersociety Conference on, IEEE, Piscataway, NJ.
Shrivastava S.K. et al., "A flow-network model for predicting rack cooling in containment systems", Proceedings of the ASME Interpack Conference—2009: Presented at 2009 ASME Interpack Conference, Jul. 19-23, 2009, San Francisco, California, USA, vol. 2, Jul. 19, 2009 (Jul. 19, 2009), pp. 785-791.
Sinetica Corp: "Netcom TH. Advanced SNMP Agent with Web Broser Support", Sinetica, UK, www.sinetica.co.uk, Apr. 2000, XP002160505, 2 pp.
Sinetica Corp: "Newsletter, Issue One 99", Sinetica, UK, www.sinetica.co.uk, Feb. 1999, XP002160504, 4 pp.
Sinha et al., "Numerical simulation of two-dimensional room air flow with and without buoyancy", Energy and Buildings, vol. 32, Issue 1, Jun. 2000, pp. 121-129.
Symmetra Brochure, "Server, Network and Telecom Power Soultions," pp. 1-20. = 2001 No Month Available.
Texas Instruments Incorporated, "A True System-on-Chip Solution for 2.4 GHz IEEE 802.15A and ZigBee Applications," CC2530F32, CC2530F64, CC2530F128, CC2530F256, Apr. 2009—Revised Feb. 2011, www.ti.com, pp. 36.
Thermodynamics: An Engineering Approach (Fourth Edition) Cengel et al. Published by McGraw Hill (c)2004.
Tony Evans, "Fundamental Principles of Air Conditioners for Information Technology," White Paper #57, Revision 1, 2004 American Power Conversion, Rev 2004-1, pp. 1-9.
Tony Evans, "Humidification Strategies for Data Centers and Network Rooms," WHite Paper 58, 2004 American Power Conversion, Rev 2004-0, pp. 1-13.

(56) References Cited

OTHER PUBLICATIONS

Tony Evans, "The Different Types of Air Conditioning Equipment for IT Environments," White Paper #59, 2004 American Power Conversion, Rev 2004-0, pp. 1-21.

Toulouse M.M. et al., "Exploration of a potential-flow-based compact model of air-flow transport in data centers", Proceedings of the ASME International Mechanical Engineering Congress and Exposition—2009: Presented at 2009 ASME International Mechanical Engineering Congress and Exposition, Nov. 13-19, 2009, Lake Buena Vista, Florida, USA, vol. 13: New Del, vol. 13, Jan. 1, 2009 (Jan. 1, 2009), pp. 41-50, DOI: 10.1115/IMECE2009-10806, ISBN: 978-0-7918-4386-4.

Vanessa Lopez et al., "Measurement-based modeling for data centers", Thermal and Thermomechanical Phenomena in Electronic Systems (ITHERM), 2010 12th IEEE Intersociety Conference on, IEEE, Piscataway, NJ, USA, Jun. 2, 2010 (Jun. 2, 2010), pp. 1-8, XP031702357.

Vanessa Lopez et al: "Heat transfer modeling in data centers", International Journal of Heat and Mass Transfer, vo 1 . 54, No. 25, Sep. 15, 2011 (Sep. 15, 2011), pp. 5306-5318, XP028298268, ISSN: 0017-9310, DOI: 10.1016/J.IJHEATMASSTRANSFER.2011.08.012 [retrieved on Aug. 10, 2011].

Vangilder et al., "Airflow Uniformity through Perforated Tiles in a Raised-Floor Data Center", White Paper 121, Jul. 17-22, 2005, 10 pages.

Vangilder et al., "Partially decoupled aisle method for estimating rack-cooling performance in near-real time," 2007, Proceedings of the IPACK2007 ASME InterPACK07, pp. 781-789.

Vangilder, Real-Time Data Center Cooling Analysis, APC by Schneider Electric, Billerica, MA USA, Electronics Cooling, Sep. 2011, pp. 14-16.

Vangilder, James W. et al., "Caputure index: an airflow-based rack cooling performance metric," 2007, ASHRAE Transactions, vol. 113, pp. 126-136.

Vangilder, James W. et al., "Real-Time prediction of rack-cooling performance," 2006, ASHRAE Transactions, vol. 112, pp. 151-162.

Verhoff, A., The Two-Dimensional, Turbulent Wall Jet with and without an External Free Stream, Office of Naval Research Department of the Navy Contact Nonr 1858(14) in Co-Operation with Bureau of Naval Weapons, Report No. 626, May 1963.

Website: http://www.edpeurope.com/sharkrack.html.

Website: http://www.sharkrack.com/cart/display/php?category id=16 &product is=25.

"Case Study, Application of TileFlow to Improve Cooling in a Data Center," Innovative Research, Inc., 2004.

"Enthalpy" Published by the National Aeronautics and Space Administration and edited by Tom Benson. Retrieved on Jul. 13, 2009 from http://www.grc.nasa.gov/WWW/K-12/airplane/enthalpy. html, pp. 3.

"Essential Cooling System Requirements for Next Generation Data Centers," White Paper #5, Revision 3, 2003 American Power Conversion, Rev 2002-3, pp. 1-10.

"How and Why Mission-Critical Cooling Systems Differ From Common Air Conditions," White Paper #56, Revision 2, 2003 American Power Conversion, Rev 2003-2, pp. 1-13.

"Management Strategy for Network Critical Physical Infrastructure", White Paper #100, pp. 110, American Power Conversion, Dec. 15, 2003, published on World Wide Web.

"Optimizing facility operation in high density data center environments," 2007, Hewlett-Packard Development Company, pp. 1-25.

A. Hinchcliffe: "AutocadCentral.com Free Tutorials—Layers", Jan. 4, 2005, pp. 1-3, XP055187044, Retrieved from the Internet: URL:http://web.archive.org/web/20050104015104/http://www.autocadcentral.com/Tutorials/Lesson%207/lesson7.htm.

Abi-Zadeh, Davar et al., "A Transient Analysis of Environmental Conditions for a Mission Critical Facility after a Failure of Power", Arup Mission Criticial Facilities, Feb. 2001, pp. 1-12.

Ahmad, Jasim U. et al, "Navier-Stokes simulation of air-conditioning facility of a large modern computer room," Jun. 2005, Proceedings of the 2005 ASME Fluids Engineering Division Summer Meeting and Exhibition, pp. 1-6.

Althouse, Turnquist, Bracciano: "Modern Refrigeration and Air Conditioning," 2000, The Goodheart-Willcox Company, Inc., XP002479591, pp. 715-716.

Anderson, Donald, "Iterative Procedures for Nonlinear Integral Equations," Journal of the Association for Computing Machinery, vol. 12, No. 4, Oct. 1965, pp. 547-560.

APC User's Guide Brochure, "InfraStruXure Manager," Mar. 2004, 181 pgs.

Ashrae, "Thermal Guidelines for Data Processing Environments" 2004, Atlanta: American Society of Heating, Refrigerating, and Air-Conditioning Engineers, Inc., 2004, Atlanta.

AU Patent Examination Report No. 2, AU2008255030, dated Nov. 15, 2013.

Axis Communications, "Axis 200+ and 240 Camera Server: User's Guide", www.axis.com/techsup/cam_servers/cam_240/index.htm, pp. 1-38, Jan. 1999.

Axis communications, "Axis 2400/2401 Administration Manual Version 1.1", www.axis.com/techsup/cam_servers/cam_2400/index.htm, version 1.1.xx, part No. 16741, pp. 1-78, Jul. 1999.

Axis Communications, "Network Camera Developments Enable Live Web Imaging", Axis 2100 white paper, www.axis.com/products/videos/camera/documentation.htm, pp. 1-12, Nov. 1999.

Baronti et al. "Wireless Sensor Networks: A Survey on the State of the Art and the 802.15.4 and ZigBee Standards". Computer Communications, Elsevier Science Publishers B.V. Amsterdam, NL. vol. 30, No. 7. Apr. 8, 2007. pp. 1655-1695.

Bash, C. E. et al.: "Balance of Power: Dynamic Thermal Management for Internet Data Centers", IEEE Internet Computing , Jan. 1, 2005, pp. 42-49, vol. 9, No. 1, IEEE Service Center, New York, NY.

Bash, C.E., Patel, C.D., and Sharma, R.K., "Efficient Thermal Management of Data Centers—Immediate and Long-Term Research Needs" Intl. J. Heat, Ventilating, Air-Conditioning and Refrigeration Research, 2003, pp. 137-152, vol. 9, No. 2.

Beaty et al., "High Density Cooling of Data Centers and Telecom Facilities—Part 2," 2005, ASHRAE Transactions, vol. 111, pp. 932-944.

Beitelmal et al., "Thermo-Fluids Provisioning of a High Performance High Density Data Center", Apr. 22, 2006, Springer Science and Business Media, Inc, Distributed and Parallel Databases, 21, pp. 227-238 DOI:1 0.1 007/s10619-005-0413-0.

Bejan Convection Heat Transfer, "Free Stream Turbulence," Ch. 8, pp. 282-305.

Bemis et al, Data Center Airflow Modeling: Helps Facilities Planners Make Informed Decisions. Applied Math Modeling Inc. 2009 [retrieved on Apr. 19, 2012). Retrieved from the Internet: <URL: http:l/www.coolsimsoftware.com/wwwrooULinkCiick.aspx?fileticket=r1 SqFUDtRTk%3D&tabid=189> entire document.

Chandrakant D. Patel, et al., "Thermal Considerations in Cooling Large Scale High Copute Density Data Centers" IEEE 2002, pp. 767-776.

Chen et al. "Analysis of the Key Agreement Scheme of ZigBee Standard". E-Business and Information System Security (E-BISS), 2010 2nd International Conference on IEEE, Pscataway, NJ USA. May 22, 2010.

Chen, Q.and Srebric, J., "Simplified Diffuser Boundary Conditions for Numerical Room Airflow Models," Final Report for ASHRAE RP-1009, Department of Architecture, Massachusetts Institute of Technology, Cambridge, MA, 2000, 181 pages.

David M. Xu et al., Quasi Soft-Switching Partly Decoupled Three-Phase PFC with Approximate Unity Power Factor, 1998, pp. 953-957.

Duran et al., "Virtual personal computers and the portable network," IEEE Proceedings of Inter. Performance, Computing, and Communications, IPCCC'99, p. 52-56, Feb. 1999.

Dvinsky: "Hot Tips for Using Cooling Software a Little Planning Lets Users Get More from Their Thermal-Simulation Software", Machine Design, Penton Media, Cleveland, OH, vol. 72, No. 4, Feb. 24, 2000.

Ehsan Pakabaznia et al., "Miminizing data center cooling and server power costs", Proceedings of the 14th ACM/IEEE International Symposium on Low Power Electronics and Design, ISLPED '09,

(56) References Cited

OTHER PUBLICATIONS

Jan. 1, 2009 (Jan. 1, 2009), p. 145, XP55015368, New York, New York, USA, DOI: 10.1145/1594233.1594268, ISBN: 978-1-60-558684-7.
Enterprise 4000/4500/Stor Rack Kit Installation Instructions, Oct. 1, 2001.
Fossum, E.R. "CMOS image sensors; electronic camera-on-a-chip", IEEE Transactions on Electron Devices, vol. 44, iss. 10, pp. 1689-1698, Oct. 1997.
Gilbert, R. Validation of Computational Fluid Dynamics Based Data Center Cyber-Physical Models. Arizona State University. May 2012. [Retrieved Feb. 21, 2013].[Retrieved from internet: <URL:http://impact.asu.edu/thesis/Robin_thesis.pdf>]. entire document.
Healey, C., et al., "Potential-Flow Modeling for Data Center Applications," Proceedings of the ASME 2011 Pacific Rim Technical Conference & Exposition on Packaging and Integration of Electronic and Photonic Systems, IPACK2011-52136, Jul. 6-8, 2011.
Herrlin, M.K., "Rack Cooling Effectiveness in Data Centers and Telecom Central Offices: The Rack Cooling Index (RCI)," ASHRAE Transaction, 2005, pp. 725-731, vol. 111(2).
Hochhauser, "Netbotz Wallbotx 400 is the next best thing to being there," CMP Media Inc., Network Computing, V. 13, No. 2, p. 1-2, Jan. 2002.
Inlet and Outlet Areas. University of Oregon. unknown. [retrived Feb. 21, 2013].[Retrieved from internet:<URL: pages.uoregon.edu/esbl/es_site/student_option/explanations folder/inlet_outlet_areas_htm> ]. entire document.
Innovative Research, Inc., http://web.archive.org/web/20051221005029/http://www.inres.com/, Dec. 21, 2005, published on World Wide Web.
Jack P. Holman: "Chapter 3 Steady-State Conduction" In: "Heat Transfer", 2002, McGraw Hill, XP055273397, pp. 71-130.
Jeffrey Rambo et al., "Modeling of data center airflow and heat transfer: State of the art and future trends", Distributed and Parallel Databases, Kluwer Academic Publishers, BO, vol. 21, No. 2-3, Jan. 20, 2007 (Jan. 20, 2007), pp. 193-225, XP019499845, ISSN: 1573-7578, DOI:10.1007/S10619-006-7007-3.
Jeonghwan Choi et al., "A CFD-Based Tool for Studying Temperature in Rack-Mounted Servers", IEEE Transactions on Computers, IEEE Service Center, Los Alamitos, CA, US, vol. 57, No. 8, Aug. 1, 2008 (Aug. 1, 2008), pp. 1129-1142, ISSN: 0018-9340, DOI: 10.1109/TC.2008.52.
K. Dunlap, "Cooling Audit for Identifying Potential Cooling Problems in Data Centers", White Paper #40, pp. 1-18, American Power Conversion, May 20, 2004, published on World Wide Web.
Karki et al., "Techniques for Controlling Airflow Distribution in Raised-Floor Data Centers," The Pacific Rim/ASME International Electronic Packaging Technical Conference and Exhibition, Jul. 13, 2003.
Karki, K.C. et al., "Use of Computational Fluid Dynamics for Calculating Flow Rates Through Perforated Tiles in Raised-Floor Data Centers," International Journal of Heating, Ventilation, Air-Conditioning, and Refrigeration Research, vol. 9, No. 2, Apr. 2003, pp. 153-166.
Le et al., "Operating Behaviour of Single Split Coil Systems Under Modulating and Two-Position Control", Published 2005 by American Society of Heating, Refrigerating and Air-Conditioning Engineers, Inc.
Lennox, Cubic Feet Per Minute (CFM), 2017, Lennox, pp. 1-2.
Liebert, "DataCool—60 Hz", May 2002, 2 pages.
Liebert, "Foundation—60Hz", May 2002, 9 pages.
Marshall et al.: "Transient CRAC Failure Analysis", retrieved from the Internet: http://coolsimsoftware.com/Portals/0/PDF/WP_106_CRAC_Failure_pdf [retrieved Apr. 25, 2016]; Dec. 31, 2010, pp. 1-7.

* cited by examiner

FIG. 23

Report 2302

| Effects of Stranded Condition | Causes of Stranded Condition | | | | | | | Total |
|---|---|---|---|---|---|---|---|---|
| | Power | Cooling | Rack U Space | Rack PDU Outlets | Floor Space | Patch Panel Ports | Weight Support Capacity | |
| Power | N/A | 0% | 10% | 15% | 0% | 5% | 0% | 30% |
| Cooling | 20% | N/A | 0% | 5% | 5% | 0% | 0% | 30% |
| Rack U Space | 0% | 10% | N/A | 10% | 0% | 0% | 0% | 20% |
| Rack PDU Outlets | 10% | 5% | 10% | N/A | 0% | 10% | 0% | 35% |
| Floor Space | 10% | 10% | 10% | 5% | N/A | 5% | 0% | 40% |
| Patch Panel Ports | 5% | 5% | 10% | 10% | 0% | N/A | 0% | 30% |
| Weight Support Capacity | 20% | 20% | 10% | 0% | 0% | 0% | N/A | 50% |

METHODS AND SYSTEMS FOR MANAGING FACILITY POWER AND COOLING

RELATED APPLICATIONS

This application is a Continuation of U.S. patent application Ser. No. 12/121,113, filed on May 15, 2008, entitled "METHODS AND SYSTEMS FOR MANAGING FACILITY POWER AND COOLING," which claims priority under 35 U.S.C. § 119(e) to U.S. Provisional Application Ser. No. 60/938,034, entitled "METHODS AND SYSTEMS FOR MANAGING FACILITY POWER AND COOLING," filed on May 15, 2007, both of which are hereby incorporated herein by reference in their entirety for all purposes.

BACKGROUND OF INVENTION

1. Field of Invention

Embodiments of the invention relate generally to entity management, and more specifically to methods and systems for managing facility power and cooling.

2. Discussion of Related Art

Centralized data centers for computer, communications and other electronic equipment have been in use for a number of years, and more recently with the increasing use of the Internet, large scale data centers that provide hosting services for Internet Service Providers (ISPs), Application Service Providers (ASPs) and Internet content providers are becoming more prevalent. Typical centralized data centers contain numerous racks of equipment that require power, cooling and connections to external communications facilities. In modern data centers and network rooms, the increased density of computing equipment used in these facilities has put strains on the cooling and power systems of the facilities. In the past, typical power consumption for each equipment enclosure in a data facility was on the order of 1 kW. With the use of server blades and other high power density equipment in equipment racks, it is not uncommon for an equipment rack to have a power draw of 10 kW or even as high as 25 kW.

Typically, the power consumed by computer equipment is converted to heat and typically, the cooling requirements of a facility are determined based on the power requirements of the facility. Typical data centers utilize air plenums under raised floors to distribute cooling air through a data center. One or more computer room air conditioners (CRACs) or computer room air handlers (CRAHs) are typically distributed along the periphery of the data room, and these units draw return air from the room or a ceiling plenum and distribute cooling air beneath the raised floor. Perforated tiles may be placed in front or beneath racks of equipment to be cooled to allow the cooling air from beneath the floor to cool equipment within the racks.

Several tools are available to assist a data center designer in configuring a layout of a data center to provide necessary power and cooling to equipment to be located in the data center. These tools typically assist a designer in determining total power requirements and accordingly overall cooling requirements for a data center. In addition, these tools may assist a designer in determining optimum equipment layout and proper sizing of power cabling and circuit breakers.

While existing tools provide a designer with detailed layout information regarding power distribution, these tools typically provide far less help in determining cooling needs for a facility. Advanced programs that use computational fluid dynamics (CFD) may be used to model the cooling design of a facility, but the use of such programs is extremely limited due to the complexity of the programs, which results in their use being prohibitively expensive and time consuming. U.S. Patent Application US2003/0158718 A1 to Nakagawa et al describes an automated system for designing a cooling system for a facility. In the system of Nakagawa, the facility is divided into a number of pre-characterized cells (such as a cluster of racks) over which the response of various parameters, such as maximum temperature, are known based on key parameters. The system uses built-in cell to cell interaction rules to predict overall thermal performance and to optimize equipment layout. While this system may offer some improvements in speed over a full CFD analysis, it is limited to the use of pre-characterized cells, and does not provide analysis below the cell level. Also, the cells must be characterized using, for example, a CFD analysis or physical testing.

Programs and systems such as those described above provide idealized results for the cooling performance of a facility and often fail to account for situations which often occur in real life installations, which can dramatically affect the cooling performance of a data center. For example, in a facility using a raised floor, the absence of one or more floor panels, or the misplacement of one or more perforated floor panels can greatly affect the cooling performance of the data center and cause the actual performance to vary greatly from a calculated idealized performance. Further, the degradation in performance of one or more air conditioning units can drastically change airflow and cooling characteristics of a facility.

The inability to properly analyze the cooling performance of a facility typically causes a data center designer to over design the facility from a cooling perspective, which results in the facility to be more expensive and less efficient.

In existing data centers, it is often desirable to replace equipment with upgraded equipment and/or add new equipment to existing enclosures in the facility. Several tools exist which enable a manager of a data center to monitor power usage in a facility. These tools include the InfrastruXure® Manager and/or InfrastruXure® Central product available from American Power Conversion Corporation of West Kingston, R.I.

With the increasing cooling and power requirements of computer equipment, it is desirable for a data center manager to determine if there is adequate power and cooling available in the facility before new or replacement equipment may be added. Typically, a data center manager may know, or can determine, if the total cooling capacity of the data center is sufficient for the total power draw. However, hot spots in a facility may develop, particularly where high power density equipment is used, and it may not be enough to merely analyze cooling capacity at the facility level. To attempt to identify hot spots, a data center manager may resort to manual temperature measurements throughout a facility and try to implement fixes to correct the hot spots. Such fixes may involve a rearrangement or replacement of perforated floor panels, a rearrangement of enclosures, and/or adding additional cooling capacity. In any case, these fixes are typically done on a trial and error basis, and while some hot spots may be eliminated, the fixes may cause other hot spots to arise due to a redirection of the cooling air in the facility. This trial and error approach can lead to unexpected failures of equipment, which is unacceptable in critical data centers. To avoid such failures, data center managers typically over design facilities and fail to use facilities to their full capacity.

SUMMARY OF INVENTION

Aspects of the present invention relate generally to management of data center entities and their associated resources. Embodiments of the invention provide systems and methods for determining data center cooling and power requirements and for monitoring performance of cooling and power systems in data centers. At least one embodiment provides a system and method that enables a data center operator to determine available power and cooling at specific areas and enclosures in a data center to assist in locating new equipment in the data center.

One aspect is directed to a method that includes determining cooling capacity of a number of equipment enclosures in a data center, determining cooling requirements of each of the number of equipment enclosures, and providing an indication of remaining cooling capacity for each of the number of equipment enclosures.

The method may further include developing a floor plan model of the data center, wherein the floor plan model includes a floor plan that indicates location of each of the number of equipment enclosures in the data center, and for each of the number of equipment enclosures, displaying on the floor plan, the indication of remaining cooling capacity. The indication of remaining cooling capacity may include an indication of additional power that can be drawn by each of the number of equipment enclosures based on the remaining cooling capacity. Determining cooling capacity may include calculating a predicted cooling capacity based on the floor plan model. Determining cooling capacity may include measuring airflow at a first plurality of locations in the facility to obtain a measured cooling capacity. Determining cooling capacity may include measuring air temperature at a second plurality of locations in the facility. At least one of the first plurality of locations and the second plurality of locations includes at least one air vent of a raised floor. The method may further include comparing predicted cooling capacity with measured cooling capacity to obtain a comparison result and providing an indication when the comparison result is greater than a threshold. The method may further include adjusting the predicted cooling capacity based on measured airflow. The method may further include determining placement of new equipment in an equipment enclosure in the data center by comparing power ratings of the new equipment with cooling capacity of the equipment enclosure. The method may further include, for each of the number of equipment enclosures, determining electrical power capacity and remaining electrical power availability, and displaying on the floor plan remaining electrical power availability. In the method, determining remaining electrical power availability may include measuring at least one parameter of electrical power provided to at least one of the number of equipment enclosures. In the method, determining cooling capacity of an equipment enclosure may include estimating available cooling air at the equipment enclosure using a weighted summation of available airflows from a plurality of airflow sources, the weights used in the weighted summation may decrease with distance from the equipment enclosure to each of the airflow sources, and the weights may be based on mechanical characteristics of the plurality of airflow sources. The method may further include determining available airflow of at least one of the plurality of airflow devices using at least one of specifications of the at least one of the plurality of airflow devices and measured data for the at least one of the plurality of airflow devices in the data center. The method may further include determining available airflow of at least a second one of the plurality of airflow devices based on the measured data for the at least one of the plurality of airflow devices. In the method, determining cooling capacity may include using superposition to combine airflows. In the method, determining airflow into and out of each of a plurality of sides of each control volume may include computing airflows using equations based on at least one of conservation of mass and conservation of momentum. Further, determining airflow into and out of each of a plurality of sides of each control volume may include determining airflows using empirical rules derived from CFD, physical measurement, or any other means.

Another aspect of the invention is directed to a system for managing a data center. The system includes at least one input to receive data related to equipment and equipment enclosures and to receive data related to cooling characteristics of the data center, a controller operatively coupled to the input and configured to determine cooling capacity of each equipment enclosure, and at least one output operatively coupled to the controller that provides an indication of remaining cooling capacity for each of the equipment enclosures.

The system may further include an output device coupled to the at least one output, wherein the system is configured to display a floor plan of at least a portion of the data center indicating location of at least one of the equipment enclosures in the data center and indicating the remaining cooling capacity for the at least one of the equipment enclosures. The output device may be configured to include an indication of additional power that can be drawn by the at least one of the equipment enclosures. The system may further include at least one airflow monitor operatively coupled to the controller to provide data related to at least one airflow in the data center. The system may further include at least one air monitor operatively coupled to the controller to provide data related to air temperature at a location in the data center. The controller may be configured to compare a predicted cooling capacity with a measured cooling capacity to obtain a comparison result and to provide an indication when the comparison result is greater than a threshold. The system may further include at least one power monitor operatively coupled to the controller, and at least one airflow controller operatively coupled to the controller and responsive to signals from the controller to alter cooling airflow in the data center. The system may further include at least one power controller operatively coupled to the controller and responsive to signals from the controller to alter at least one characteristic of power in the data center.

Another aspect of the invention is directed to a system for managing a data center. The system includes at least one input to receive data related to equipment and equipment enclosures and to receive data related to cooling characteristics of the data center, and means, coupled to the at least one input, for determining remaining cooling capacity for each of the number of equipment enclosures and providing an indication of remaining cooling capacity.

The system may further include means for providing an indication of additional power that can be drawn by each of the equipment enclosures and means for updating the indication of remaining cooling capacity based on measured airflows in the data center. The system may still further include means for determining placement of equipment in the data center based on remaining cooling capacity, and means for estimating available cooling air of at least one of the equipment enclosures using a weighted summation of available airflows from a plurality of airflow sources.

Another aspect of the invention is directed to a computer-implemented method of managing power and cooling capacity of a data center. The method includes receiving data center parameters, determining an equipment layout in the data center, the equipment layout identifying a location of each of a plurality of devices in the data center, based on the location, determining available power and available cooling in the data center for each of the plurality of devices, comparing the available power and available cooling with power requirements and cooling requirements of each of the plurality of devices to obtain a cooling comparison result and a power comparison result for each of the plurality of devices.

The method may further include comparing each of the comparison cooling results and the power cooling results with thresholds and providing at least one recommendation for correcting an out of tolerance condition. The at least one recommendation may include adding an in-row cooling unit in a row of equipment of the data center along with a proposed location for the in-row cooling unit. The method may further include determining at least one of stranded cooling capacity and stranded power capacity in the data center and providing recommendations for reducing at least one of the stranded power capacity and the stranded cooling capacity in the data center. The method may further include displaying a floor plan model of the data center, wherein the floor plan model includes a floor plan that indicates a location of each of the plurality of devices in the data center, and for each of the plurality of devices, displaying on the floor plan an indication of remaining cooling capacity. The method may include displaying on the floor plan an indication of remaining power capacity for each of the plurality of devices. The method may still further include setting a redundancy level for at least some of the plurality of devices, and wherein the available power and available cooling are determined to meet the redundancy level. In the method, the act of determining the equipment layout may include arranging the plurality of devices in at least two substantially parallel rows with a hot aisle formed between the two rows, and the method may further include conducting a cooling analysis by analyzing airflows in the hot aisle. The method may include selecting at least one in-row cooling unit to be placed in the layout in one of the at least two substantially parallel rows. At least one of the plurality of devices is an equipment rack, and the method may include determining a capture index for the at least one in-row cooling unit and the equipment rack. The method may further include on a display screen, simultaneously displaying a first floor plan model of the data center and a second floor plan model of the data center, wherein the first floor plan model includes at least a partial view of the data center and the second floor plan model includes a full view of the data center. The second floor plan model may include an indication of a portion of the data center that is shown in the first floor plan model. The method may further include displaying a three dimensional view of at least a portion of the data center. The method may include selecting a camera location for use in the data center and displaying a three dimensional view of a viewing area of the camera. The method may further include selecting a subset of the plurality of devices and defining a power zone for each device of the subset of the plurality of devices, wherein each power zone includes at least one UPS. In the method, each of the plurality of devices may be an equipment rack, and the method may further include selecting components for each of the plurality of devices from a displayed list of components. The method may further include determining operational power costs and operational cooling costs for a subset of the plurality of devices, and the operational power costs and operational cooling costs may be determined in terms of kilowatts. The method may further include transferring an electronic file containing data for the equipment layout from a design system to a management system. The method may also include displaying measured data for the data center on a display of a layout of the data center.

Another aspect of the invention is directed to a computer-implemented method for designing a layout of a data center. The method includes receiving information from a user regarding parameters of the data center, determining an equipment layout for the data center, the equipment layout identifying a location of each of a plurality of devices in the data center, and on a display screen, simultaneously displaying a first floor plan model of the data center and a second floor plan model of the data center, wherein the first floor plan model includes at least a partial view of the data center and the second floor plan model includes a full view of the data center.

In the method, the second floor plan model may include an indication of a portion of the data center that is shown in the first floor plan model. The method may further include determining available power and available cooling in the data center for each of the plurality of devices, and comparing the available power and available cooling with power requirements and cooling requirements of each of the plurality of devices to obtain a cooling comparison result and a power comparison result for each of the plurality of devices. The method may include, for each of the plurality of devices, displaying on the first floor plan model an indication of remaining cooling capacity, and displaying on the first floor plan model an indication of remaining power capacity for each of the plurality of devices.

Another aspect of the invention is directed to a system for use with a data center. The system includes an input to receive instructions from a user, an output to provide output data to a display device, and a controller coupled to the input and to the output and configured to determine an equipment layout of a data center, the equipment layout identifying a location of each of a plurality of devices in the data center. The controller is further configured to, based on the location, determine available power and available cooling in the data center for each of the plurality of devices, and compare the available power and available cooling with power requirements and cooling requirements of each of the plurality of devices to obtain a cooling comparison result and a power comparison result for each of the plurality of devices.

In the system, the controller may be configured to compare each of the comparison cooling results and the power cooling results with thresholds, and based on at least one of the cooling comparison result and the power comparison result, provide at least one recommendation for correcting an out of tolerance condition. The at least one recommendation may include adding an in-row cooling unit in a row of equipment of the data center, and the at least one recommendation may include a proposed location for the in-row cooling unit. The controller may be configured to determine at least one of stranded cooling capacity and stranded power capacity in the data center, and to provide recommendations for reducing at least one of the stranded power capacity and the stranded cooling capacity in the data center. The controller may be further configured to provide data to the output for displaying a floor plan model of the data center, wherein the floor plan model includes a floor plan that indicates a location of each of the plurality of devices in the data center, and provide data to the output for displaying on the floor plan an indication of remaining cooling capacity. The controller may be further configured to provide data to the output for displaying on the floor plan an indication of remaining power capacity for each of the plurality of devices, and the controller may be configured to determine the available power and available cooling based on a user-selected redundancy level. The controller may be configured to arrange the plurality of devices in at least two substantially parallel rows with a hot aisle formed between the two rows, and to conduct a cooling analysis by analyzing airflows in the hot aisle. The controller may be configured to select at least one in-row cooling unit to be placed in the layout in one of the at least two substantially parallel rows. At least one of the plurality of devices may be an equipment rack, and the controller may be configured to determine a capture index for the at least one in-row cooling unit and the equipment rack. The controller may be configured to provide data to the output to simultaneously display a first floor plan model of the data center and a second floor plan model of the data center, wherein the first floor plan model includes at least a partial view of the data center and the second floor plan model includes a full view of the data center. The second floor plan model may also include an indication of a portion of the data center that is shown in the first floor plan model. The controller may be configured to provide data to the output to display a three dimensional view of at least a portion of the data center, and to provide data to the output to display a three dimensional view of a viewing area of a camera to be located in the data center. The controller may be further configured to select a subset of the plurality of devices and define a power zone for each device of the subset of the plurality of devices, wherein each power zone includes at least one UPS. The system may further include a database module containing data for components to be loaded into the plurality of devices, and the controller may be configured to provide data to the output for displaying a list of the components. The controller may be configured to determine operational power costs and operational cooling costs for a subset of the plurality of devices, and the operational power costs and operational cooling costs may be determined in terms of kilowatts. The controller may also be configured to provide an output electronic file containing data for the equipment layout. The controller may also be configured to, based on at least one of the cooling comparison result and the power comparison result, provide at least one recommendation for placement of rack mount equipment.

Another aspect of the invention is directed to a computer-implemented method for designing a layout of a data center. The method includes receiving information from a user regarding parameters of the data center, determining an equipment layout for the data center, the equipment layout identifying a location of each of a plurality of devices in the data center, including identifying a row location for each of a plurality of equipment racks with a first subset of the plurality of equipment racks being included in a first row; and on a display screen, displaying a rack view of the data center showing a front view of each of the plurality of equipment racks of the first subset in the first row.

In the method, displaying a rack view may include displaying a front view of a second subset of the plurality of equipment racks of a second row along with the front view of the first subset of the plurality of equipment racks. In the method, displaying a rack view may include displaying a front view of a second subset of the plurality of equipment racks of a second row along with the front view of the first subset of the plurality of equipment racks. The first row may include additional equipment, with the additional equipment not included in the rack view. The method may further include simultaneously displaying on the display screen the rack view and a full room view of the equipment layout for the data center. The method may also include, in response to selection of a selected equipment rack in the full room view by a user, displaying the selected equipment rack in the rack view, and displaying the selected equipment rack in the rack view may include displaying a front view of the selected equipment rack.

Another aspect of the invention is directed to a computer-implemented method for evaluating the cooling performance of a cluster of equipment racks in a data center, wherein the cluster of equipment racks includes at least a first row of racks and a second row of racks separated by a cool aisle, with each of the equipment racks being configured to draw cooling air from the cool aisle. The method includes obtaining at least one of power data and airflow data for each of the equipment racks, obtaining cool airflow data for cool air supplied to the cool aisle from a source of cool air, and conducting an analysis of airflows in the cool aisle to determine a recirculation index for at least one of the equipment racks, wherein the recirculation index is indicative of a quantity of recirculated air included in an input airflow of the at least one equipment rack.

In the method, the recirculation index may be equal to a ratio of recirculated air to total air in the input airflow of the at least one equipment rack, and the method may further include determining a recirculation index for each of the equipment racks. In the method, the act of obtaining cool airflow data may include obtaining cool airflow data for an in-row cooling unit included in the cluster of racks. In the method, the act of obtaining cool airflow data may include obtaining cool airflow data of at least one perforated tile included in the cool aisle. In the method, the act of conducting an analysis may include defining a plurality of control volumes in the cool aisle, and the method may further include determining airflows in the cool aisle by determining airflow into and out of at least one of the control volumes. The method may further include comparing the recirculation index for each of the plurality of equipment enclosures with a threshold. The method may further include determining a cooling capacity for each of the equipment enclosures based on the recirculation index for each of the equipment enclosures, and displaying the cooling capacity for each of the equipment enclosures along with a representation of a data center containing the cluster. In the method, the act of conducting an analysis may include assigning different chemical concentration identifiers to the airflows for at least two of the plurality of equipment racks. In the method, the act of conducting an analysis may include importing empirical data and determining end of aisle airflows using the empirical data. In the method, the act of conducting an analysis may include determining cool aisle airflows in isolation from the data center to obtain isolated results, and combining the isolated results with the empirical data.

Another aspect of the invention is directed to a computer-implemented method for evaluating the cooling performance of a cluster of equipment racks in a data center, wherein the cluster of equipment racks includes at least a first row of racks and a second row of racks separated by a hot aisle, with each of the equipment racks being configured to exhaust air into the hot aisle. The method includes obtaining at least one of power data and airflow data for each of the equipment racks, obtaining airflow data for at least one air removal unit contained in one of the first row of equipment racks and the second row of equipment racks, and conducting an analysis of airflows in the hot aisle to determine a capture index for at least one of the equipment racks, wherein the capture index is indicative of a fraction of air that is exhausted by the at least one of the equipment racks and captured by the at least one air removal unit.

In the method, the at least one air removal unit may include an in-row cooling unit, and the capture index may be equal to a ratio of captured air to total air exhausted by the at least one equipment rack. The method may further include determining a capture index for each of the equipment racks. In the method, the act of conducting an analysis may include defining a plurality of control volumes in the hot aisle, and the method may further include determining airflows in the hot aisle by determining airflow into and out of at least one of the control volumes. The method may further include comparing the capture index for each of the plurality of equipment enclosures with a threshold. The method may include determining a cooling capacity for each of the equipment enclosures based on the capture index for each of the equipment enclosures, and displaying the cooling capacity for each of the equipment enclosures along with a representation of a data center containing the cluster. In the method, the act of conducting an analysis may include assigning different chemical concentration identifiers to the airflows for at least two of the plurality of equipment racks. In the method, the act of conducting an analysis may include importing empirical data and determining end of aisle airflows using the empirical data. The act of conducting an analysis may include determining hot aisle airflows in isolation from the data center to obtain isolated results, and combining the isolated results with the empirical data. In the method, the act of conducting an analysis may include importing empirical rules, and determining the capture index using the empirical rules, and the empirical rules may include coefficients for use in determining at least one capture index.

Another aspect of the invention is directed to a computer-readable medium encoded with instructions for execution on a computer system. The instructions, when executed, perform a method comprising acts of obtaining at least one of power data and airflow data for a plurality of equipment racks arranged in a cluster, wherein the cluster of equipment racks includes at least a first row of racks and a second row of racks separated by a cool aisle, with each of the equipment racks being configured to draw cooling air from the cool aisle, obtaining cool airflow data for cool air supplied to the cool aisle from a source of cool air, and conducting an analysis of airflows in the cool aisle to determine a recirculation index for at least one of the equipment racks, wherein the recirculation index is indicative of a quantity of recirculated air included in an input airflow of the at least one equipment rack.

The recirculation index may equal to a ratio of recirculated air to total air in the input airflow of the at least one equipment rack, and the acts may further include determining a recirculation index for each of the equipment racks. The act of obtaining cool airflow data may include obtaining cool airflow data for an in-row cooling unit included in the cluster of racks. The act of obtaining cool airflow data may include obtaining cool airflow data of at least one perforated tile included in the cool aisle. The act of conducting an analysis ma include defining a plurality of control volumes in the cool aisle, and wherein the method further includes determining airflows in the cool aisle by determining airflow into and out of at least one of the control volumes. The acts may further include comparing the recirculation index for each of the plurality of equipment enclosures with a threshold, and determining a cooling capacity for each of the equipment enclosures based on the recirculation index for each of the equipment enclosures. The acts may further include displaying the cooling capacity for each of the equipment enclosures along with a representation of a data center containing the cluster. The act of conducting an analysis may include assigning different chemical concentration identifiers to the airflows for at least two of the plurality of equipment racks. The act of conducting an analysis may include importing empirical data and determining end of aisle airflows using the empirical data. The act of conducting an analysis may include determining cool aisle airflows in isolation from the data center to obtain isolated results, and combining the isolated results with the empirical data.

Another aspect of the invention is directed to a computer-readable medium encoded with instructions for execution on a computer system. The instructions when executed, perform a method comprising acts of obtaining at least one of power data and airflow data for a plurality of equipment racks arranged in a cluster, wherein the cluster of equipment racks includes at least a first row of racks and a second row of racks separated by a hot aisle, with each of the equipment racks being configured to exhaust air into the hot aisle, obtaining airflow data for at least one air removal unit contained in one of the first row of equipment racks and the second row of equipment racks, and conducting an analysis of airflows in the hot aisle to determine a capture index for at least one of the equipment racks, wherein the capture index is indicative of a fraction of air that is exhausted by the at least one of the equipment racks and captured by the at least one air removal unit.

In the method, the at least one air removal unit may be an in-row cooling unit, and the capture index may be equal to a ratio of captured air to total air exhausted by the at least one equipment rack. The acts may further include determining a capture index for each of the equipment racks. The act of conducting an analysis may include defining a plurality of control volumes, and wherein the method further includes determining airflows in the hot aisle by determining airflow into and out of at least one of the control volumes. The acts may further include comparing the capture index for each of the plurality of equipment enclosures with a threshold. The acts may further include determining a cooling capacity for each of the equipment enclosures based on the capture index for each of the equipment enclosures, and displaying the cooling capacity for each of the equipment enclosures along with a representation of a data center containing the cluster. The act of conducting an analysis may include assigning different chemical concentration identifiers to the airflows for at least two of the plurality of equipment racks. The act of conducting an analysis may include importing empirical data and determining end of aisle airflows using the empirical data. The act of conducting an analysis may include determining hot aisle airflows in isolation from the data center to obtain isolated results, and combining the isolated results with the empirical data. The act of conducting an analysis may include importing empirical rules, and determining the capture index using the empirical rules. The empirical rules include coefficients for use in determining at least one capture index.

According to one aspect of the present invention, a computer-implemented method for providing a representation of capacity of a data center resource is provided. The method comprises acts of determining a first indication of excess capacity of a first data center resource that is unusable due to insufficient capacity of at least one other data center resource associated with the first data center resource, and providing the first indication of excess capacity of the first data center resource to an external entity. According to one embodiment of the present invention, the act of determining the first indication of excess capacity includes an act of determining an amount of excess capacity of the first data center resource that is unusable due to insufficient capacity of the at least one other data center resource associated with the first data center resource. According to another embodiment of the invention, the act of determining the first indication of excess capacity includes an act of determining an indication of excess capacity at a location in a rack. According to another embodiment of the invention, the act of determining the first indication of excess capacity at the location in the rack includes an act of determining an indication of excess capacity at a U space position. According to another embodiment of the invention, the act of determining the first indication of excess capacity includes an act of determining an indication of excess capacity of rack space that is unusable due to insufficient capacity of power.

According to one embodiment of the present invention, the act of determining the first indication of excess capacity includes an act of determining an indication of excess capacity of power that is unusable due to insufficient capacity of cooling. According to another embodiment of the invention, the act of determining the first indication of excess capacity includes an act of determining an indication of excess capacity of power distribution that is unusable due to insufficient capacity of power available for distribution. According to another embodiment of the invention, the act of determining the first indication of excess capacity includes an act of determining an indication of excess capacity of physical space that is unusable due to insufficient capacity of cooling. According to another embodiment of the invention, the act of determining the first indication of excess capacity includes an act of determining an indication of excess capacity of power distribution that is unusable due to insufficient capacity of network connectivity. According to another embodiment of the invention, the act of determining the first indication of excess capacity includes an act of determining an indication of excess capacity of U space that is unusable due to insufficient capacity of weight support.

According to one embodiment of the present invention, the act of providing the first indication of excess capacity includes an act of providing the indication to another system element. According to another embodiment of the invention, the act of providing the first indication of excess capacity includes an act of presenting the first indication to a user of a computer system. According to another embodiment of the invention, the act of presenting the first indication to the user of the computer system includes an act of presenting, to the user of the computer system, an amount of excess capacity of the first data center resource that is unusable due to insufficient capacity of the at least one other data center resource associated with the first data center resource. According to another embodiment of the invention, the act of presenting, to the user of the computer system, the amount of excess capacity includes acts of presenting, to the user of the computer system, an identifier that identifies the first data center resource and presenting, to the user of the computer system, an identifier that identifies the at least one data center resource. According to another embodiment of the invention, the method further comprises determining a configuration of data center equipment that minimizes, relative to at least one other configuration, the excess capacity of the first data center resource, and providing the configuration of data center equipment to an external entity.

According to one embodiment of the present invention, determining the configuration of data center equipment includes determining a location for at least one element of data center equipment. According to another embodiment of the invention, the method further comprises determining a second indication of excess capacity of a second data center resource that is unusable due to insufficient capacity of at least one other data center resource associated with the second data center resource determining a configuration of data center equipment that minimizes, relative to at least one other configuration, an aggregate of the first indication and the second indication, and providing the configuration of data center equipment to an external entity.

According to one aspect of the present invention, a computer-implemented method for providing a representation of a data center resource is provided. The method comprises acts of determining a status of capacity for the data center resource provided to either a rack or a location in a rack, and providing the status to an external entity. According to another embodiment of the invention, determining the status of capacity for the data center resource includes determining a status for the data center resource provided to a U space position. According to one embodiment of the present invention, the act of determining the status of capacity for the data center resource includes an act of determining a status of capacity of power. According to another embodiment of the invention, the act of determining the status of capacity for the data center resource includes an act of determining a status of capacity of cooling. According to another embodiment of the invention, the act of determining the status of capacity for the data center resource includes an act of determining a status of capacity of physical space. According to another embodiment of the invention, the act of determining the status of capacity for the data center resource includes an act of determining a status of capacity of weight support. According to another embodiment of the invention, the act of determining the status of capacity for the data center resource includes an act of determining a status of available capacity. According to another embodiment of the invention, the act of determining the status of capacity for the data center resource includes an act of determining a status of utilized capacity.

According to one aspect of the present invention, a computer-implemented method for providing a representation of a data center resource is provided. The method comprises acts of determining a rate of change of a utilized capacity of the data center resource based at least in part on changes to a data center configuration, and providing a predicted utilization of the data center resource based at least in part on the rate of change. According to another embodiment of the invention, determining the rate of change of utilized capacity of the data center resource includes determining the rate of change using linear regression. According to another embodiment of the invention, the data center resource includes power. According to another embodiment of the invention, the data center resource includes cooling.

According to one aspect of the present invention, a system for providing a representation of a capacity of data center resource is provided. The system comprises an input configured to receive a capacity of a first data center resource and a capacity of at least one other data center resource, an output configured to provide an amount of excess capacity of the first data center resource, and a controller coupled to the input and the output and configured to determine an amount of excess capacity of the first data center resource that is unusable due to insufficient capacity of the at least one other data center resource.

According to one aspect of the present invention, a system for providing a representation of a data center resource is provided. The system comprises an input configured to receive capacity information for a data center resource, an output configured to provide a status of capacity for the data center resource, and a controller coupled to the input and the output and configured to determine the status of capacity for the data center resource at either a rack or a location in a rack.

According to one aspect of the present invention, a system for providing an evaluation of a data center resource is provided. The system comprises an input configured to receive changes in a data center configuration, an output configured to provide a predicted utilization of the data center resource based on a rate of change of utilized capacity of the data center resource, and a controller configured to determine the rate of change of the utilized capacity of the data center resource based on the changes in a data center configuration.

According to one aspect of the present invention, a computer-implemented method for distributing data describing models of data center equipment is provided. The method comprises acts of indicating a first group of the data describing models of data center equipment, the first group identifying standard models of data center equipment, indicating a second group of the data describing models of data center equipment, the second group identifying models approved for use in a first data center, indicating a third group of the data describing models of data center equipment, the third group identifying models preferred for use in the first data center, providing the second group to a first remote computing device located in the first data center, and providing the third group to the first remote computing device located in the first data center. According to one embodiment of the present invention, the act of providing the second group comprises an act of providing data including at least one of the group comprising data center equipment manufacturer, data center equipment model, data center equipment power plug type, data center equipment number of plugs required, data center equipment power required, data center equipment airflow required, data center equipment network connectivity required, data center equipment weight support required, data center equipment cooling required, and data center equipment physical space required. According to another embodiment of the invention, the method further comprises an act of providing the third group from the first remote computing device to a second remote computing device.

According to one embodiment of the present invention, the act of providing the third group from the first remote computing device includes an act of providing the third group to a mobile computing device. According to another embodiment of the invention, the act of indicating a first group includes storing an indicator of the first group in a database hosted by a system provider. According to another embodiment of the invention, the method further comprises an act of receiving first non-standard data describing models of data center equipment from the first remote computing device. According to another embodiment of the invention, the method further comprises an act of receiving non-standard data describing models of data center equipment from an external entity. According to another embodiment of the invention, the act of receiving non-standard data includes receiving additional data from a data center equipment manufacturer. According to another embodiment of the invention, the method further comprises acts of indicating a fourth group of the data describing models of data center equipment, the fourth group identifying models approved for use in a second data center, indicating a fifth group of the data describing models of data center equipment, the fifth group identifying models preferred for use in the second data center, providing the fourth group to a third remote computing device located in the second data center, and providing the fifth group to the third remote computing device located in the second data center. According to another embodiment of the invention, the method further comprises an act of receiving second non-standard data describing models of data center equipment from the third remote computing device.

According to one aspect of the present invention, a computer-implemented method for maintaining a data center equipment database is provided. The method comprises acts of receiving a set of configuration management data from each of a plurality of data centers, each set of configuration management data identifying one of the plurality of data centers, a capacity for power of the identified data center, a capacity for cooling of the identified data center and at least one element of data center equipment disposed within the identified data center. According to one embodiment of the present invention, the acts of receiving include acts of receiving configuration management data including at least one of the group comprising data center physical dimensions, data center equipment location within the data center physical dimensions, data center power distribution provided to the data center equipment location, data center cooling distribution provided to the data center equipment location, data center network connectivity provided to the data center equipment location, data center equipment manufacturer, and data center equipment model. According to another embodiment of the invention, the method further comprises acts of receiving a set of data center resource consumption and production data from each of the plurality of data centers, each set of data center resource consumption and production data identifying one of the plurality of data centers and being associated with at least one element of data center equipment disposed within the identified data center.

According to one embodiment of the present invention, the acts of receiving a set of data center resource consumption and production data from each of the plurality of data centers include acts of receiving data center resource consumption and production data including at least one from the group comprising data center equipment identity, data center equipment manufacturer, data center equipment model, data center equipment power plug type used, data center equipment number of plugs used, data center equipment power used, data center equipment airflow used, data center equipment network connectivity used, data center equipment weight support used, data center equipment cooling used, and data center equipment physical space used. According to another embodiment of the invention, the acts of receiving a set of data center resource consumption and production data from each of the plurality of data centers include acts of receiving data center resource consumption and production data including at least one from the group comprising data center equipment identity, data center equipment manufacturer, data center equipment model, data center equipment power plug type provided, data center equipment number of plugs provided, data center equipment power provided, data center equipment airflow provided, data center equipment network connectivity provided, data center equipment weight support provided, data center equipment cooling provided, and data center equipment physical space provided.

According to one aspect of the present invention, a computer-implemented method for distributing data describing models of data center equipment is provided. The method comprises acts of receiving, from a first remote computing device, a first group of the data describing models of data center equipment, the first group identifying models approved for use in a data center, receiving, from the first remote computing device, a second group of the data describing models of data center equipment, the second group identifying models preferred for use in the data center, and providing the second group to a second remote computing device. According to one embodiment of the present invention, the method further comprises acts of receiving, from an external entity, non-standard data describing models of data center equipment that are not approved for use in the data center, and providing the non-standard data to the first remote computing device.

According to one aspect of the present invention, a system for managing equipment data describing models of data center equipment is provided. The system comprises an input configured to receive data associated with the equipment data, an output configured to provide data associated with the equipment data, and a controller coupled to the input and the output and configured to allow an external entity to indicate that a first group of the equipment data describes standard models of data center equipment; to indicate that a second group of the equipment data describes models of data center equipment approved for use in a data center, to indicate that a third group of the equipment data describes models of data center equipment preferred for use in the data center and further configured to provide, via the output, the second group to a remote computing device located in the data center and to provide, via the output, the third group to the remote computing device located in the data center.

According to one aspect of the present invention, a system for managing equipment data describing models of data center equipment is provided. The system comprises a computer readable medium, an input configured to receive data associated with the equipment data, an output configured to provide data associated with the equipment data, and a controller coupled to the input, the output and the computer readable medium and configured to store, in the computer readable medium, an first indication that a first group of the equipment data describes models of data center equipment approved for use in a data center and to store a second indication that a second group of equipment data describes models of data center equipment preferred for use in the data center and further configured to provide, via the output, the second group to a remote computing device located in the data center.

According to one aspect of the present invention, a system for maintaining a data center equipment database is provided. The system comprises an input configured to receive a set of configuration management data from each of a plurality of data centers, each set of configuration management data identifying one of the plurality data centers, a capacity for power of the identified data center, a capacity for cooling of the identified data center and at least one element of data center equipment disposed within the identified data center, and a controller coupled to the input and configured to store, in the data center equipment database, each set of configuration management data.

According to one aspect of the present invention, a computer-implemented method for managing a data center configuration is provided. The method comprises acts of receiving, from a user, a proposed change to the data center configuration though an interactive representation of a layout of an identified space in a data center, the proposed change including data identifying at least one element of data center equipment to be provisioned in the data center, the at least one element of data center equipment having a plurality of data center resource requirements, determining at least one location in the data center having a plurality of data center resources that satisfy the plurality of data center resource requirements of the at least one element of data center equipment, and storing the at least one location on a computer readable medium. According to one embodiment of the present invention, the act of receiving, from the user, the proposed change to the data center configuration includes an act of receiving data identifying at least one element of floor mounted data center equipment to be provisioned in the data center. According to another embodiment of the invention, the act of receiving, from the user, the proposed change includes an act of receiving, from the user, the proposed change to the data center configuration though an interactive representation of a layout of a data center room. According to another embodiment of the invention, the act of receiving, from the user, the proposed change includes an act of receiving, from the user, the proposed change to the data center configuration though an interactive representation of a layout of a rack. According to another embodiment of the invention, the act of receiving, from the user, the proposed change to the data center configuration includes an act of receiving information regarding at least one element of data center equipment represented in the interactive representation.

According to one embodiment of the present invention, the act of receiving, from the user, the proposed change to the data center configuration includes an act of scanning a barcode. According to another embodiment of the invention, the act of determining the at least one location includes an act of determining at least one location in near real-time. According to another embodiment of the invention, the act of determining the at least one location includes an act of receiving, from an external entity, data identifying at least one location in the data center for the at least one element of data center equipment having a plurality of data center resources. According to another embodiment of the invention, the act of determining the at least one location includes an act of determining a location that minimizes, relative to at least one other location, an amount of excess data center resource capacity that is unusable due to insufficient associated capacity of at least one other data center resource, and the method further comprises providing the at least one location to an external entity. According to another embodiment of the invention, the act of providing the at least one location further includes an act of presenting the at least one location to a user of a computer system. According to another embodiment of the invention, the act of determining the at least one location includes an act of determining a series of locations arranged consecutively according to an amount of excess data center resource capacity that is unusable due to insufficient associated capacity of at least one other data center resource and the method further comprises providing the series of locations to an external entity.

According to one embodiment of the present invention, the act of providing the at least one location includes an act of presenting the series to a user of a computer system. According to another embodiment of the invention, the method further comprises an act of presenting, to the user, information regarding the proposed change to the data center configuration, the information including a representation of at least one element of data center equipment that is disposed in a rack. According to another embodiment of the invention, the act of presenting, to the user, the information regarding the proposed change to the data center configuration includes an act of presenting, to the user, a representation of the at least one element of data center equipment as placed in inactive storage, and the method further includes an act of recording the at least one element of data center equipment as placed in inactive storage. According to another embodiment of the invention, the act of presenting, to the user, the information regarding the proposed change to the data center configuration includes an act of presenting, to the user, an interactive representation that is updated based on the proposed change. According to another embodiment of the invention, the act of presenting, to the user, the interactive representation that is updated based on the proposed change includes an act of presenting, to the user, the interactive representation updated in near real-time. According to another embodiment of the invention, the method further comprises generating a work order identifying a set of tasks required to complete the proposed change, and presenting the set of tasks via an output of a computer system. According to another embodiment of the invention, the method further comprises acts of detecting a change in the power demanded at power distribution device associated with the work order, and recording the work order as completed based on the change in power demanded. According to another embodiment of the invention, the method is performed using a remote computing device.

According to one aspect of the present invention, a computer-implemented method for managing a data center configuration is provided. The method comprises acts of receiving at least one policy identifying at least one characteristic of a data center resource as provided to at least one element of data center equipment, receiving a proposed change to the data center configuration, and determining a compliance result that indicates whether the data center configuration, including the proposed change, complies with the at least one policy. According to one embodiment of the present invention, the act of receiving the at least one policy includes an act of receiving at least one policy identifying a redundancy level. According to another embodiment of the invention, the act of receiving the at least one policy includes an act of receiving at least one policy identifying a runtime requirement. According to another embodiment of the invention, the act of receiving the at least one policy includes an act of receiving at least one policy identifying a security requirement. According to another embodiment of the invention, the act of receiving the at least one policy includes an act of receiving at least one policy identifying a requirement of cooling. According to another embodiment of the invention, the act of receiving the at least one policy includes an act of receiving at least one policy identifying a requirement of network connectivity. According to another embodiment of the invention, the act of receiving the at least one policy includes an act of receiving at least one policy identifying a requirement of power. According to another embodiment of the invention, the act of receiving the at least one policy identifying a requirement of power includes an act of receiving at least one policy identifying a requirement of power distribution.

According to one aspect of the present invention, a computer-implemented method for designing a data center is provided. The method comprises acts of receiving at least one policy identifying at least one characteristic of a data center resource as provided to at least one element of data center equipment, receiving data identifying at least one location in the data center for at least one element of data center equipment, the at least one location having a plurality of data center resources and the at least one element of data center equipment having a plurality of data center resource requirements, and determining at least one element of data center equipment that satisfies the policy when located at the at least one location, wherein the plurality of data center resources of the at least one location satisfy the plurality of data center resource requirements of the at least one element of data center equipment.

According to one aspect of the present invention, a system for managing a data center configuration comprising an input configured to receive, from a user, a proposed change to the data center configuration though an interactive representation of a layout of an identified space in a data center, an output configured to provide a set of tasks to a user, and a controller coupled to the input and the output and configured to generate a work order identifying the set of tasks required to complete the proposed change and to provide the set of tasks to the output. According to one embodiment of the present invention, the system further comprises a computer readable medium coupled to the controller and wherein the input is further configured to receive status information associated with the work order and the controller is further configured to record the status information in the computer readable medium. According to another embodiment of the invention, the system further comprises an input configured to receive, from a user, status information associated with the work order and wherein the controller is further configured to provide the status information to the output.

According to one aspect of the present invention, a system for managing a data center configuration comprises a first input configured to receive at least one policy identifying at least one characteristic of a data center resource as provided to at least one element of data center equipment, a second input configured to receive a proposed change to the data center configuration, and a controller coupled to the first and second inputs and configured to determine a compliance result that indicates whether the data center configuration, including the proposed change, complies with the at least one policy.

According to one aspect of the present invention, a system for designing a data center is provided. The system comprises an first input configured to receive at least one policy identifying at least one characteristic of a data center resource as provided to at least one element of data center equipment, a second input configured to receive data identifying at least one location in the data center for at least one element of data center equipment, the at least one location having a plurality of data center resources and the at least one element of data center equipment having a plurality of data center resource requirements, and a controller coupled to the first and second inputs and configured to determine at least one element of data center equipment that satisfies the policy when located at the at least one location, wherein the plurality of data center resources of the at least one location satisfy the plurality of data center resource requirements of the at least one element of data center equipment.

According to one aspect of the present invention, a remote computing device for navigating a representation of a data center is provided. The remote computing device comprises an interface configured to present, to a user, an interactive representation of a layout of an identified space in a data center and to receive, from the user, an identifier of at least one element of data center equipment located in the data center, a memory configured to store information regarding data center equipment represented by the interface, and a controller coupled to the interface and memory and configured to retrieve information regarding the identified at least one element of data center equipment from the memory and provide the information to the interface.

According to one aspect of the present invention, a computer-implemented method for managing data center resource redundancy is provided. The method comprises acts of determining a redundancy level of a data center resource at a location in a rack, and providing the redundancy level of the data center resource. According to one embodiment of the present invention, the act of determining the redundancy level of the data center resource includes an act of determining a redundancy level of cooling. According to another embodiment of the invention, the act of determining the redundancy level of the data center resource includes an act of determining a redundancy level of network connectivity. According to another embodiment of the invention, the act of determining the redundancy level of the data center resource includes an act of determining a redundancy level of power. According to another embodiment of the invention, the act of determining the redundancy level of the data center resource includes an act of determining a redundancy level of power distribution. According to another embodiment of the invention, the act of determining the redundancy level of the data center resource at a location in a rack includes an act of determining a redundancy level of a data center resource at a U space position. According to another embodiment of the invention, the act of providing the redundancy level includes an act of presenting, to a user of a computer system, a representation of the at least one location in a rack. According to another embodiment of the invention, the act of presenting, to the user of the computer system, the representation of the at least one location in the rack includes an act of presenting, to a user of a computer system, a representation at least one U space position in a rack. According to another embodiment of the invention, the act of presenting, to the user of the computer system, the representation of the at least one location in the rack includes an act of presenting, to a user of a computer system, a representation of a redundancy relationship between elements disposed in a data center. According to another embodiment of the invention, the act of presenting, to the user of the computer system, a representation of a redundancy relationship between elements disposed in a data center includes an act of presenting, to a user of a computer system, a redundancy relationship between elements disposed in a rack.

According to one aspect of the present invention, a system for managing data center resource redundancy is provided. The system comprises a controller configured to determine the redundancy level of a data center resource at a location in a rack, and an output coupled to the controller and configured to provide a representation of the redundancy level of the data center resource. According to one embodiment of the present invention, the location in the rack includes a U space position in a rack. According to another embodiment of the invention, the system includes a remote computing device.

Further features and advantages of the present invention as well as the structure and operation of various embodiments of the present invention are described in detail below with reference to the accompanying drawings. In the drawings, like reference numerals indicate like or functionally similar elements. Additionally, the left-most one or two digits of a reference numeral identifies the drawing in which the reference numeral first appears.

BRIEF DESCRIPTION OF DRAWINGS

The accompanying drawings, are not intended to be drawn to scale. In the drawings, each identical or nearly identical component that is illustrated in various figures is represented by a like numeral. For purposes of clarity, not every component may be labeled in every drawing. In the drawings:

BRIEF DESCRIPTION OF DRAWINGS

Figure 1:
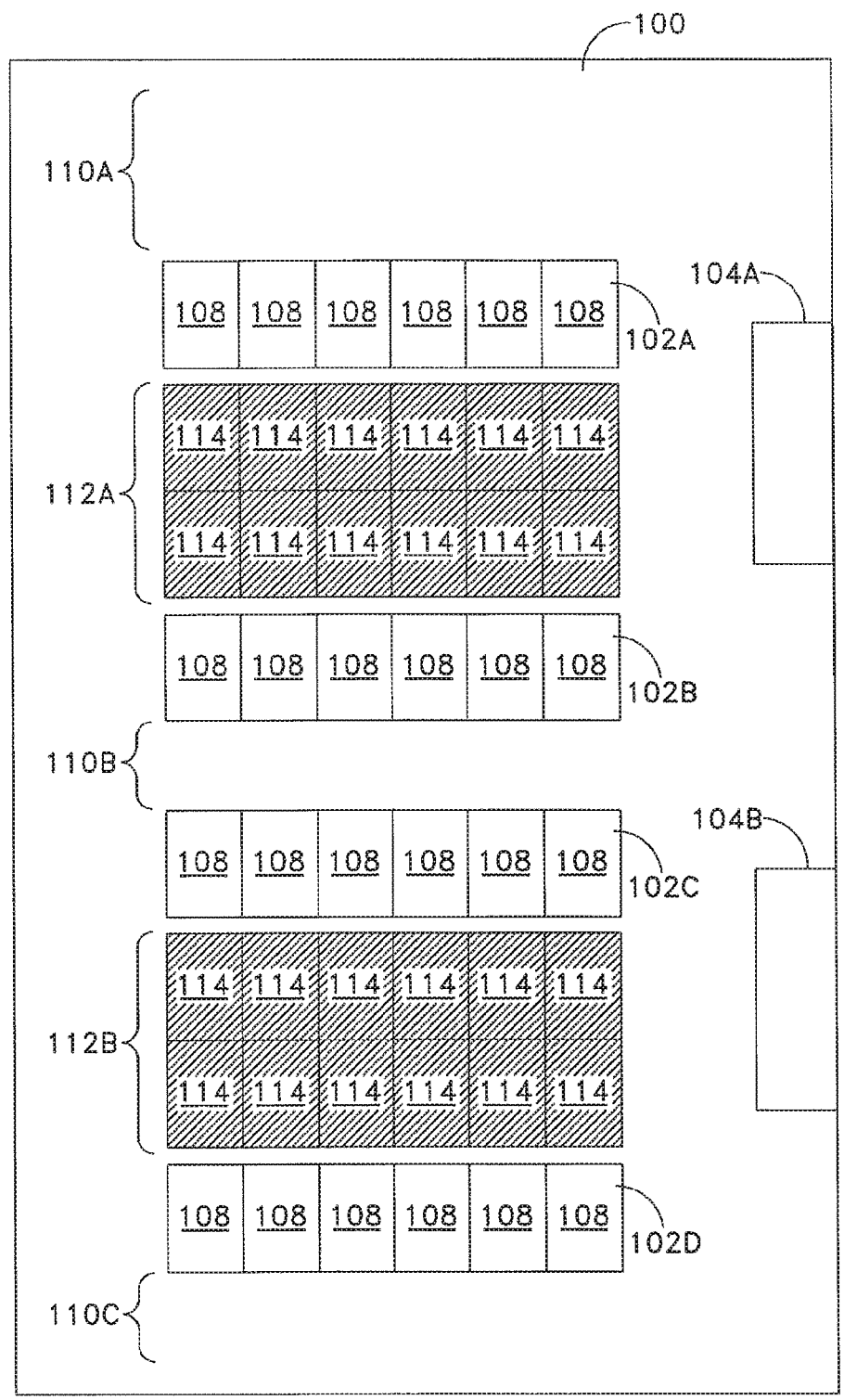
Figure 2:
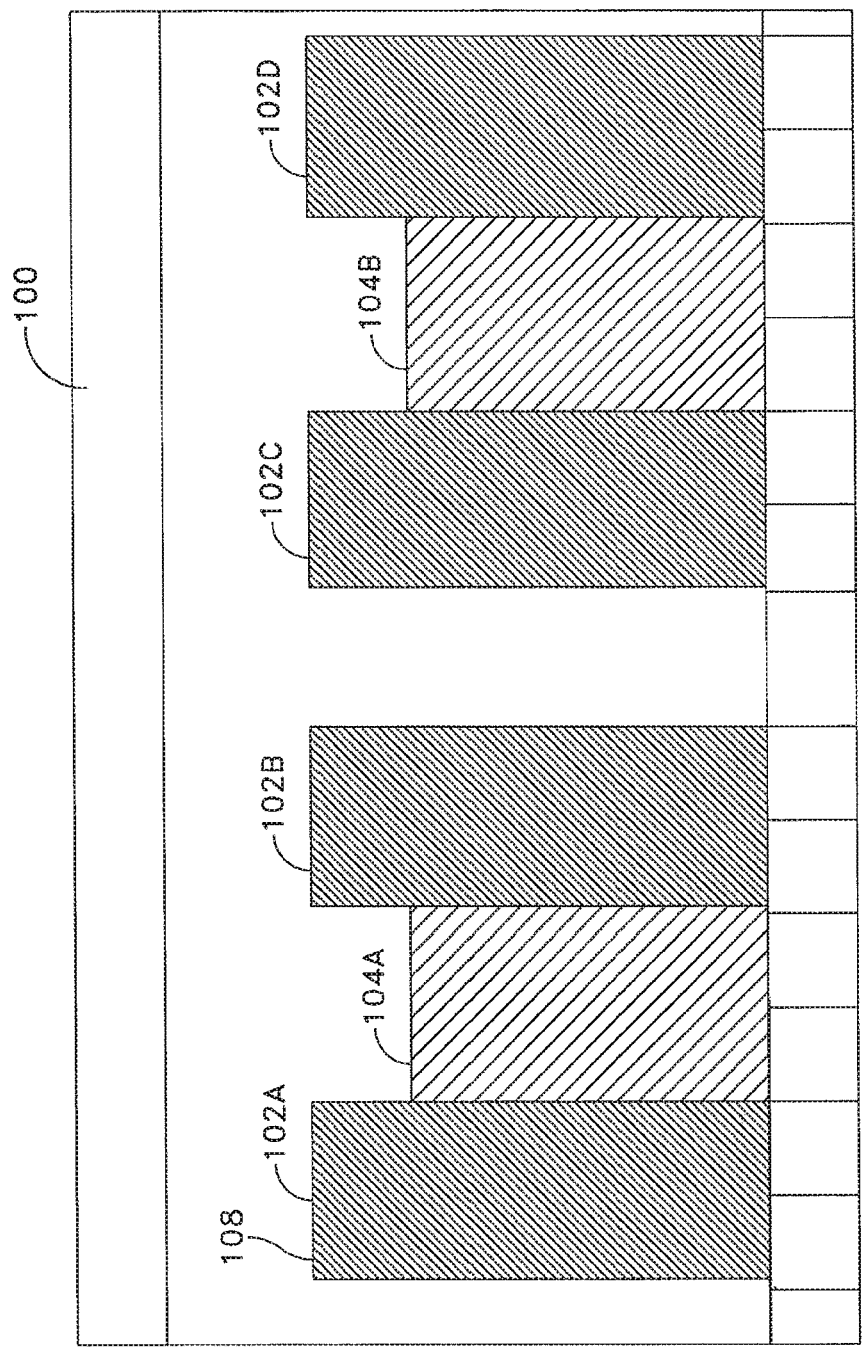

The accompanying drawings are not intended to be drawn to scale. In the drawings, each identical or nearly identical component that is illustrated in various figures is represented by a like numeral. For purposes of clarity, not every component may be labeled in every drawing. In the drawings:

FIG. 1 is a top view of a data center of the type with which embodiments of the present invention may be used;

FIG. 2 is a side view of the data center of FIG. 1.

Figure 3:
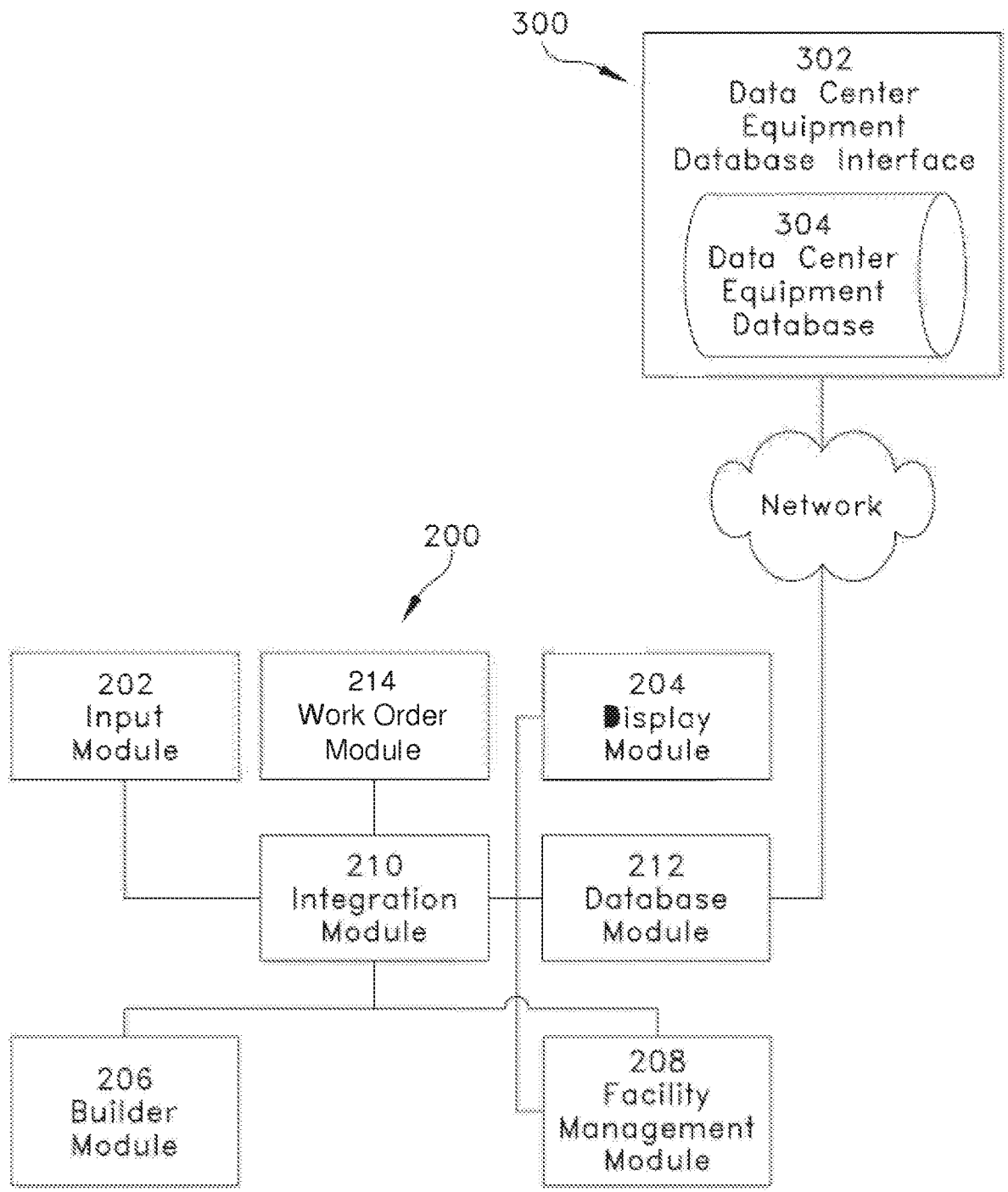
Figure 4:
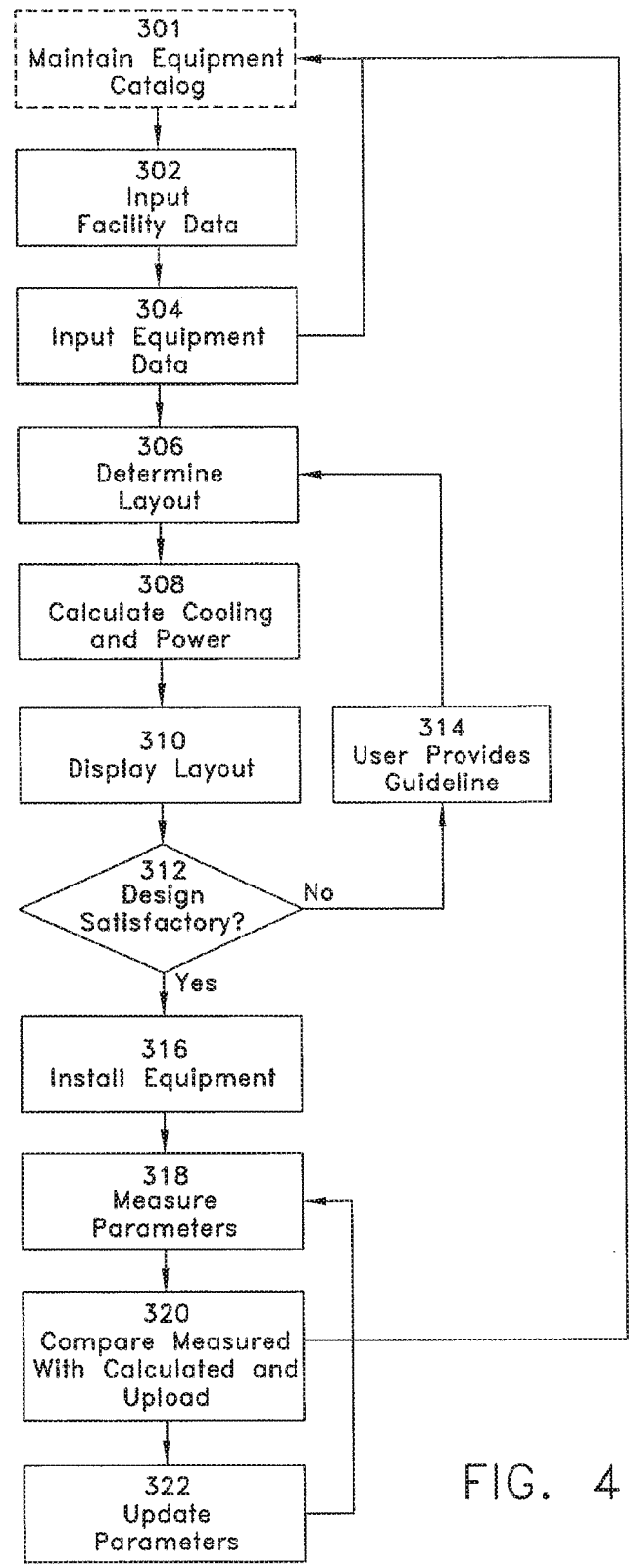
Figure 5:
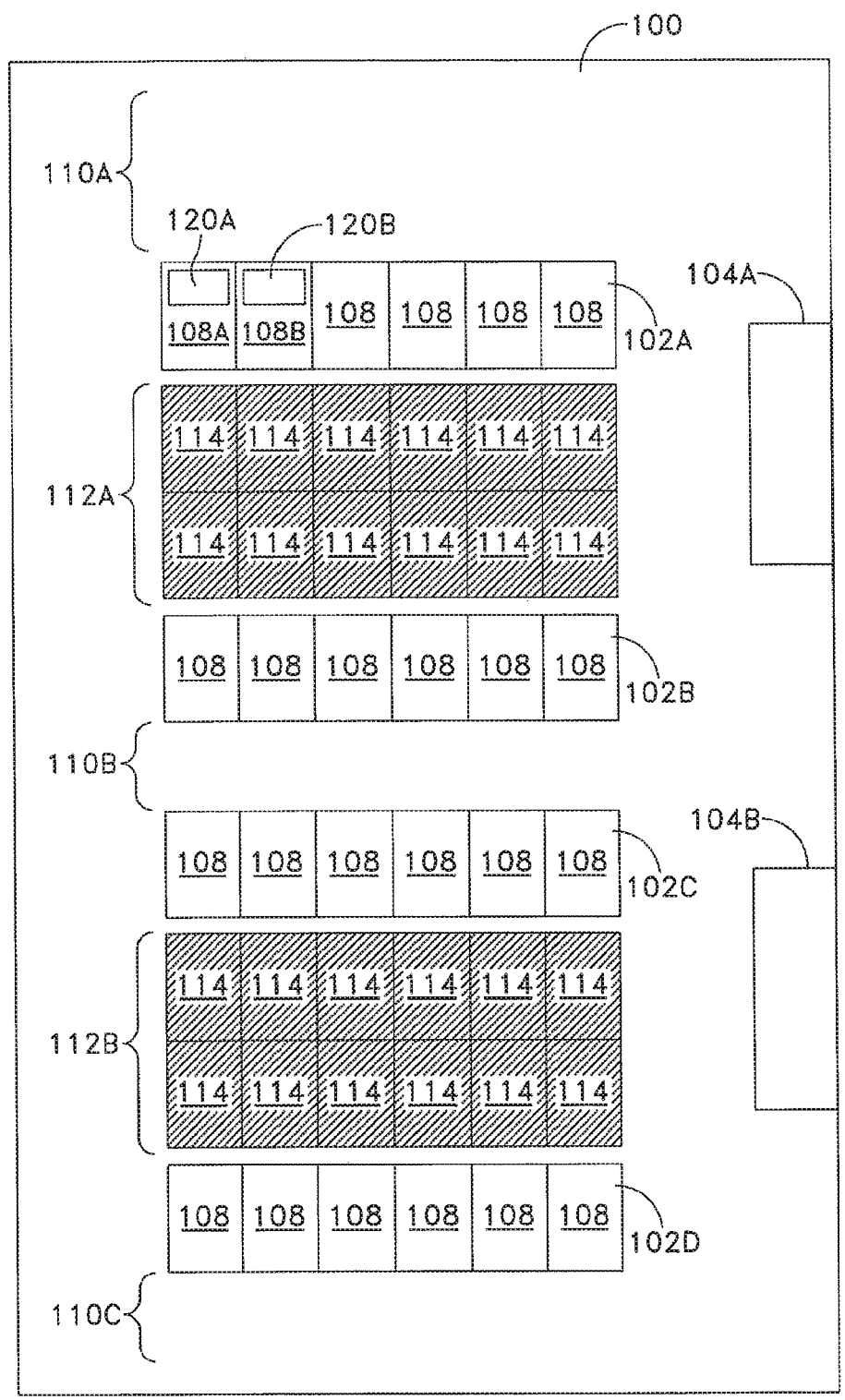
Figure 5A:
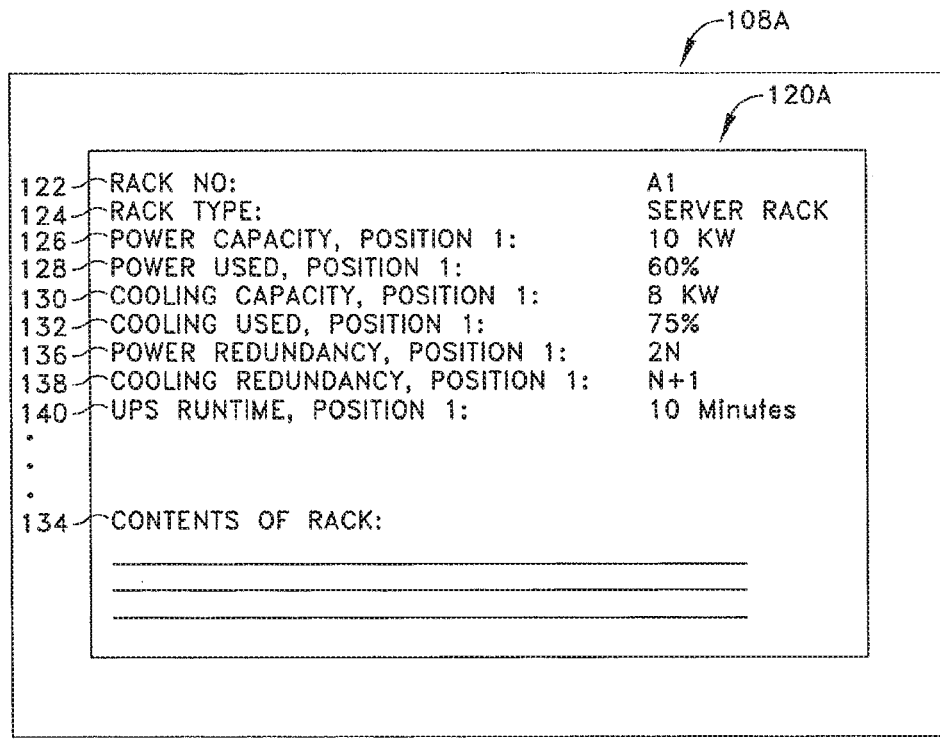
Figure 5B:
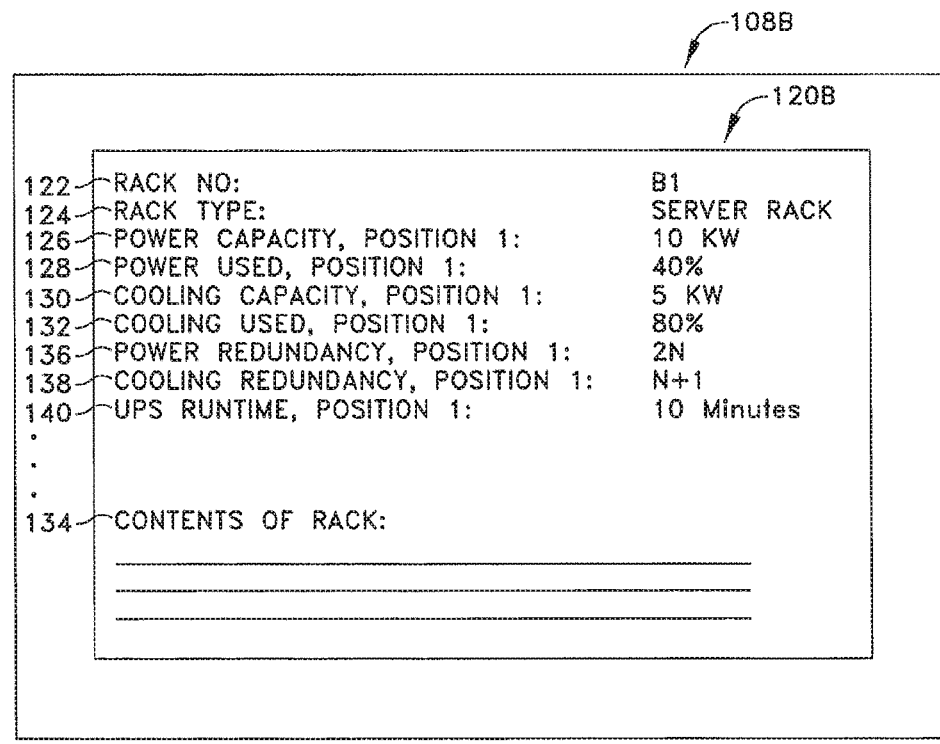
Figure 5C:
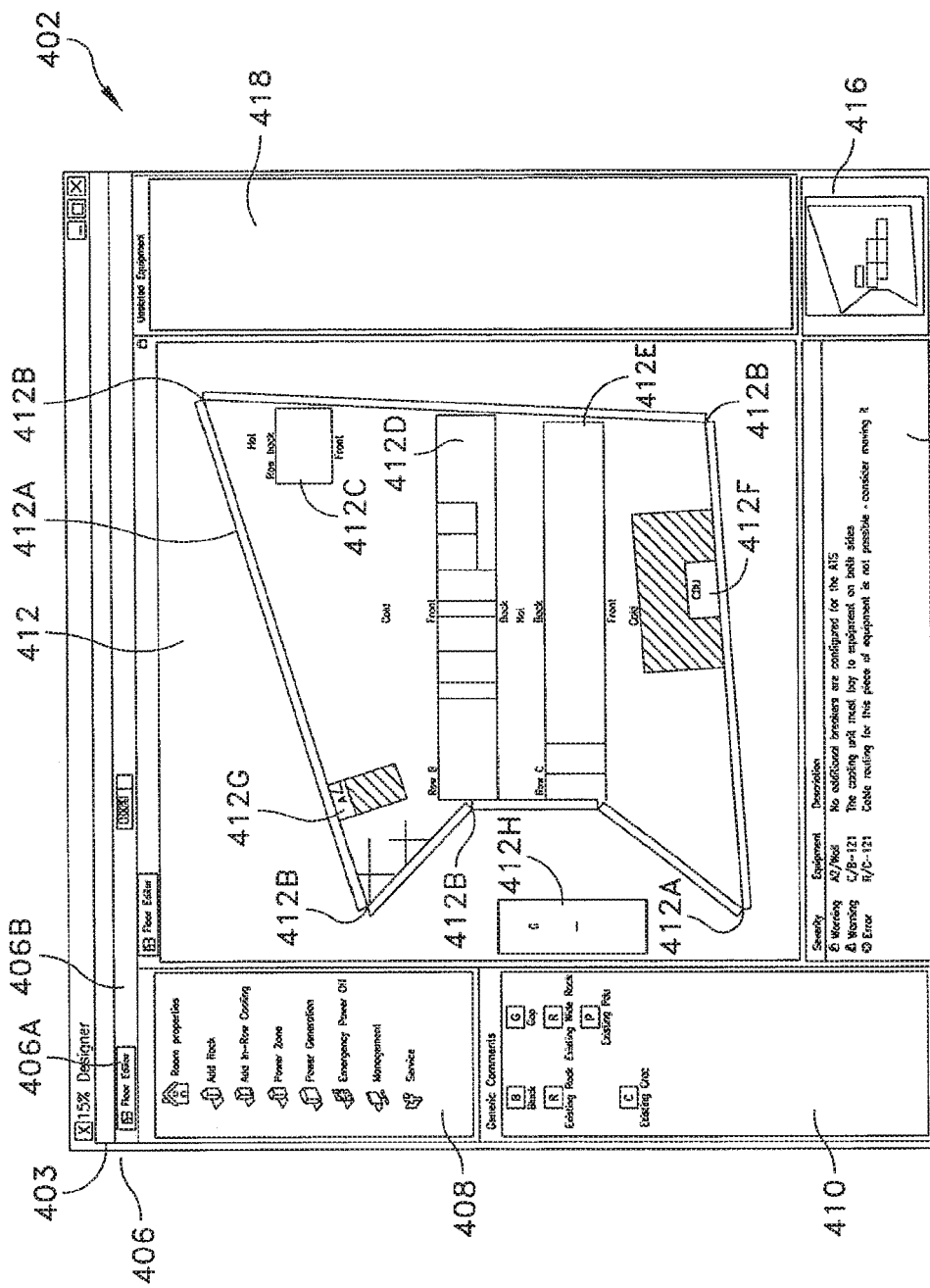
Figure 5D:
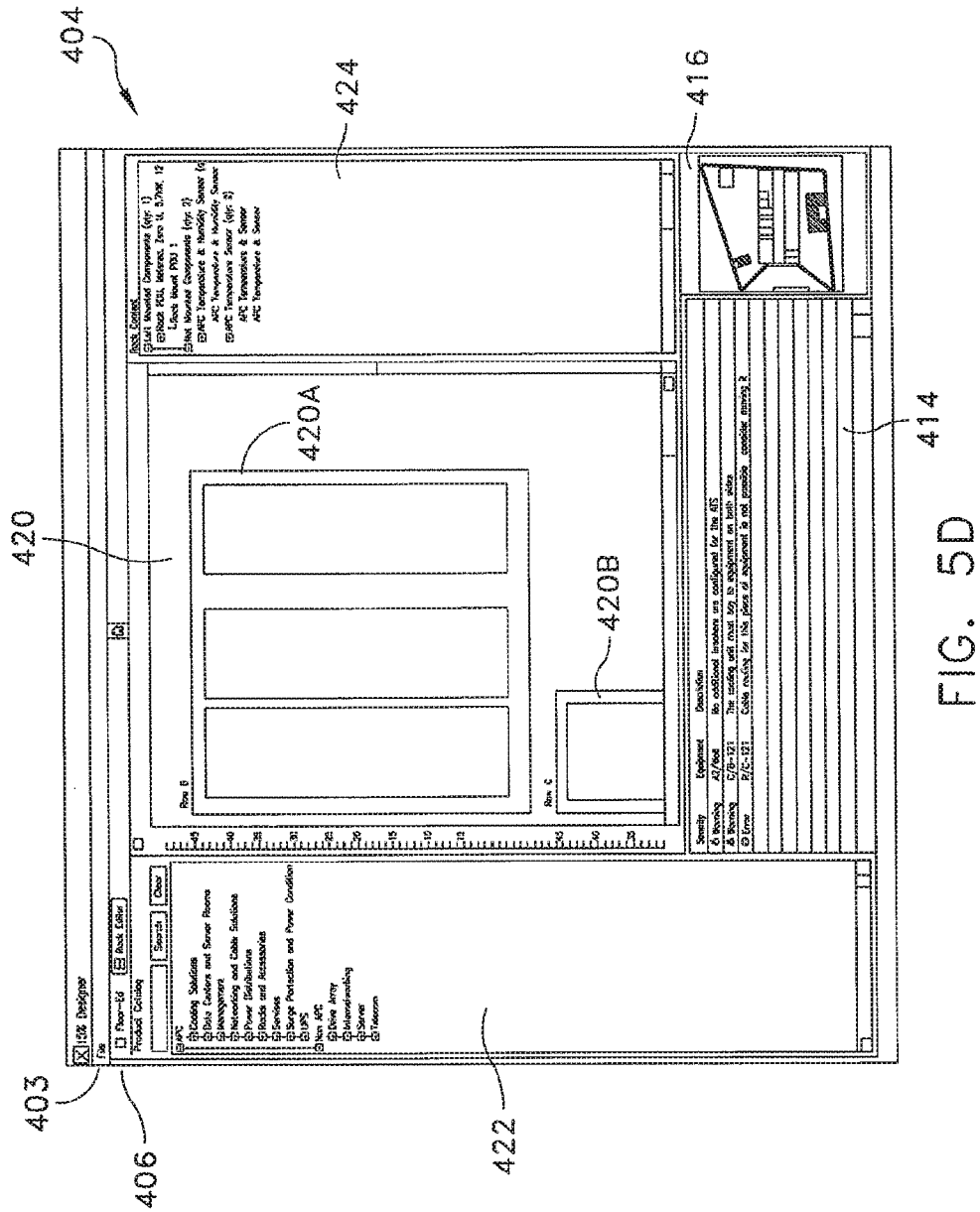
Figure 6:
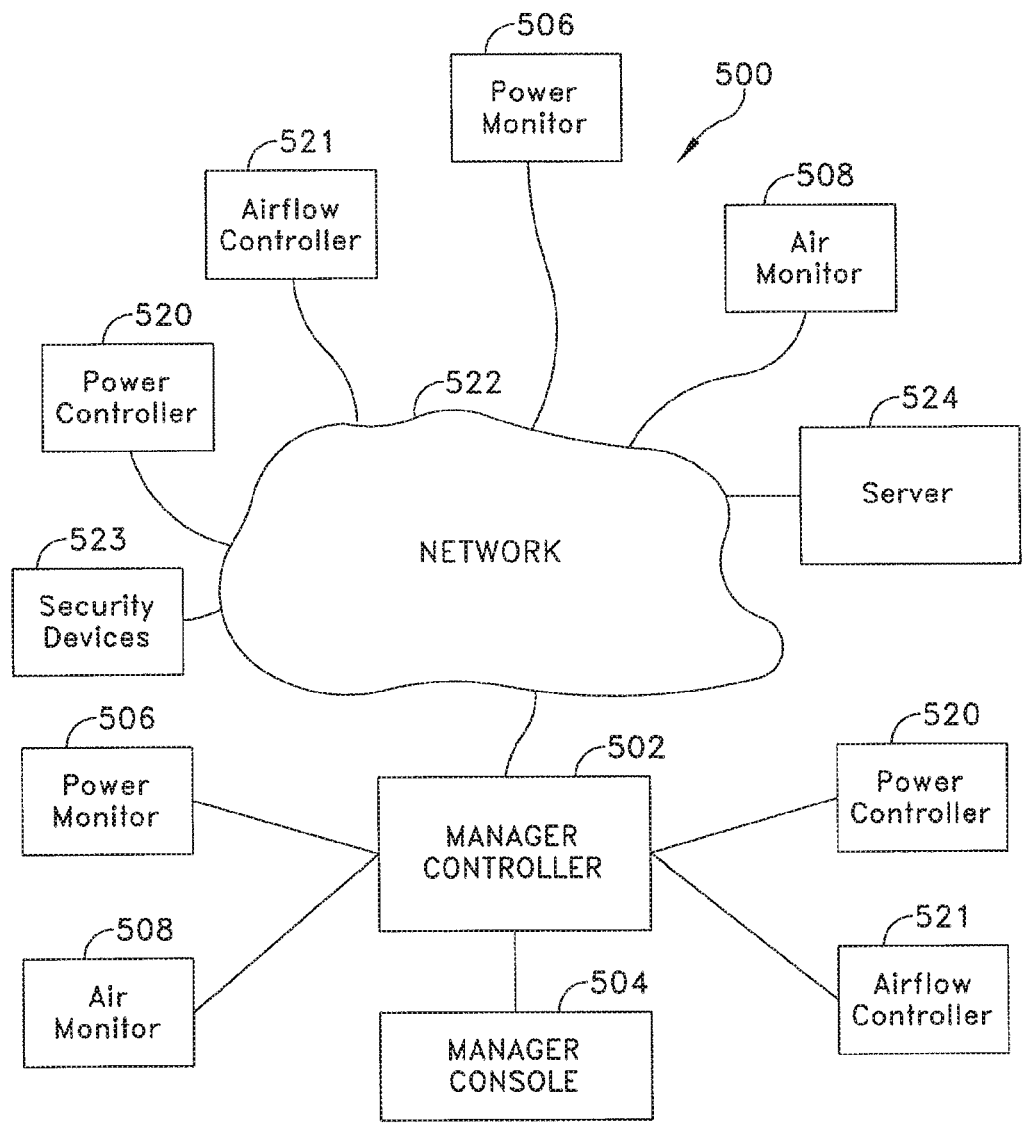
Figure 7:
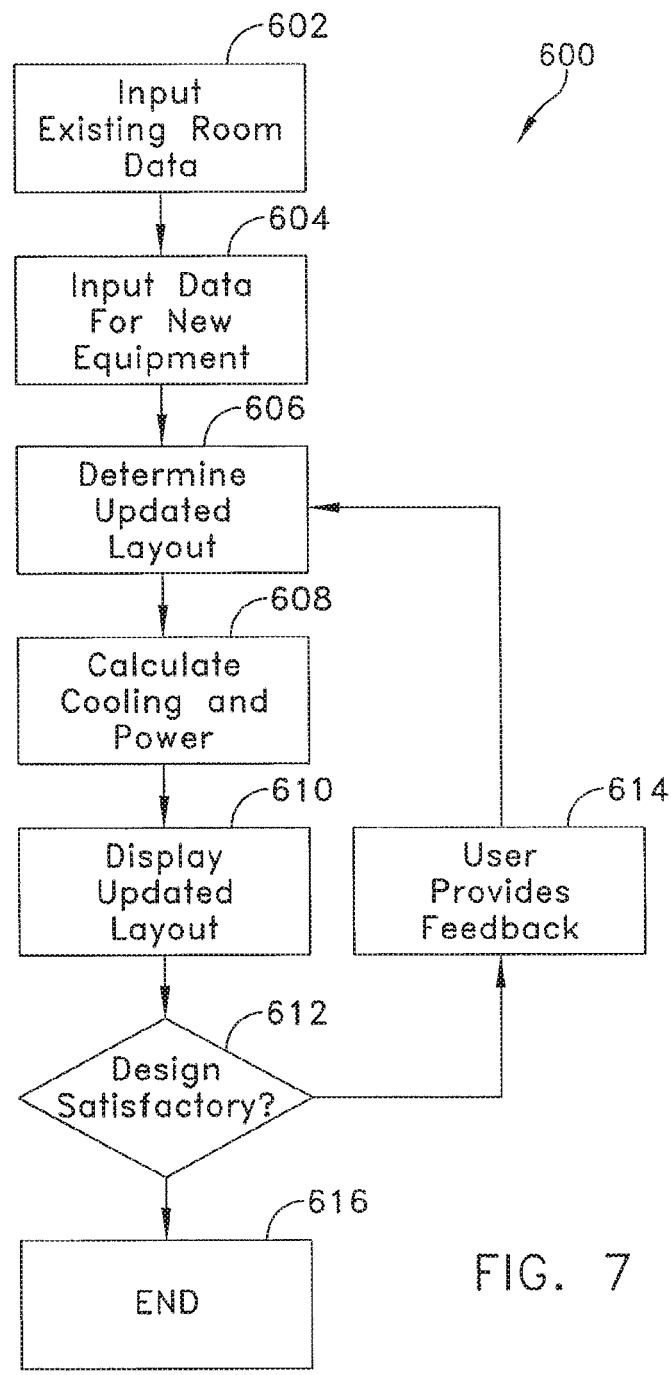
Figure 8:
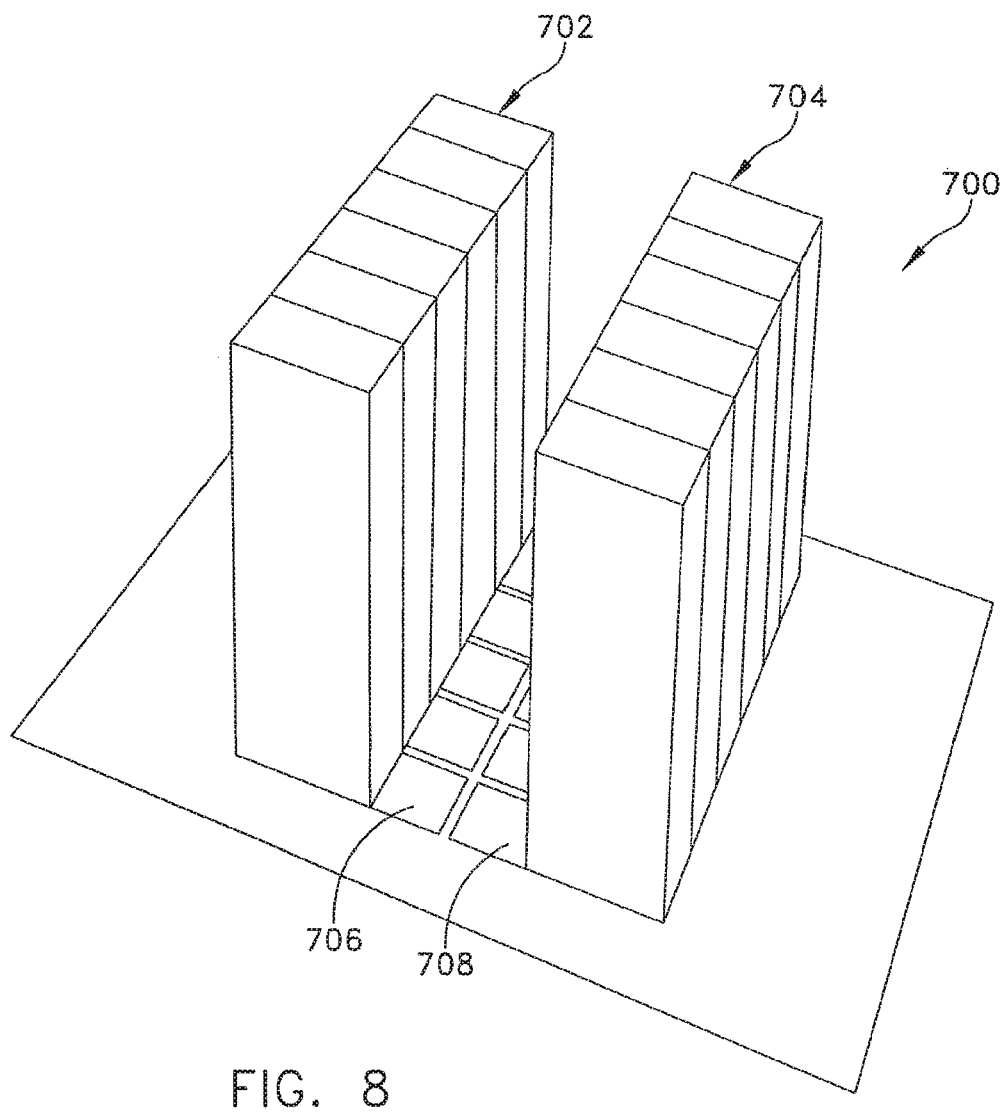
Figure 9:
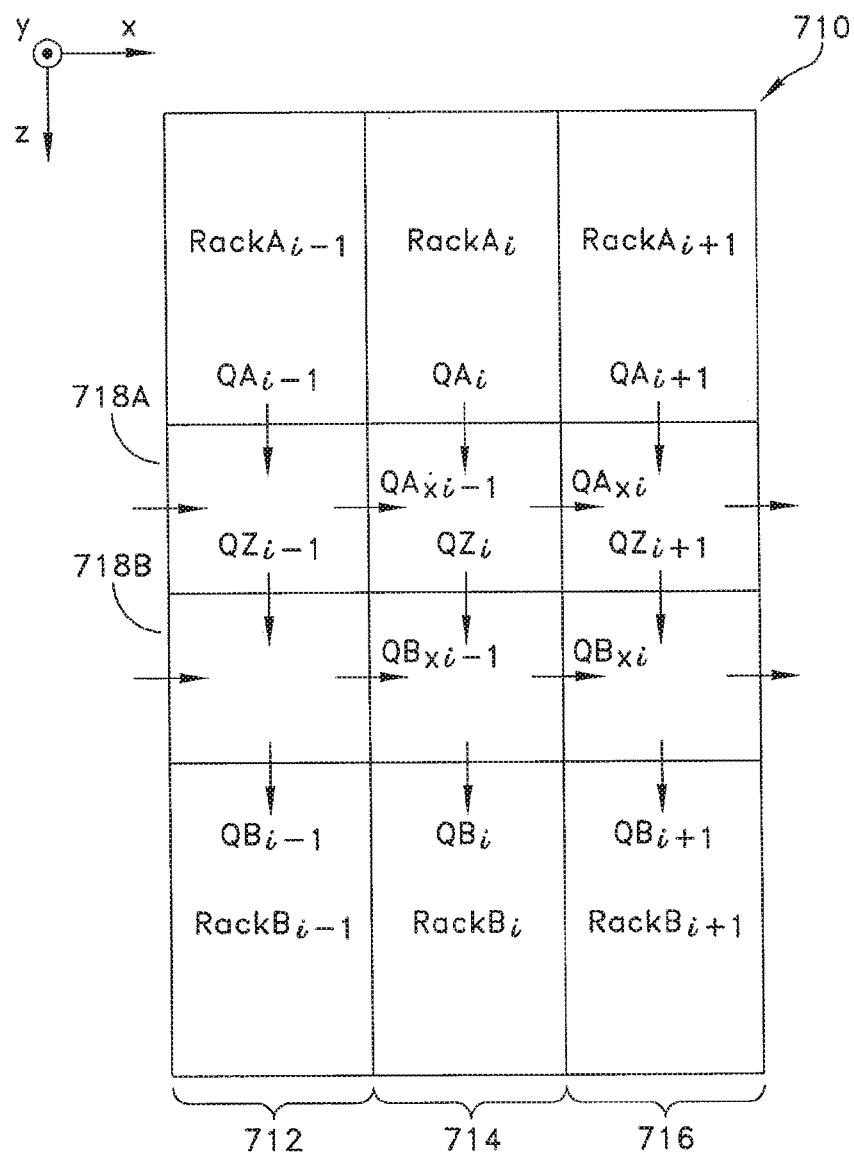
Figure 9A:
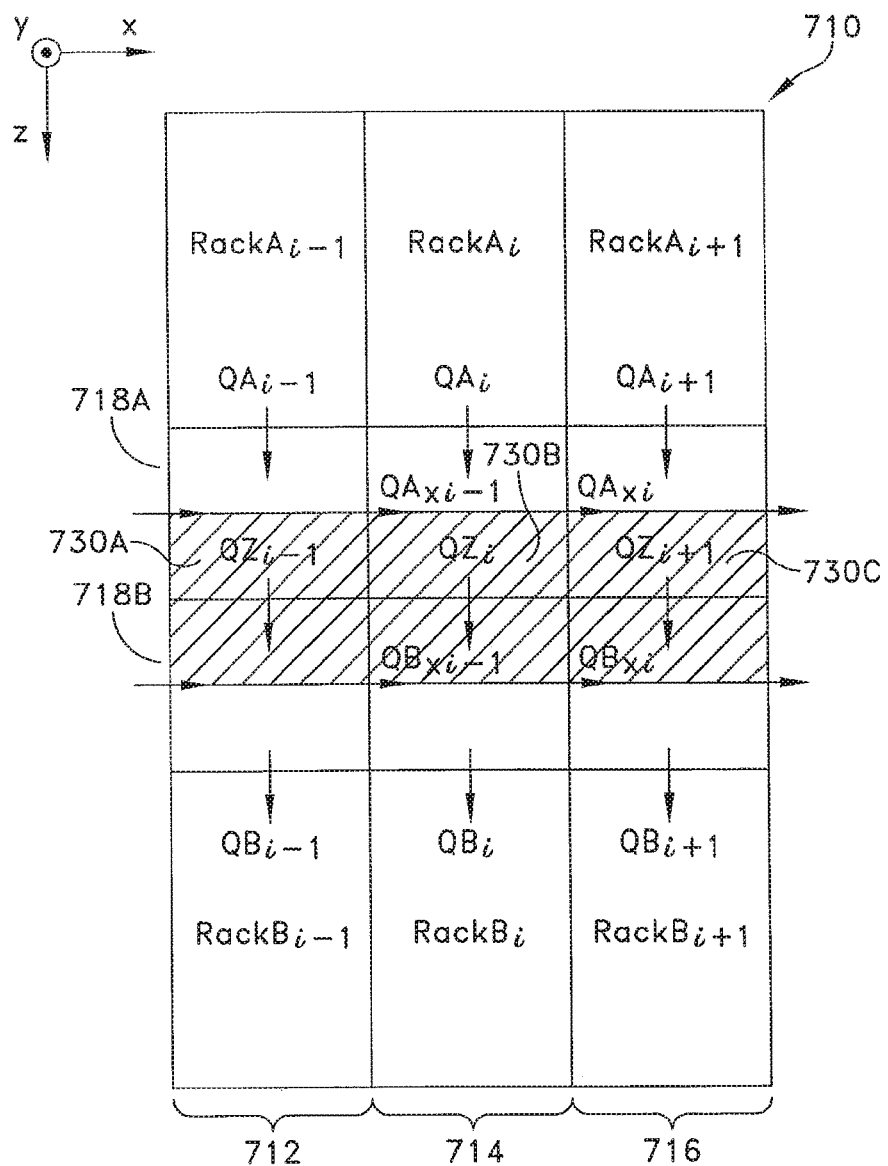
Figure 10:
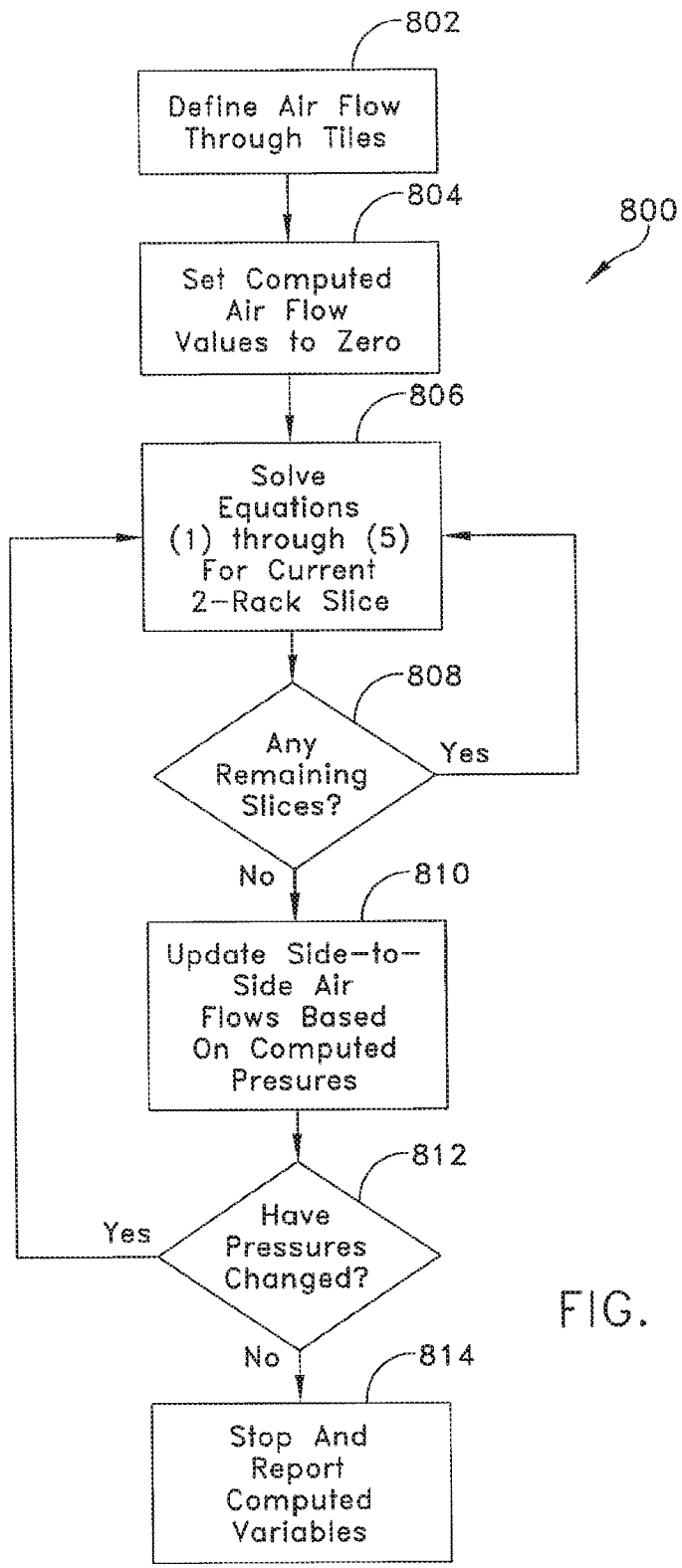
Figure 11:
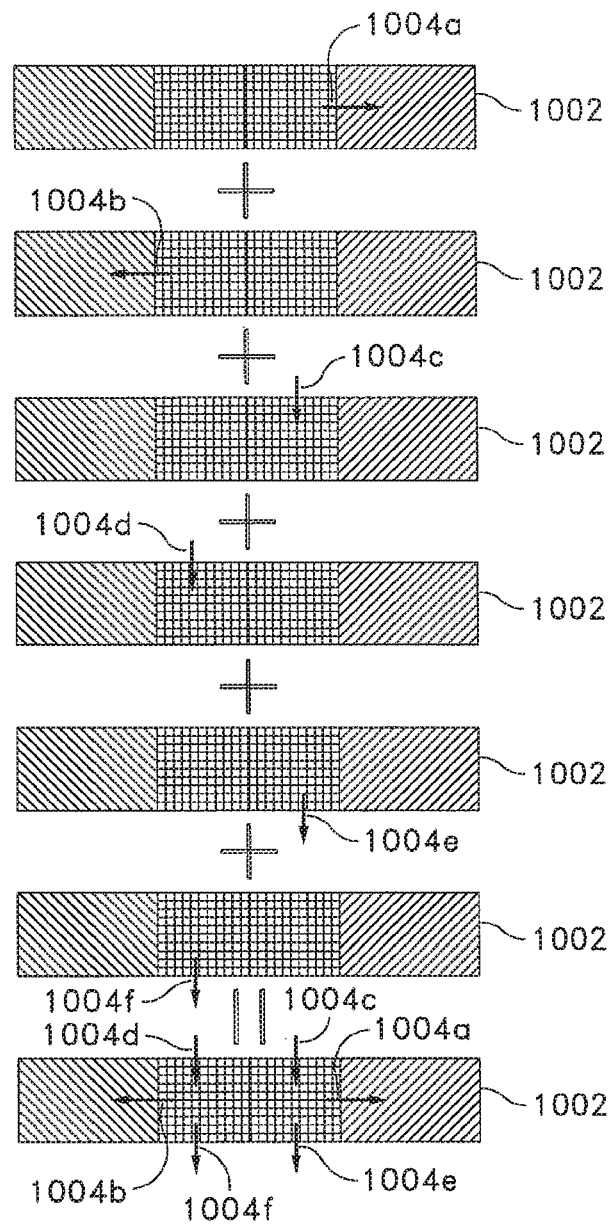
Figure 12:
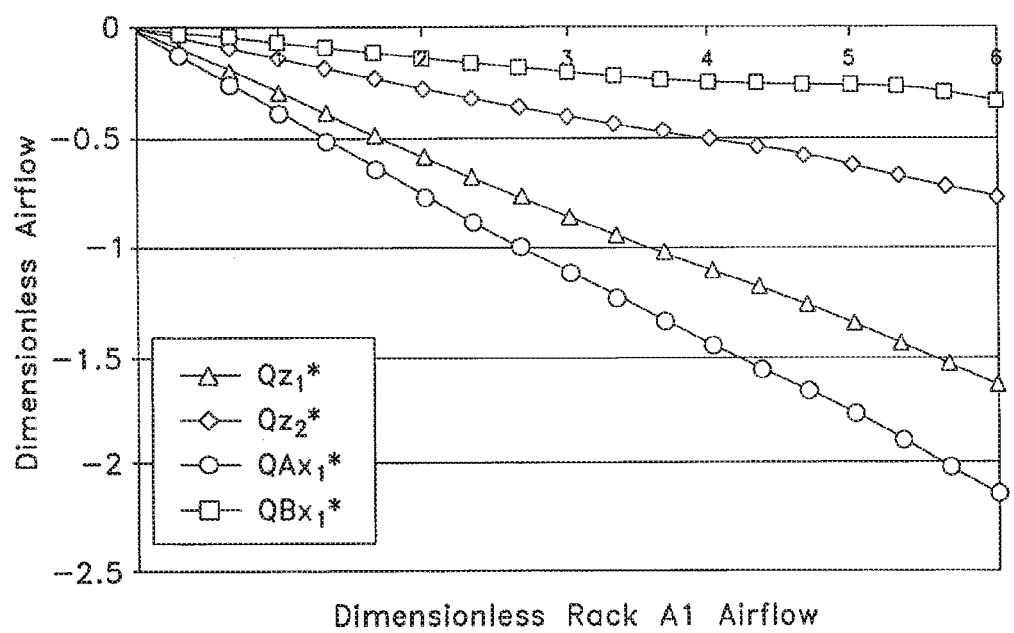
Figure 13:
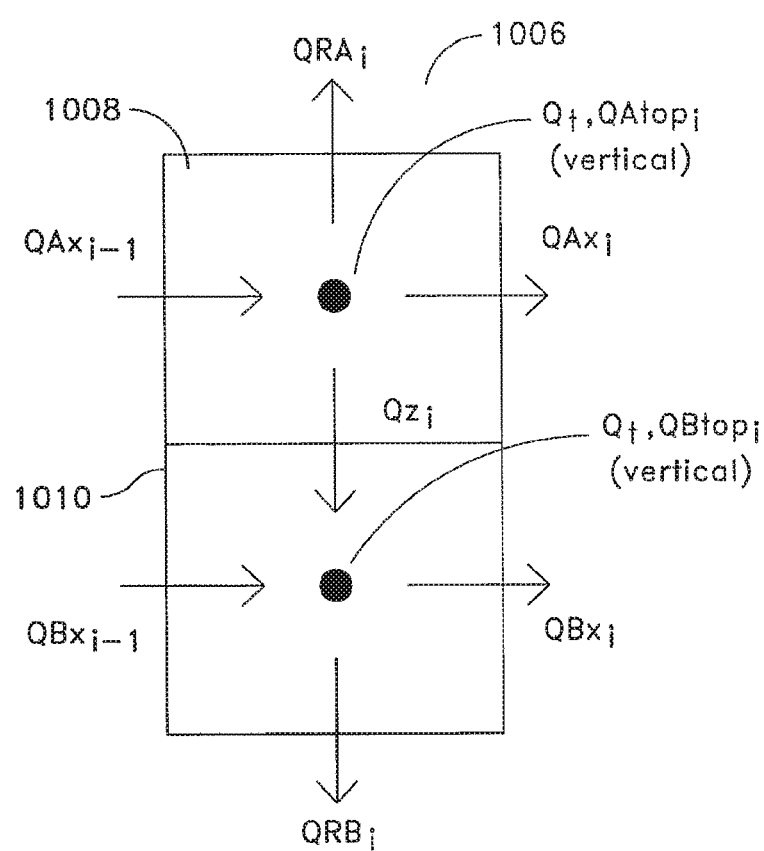
Figure 14:
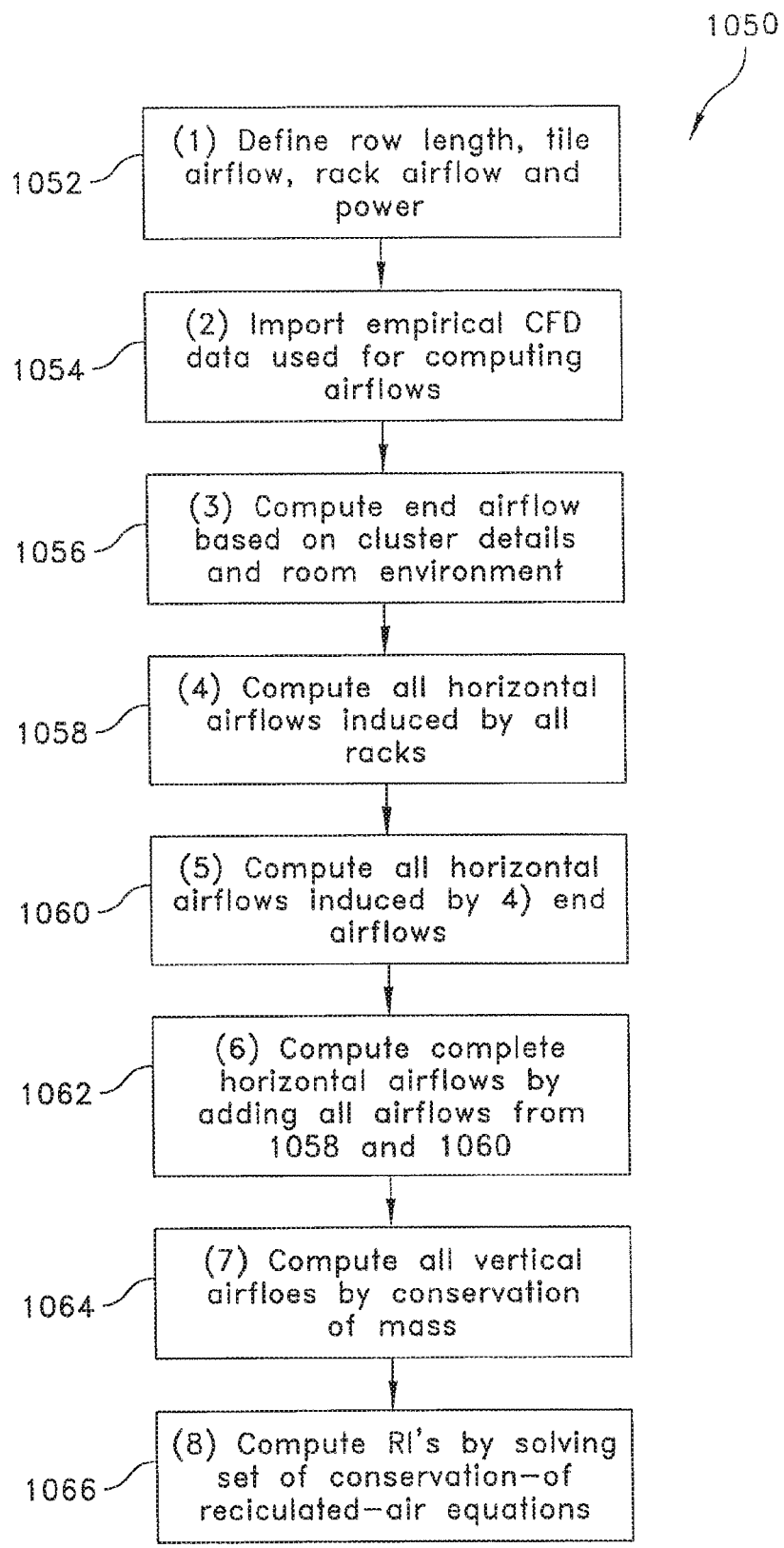
Figure 15:
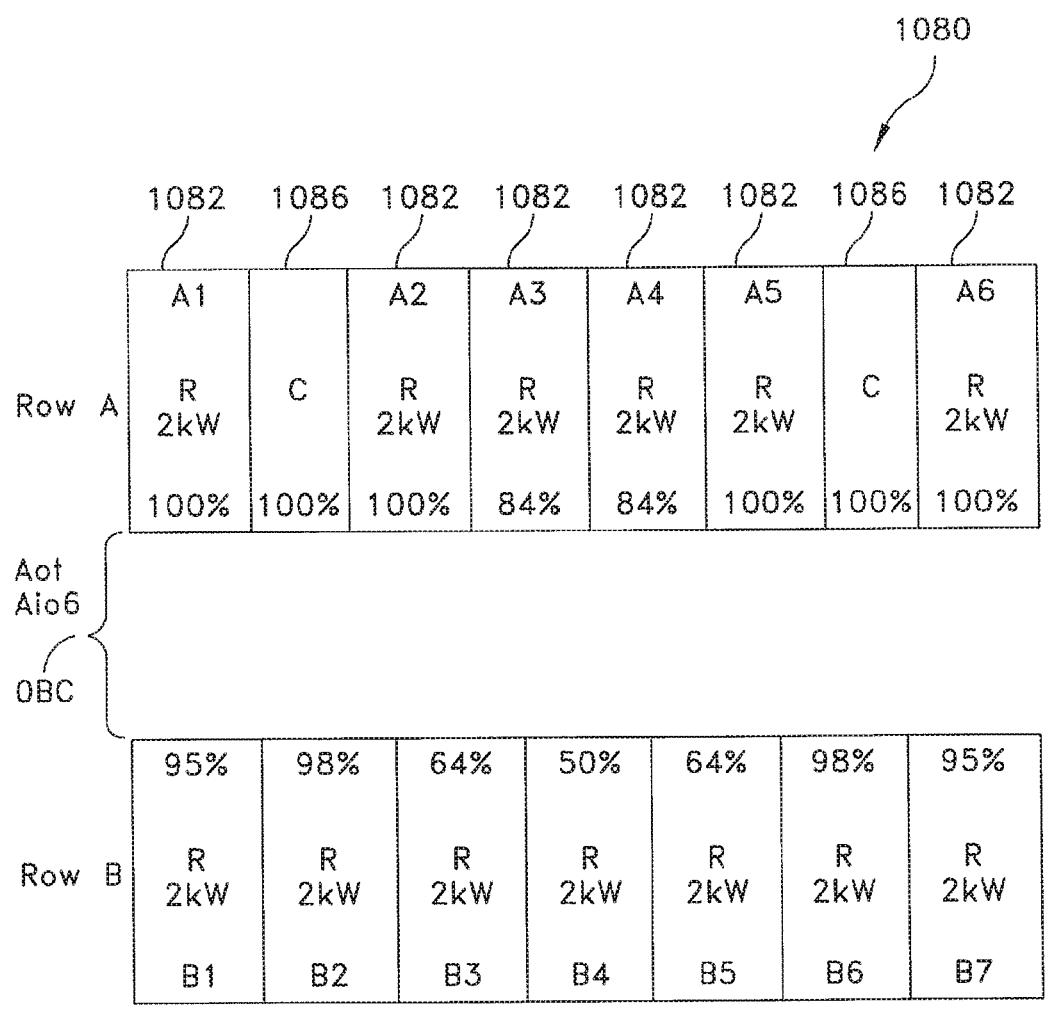
Figure 16:
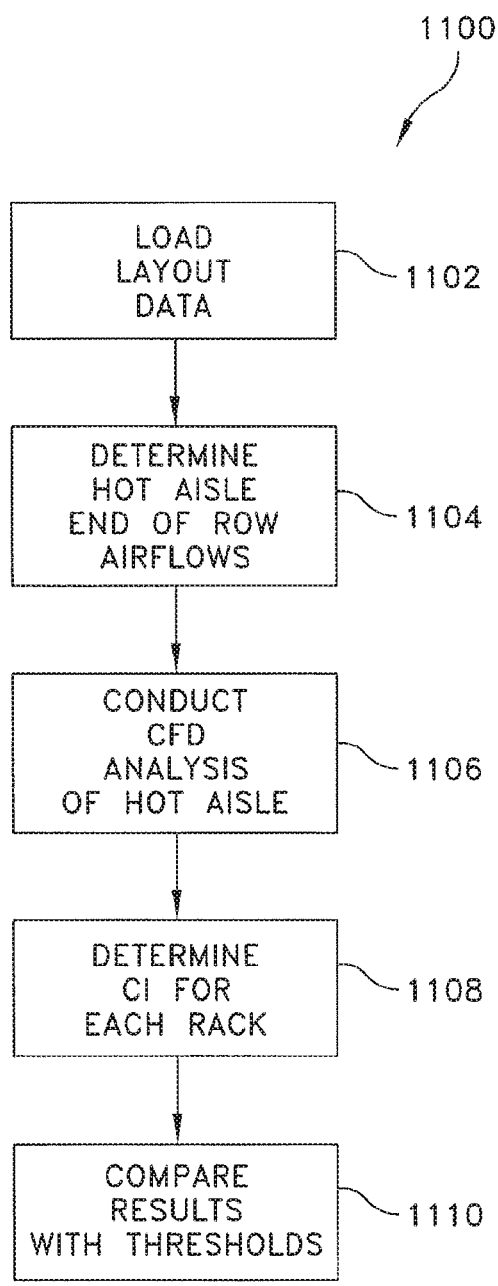
Figure 17:
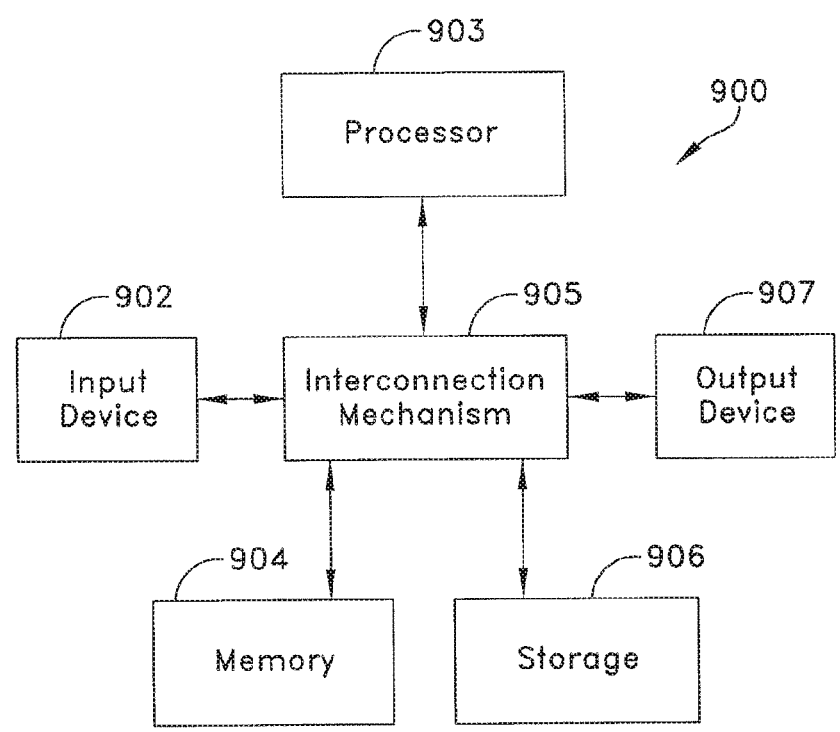
Figure 18:
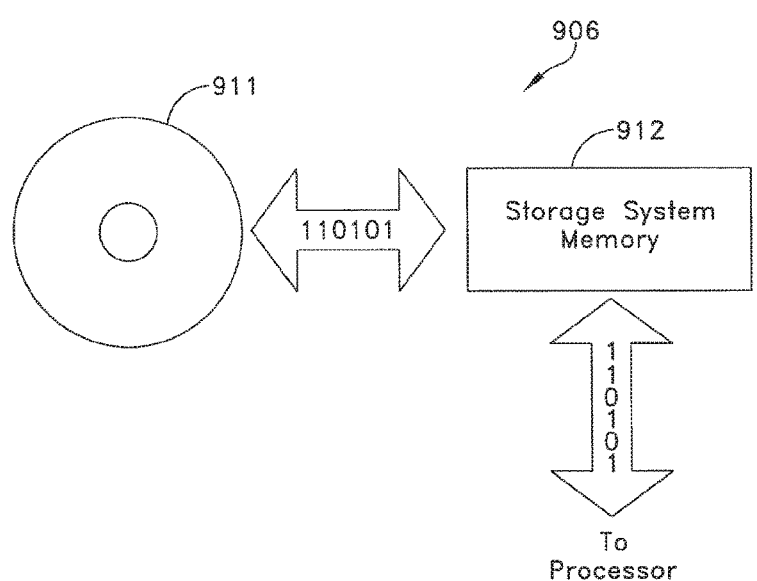
Figure 19:
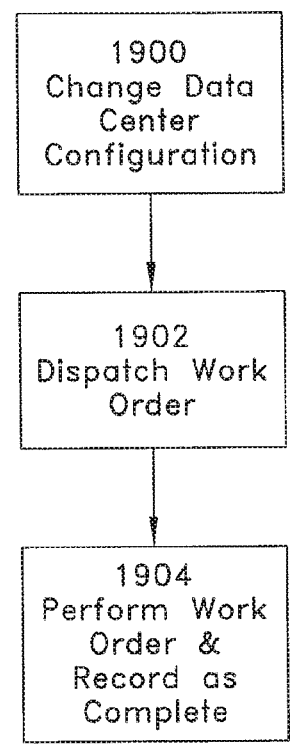
Figure 20:
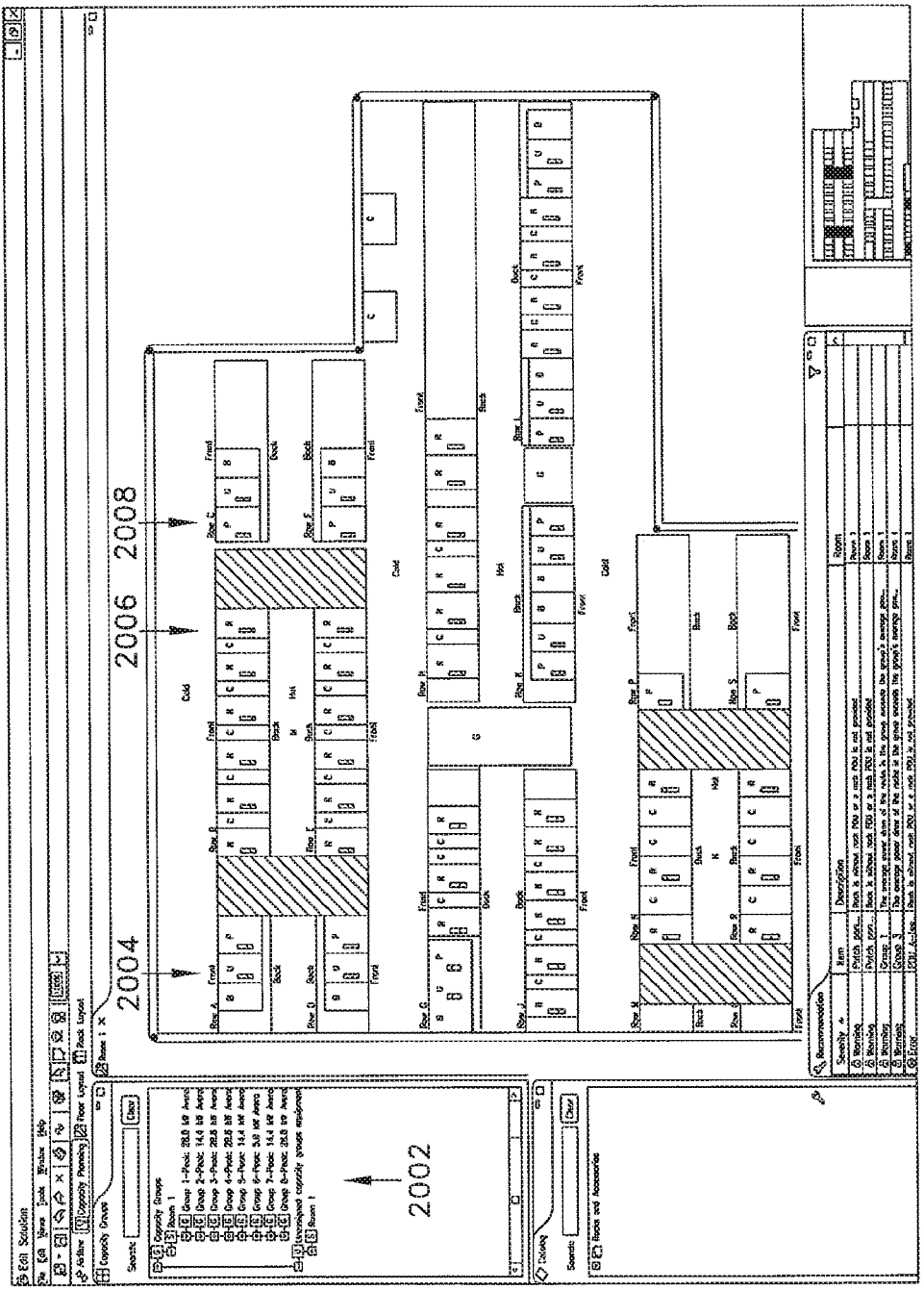
Figure 21:
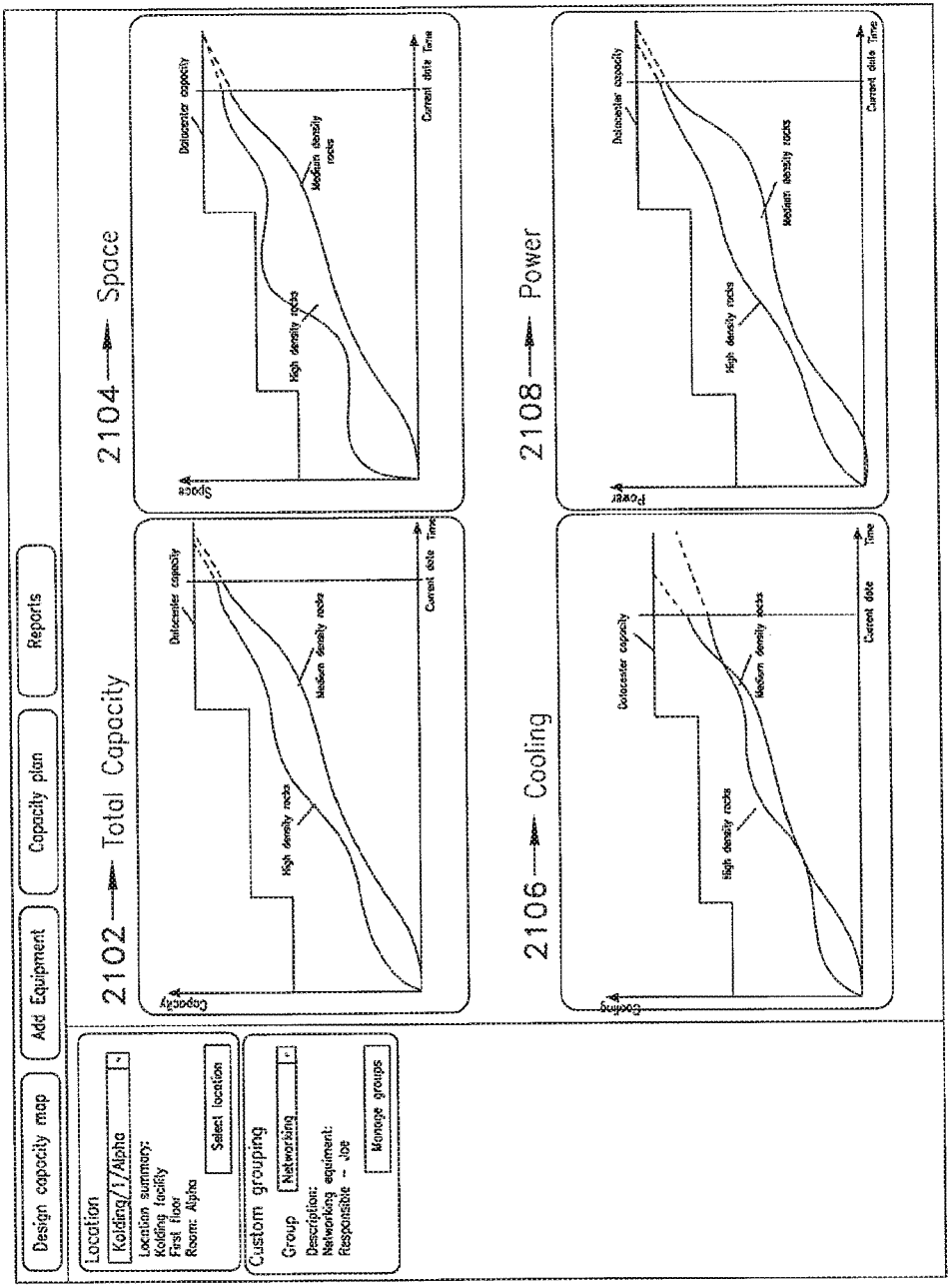
Figure 22:
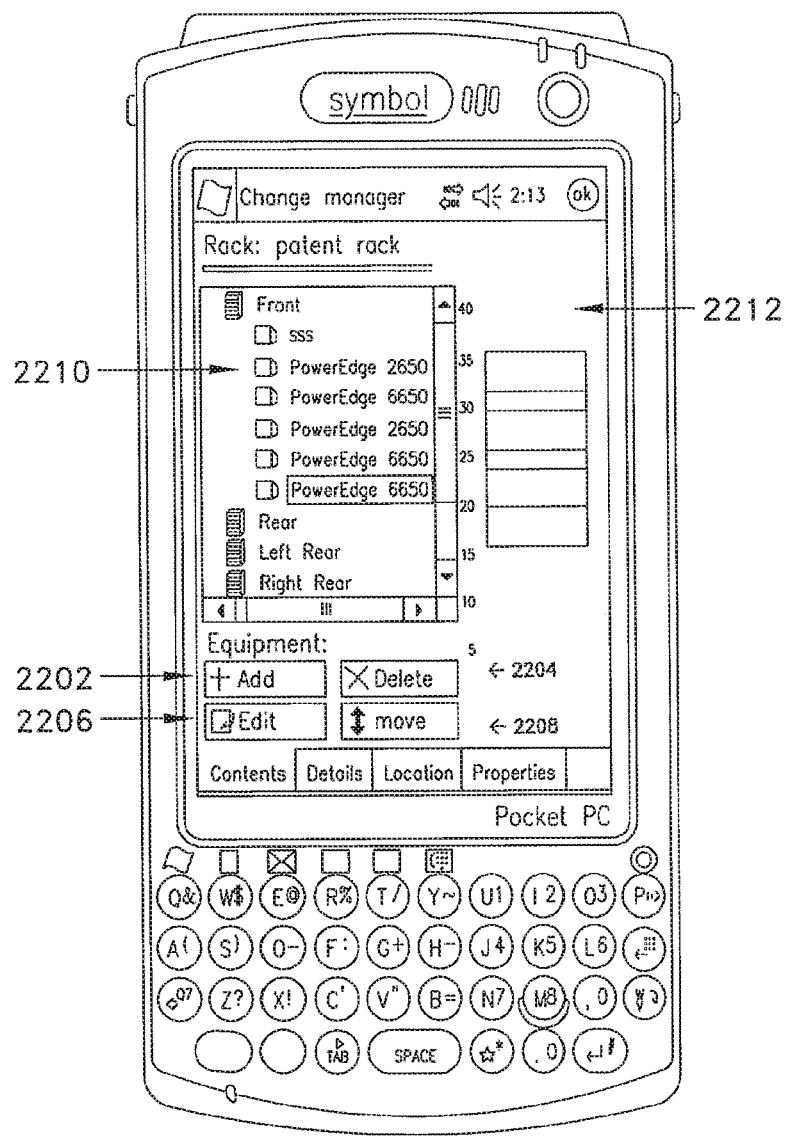

FIG. 3 is a functional block diagram of a system in accordance with one embodiment of the present invention;

FIG. 4 is a flowchart of a process that may be implemented using the system of FIG. 3 in accordance with one embodiment of the invention;

FIG. 5 is a diagram showing facility information that can be displayed using at least one embodiment of the invention;

FIGS. 5A and 5B are diagrams showing additional information that can be displayed using embodiments of the invention;

FIGS. 5C and 5D show graphical user interface screens that exhibit various aspects of the present invention;

FIG. 6 is a functional block diagram of a management system in accordance with one embodiment of the invention;

FIG. 7 is a flow chart of a management process in accordance with one embodiment of the invention;

FIG. 8 shows a perspective view of a cluster of racks whose cooling performance can be analyzed using embodiments of the invention;

FIG. 9 shows a top view of a cluster of racks whose cooling performance can be analyzed using a control volume analysis technique of at least one embodiment;

FIG. 9A shows the cluster of racks of FIG. 9 along with staggered control volumes that may be used in the control volume analysis technique;

FIG. 10 is a flow chart of a control volume analysis technique in accordance with one embodiment of the invention;

FIG. 11 is a diagram demonstrating a principle of superposition used in one embodiment;

FIG. 12 is a graph used in determining airflows in one embodiment;

FIG. 13 is a diagram identifying airflows used with one analysis method of one embodiment;

FIG. 14 is a flow chart of a process for determining a recirculation index in one embodiment;

FIG. 15 is a schematic diagram showing a layout of equipment racks used in an analysis in one embodiment to determine a capture index;

FIG. 16 is a flowchart of a process for determining a capture index in accordance with one embodiment;

FIG. 17 is a functional block diagram of a computer system that may be used in embodiments of the invention;

FIG. 18 is a functional block diagram of a storage system that may be used with the computer system of FIG. 17;

FIG. 19 is a flowchart of a process that may be implemented using the system of FIG. 3 in accordance with one embodiment of the invention;

FIG. 20 shows graphical user interface screen that exhibits various aspects of the present invention;

FIG. 21 depicts another graphical user interface screens that exhibits various aspects of the present invention;

FIG. 22 illustrates another graphical user interface screen that exhibits various aspects of the present invention; and FIG. 23 shows a representation used to analyze stranded capacity according to an aspect of the present invention.

DETAILED DESCRIPTION

This invention is not limited in its application to the details of construction and the arrangement of components set forth in the following description or illustrated in the drawings. The invention is capable of other embodiments and of being practiced or of being carried out in various ways. Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

Embodiments of the present invention may be used to design, manage and retrofit a data center, such as data center 100 which is shown in FIGS. 1 and 2 with FIG. 1 showing a top view of the data center 100, and FIG. 2 showing a side view of the data center 100. As discussed further below, the design of the layout of the data center 100, including various data center resources such as power and cooling considerations may be performed using systems and processes of embodiments of the present invention. A data center resource may include, for example, any characteristic of a data center that supports and/or ensures data center equipment functionality. Examples of data center resources include power, cooling, physical space, weight support, remote equipment control capability, physical and logical security and physical and logical network connectivity. Power data center resources may include power distribution resources, such as transformers, PDUs and outlets, and power available for distribution, such as utility power supplied to the data center, power generated by an onsite generator and power supplied by UPSs. Physical space resources in a data center may include data center floor space and rack U space. Cooling resources in a data center may include cooling distribution capacity and cooling generation capacity. Physical security resources in a data center may include security cameras and door locks. Logical network connectivity resources in a data center may include Virtual Local Area Networks, Domain Name Services, and Dynamic Host Configuration Protocol Services. Physical network connectivity resources may include network cabling and patch panels. Remote equipment control capability resources in a data center may include Keyboard Video Mouse services.

Embodiments of the invention, however, are not limited for use with data centers like that shown in FIGS. 1 and 2 and may be used with other facilities that do not include raised floors and may be used with facilities that house equipment other than computing equipment, including telecommunications facilities and other facilities. Further, embodiments of the invention may be used with raised floor and equipment layouts that are not neatly arranged in the manner shown in FIGS. 1 and 2. Embodiments of the present invention may use systems, devices and methods described in U.S. patent application Ser. No. 10/038,106, filed Jan. 2, 2002, titled "Rack Power System and Method," incorporated herein in its entirety by reference.

The data center 100 includes rows of racks 102A, 102B, 102C and 102D, cooling units 104A and 104B, and a raised floor 106. Each of the rows includes racks 108, at least a number of which draw cool air from the front of the rack and return warm air to the rear or top or rear and top of the rack. Each rack may contain U space positions designed to house rack mounted data center equipment, such as, for example, servers, cooling equipment and network connectivity equipment.

As understood by those skilled in the art, to optimize cooling performance in a data center, rows of racks are often positioned to create alternating cold aisles and hot aisles. In the configuration shown in FIGS. 1 and 2, aisles 110A, 110B and 110C are hot aisles and aisles 112A and 112B are cold aisles. To provide cooling to the racks, in front of each of the racks in the cold aisle, perforated floor tiles 114 are used to provide cooling air from under the raised floor. In the data center 100, in addition to the perforated floor tiles shown, the raised floor may include solid floor tiles. The cooling units 104A and 104B are designed to provide cool air to the area under the raised floor and to receive return warm air from the space adjacent the ceiling of the data center. In other embodiments, in addition to or in place of the cooling units 104A and 104B, in-row cooling units, such as those available from American Power Conversion Corporation, may be used. Further, in at least one embodiment, half-rack in-row cooling units may be used, as described in co-pending U.S. patent application Ser. No. 11/335,901, entitled COOLING SYSTEM AND METHOD, by Neil Rasmussen et al., filed on Jan. 19, 2006, and incorporated herein by reference. As described in the referenced application, the half-rack, in-row units have a width of twelve inches, which is approximately half of that of a standard data center rack.

One embodiment of the invention, directed to a system and a method for designing, monitoring, and upgrading the equipment installed in a data center, such as data center 100, will now be described with reference to FIG. 3. This equipment may include rack mounted equipment, such as servers, storage devices, and network connectivity equipment, and floor mounted equipment, such as three phase power distribution units and CRACs. FIG. 3 shows a functional block diagram of a design and management system 200. Embodiments of the invention are not limited to the functions provided by the functional blocks or the particular arrangement of the blocks. In addition, the functions provided by the system 200 need not be implemented on one computer system, but rather may be implemented using a number of networked devices as described further below that provide the functions described. Further, particular embodiments may have more or less functions and functional modules than those described below with reference to FIG. 3. In different embodiments, the functions described with reference to FIG. 3 may be performed on one processor or controller or may be distributed across a number of different devices.

The system 200 includes an input module 202, a display module 204, a builder module 206, a facility management module 208, an integration module 210, a database module 212, and a work order module 214. The input module 202 provides an interface to allow users to enter data into the system 200. The input module may include, for example, one of a number of known user input devices for computer systems, and in addition, in at least one embodiment, electronic data regarding a facility and/or equipment to be loaded into a facility may be entered into the system through a network interface or using an electronic media storage reader. Information may flow between these modules using any technique known in the art. Such techniques include passing the information over the network via TCP/IP, passing the information between modules in memory and passing the information by writing to a file, database, or other storage entity, such as a storage device, disk or other type of storage entity.

The display module includes a display interface and may include a graphical display to display output data to a user. In addition, the display module may include an interface for one or more printers that provide a hard copy of output data.

The builder module 206 includes routines for designing optimal layout of equipment in a facility, determining data center resource requirements, such as power requirements and cooling requirements, for electronic enclosures and/or equipment racks, ensuring that the placement of equipment, cooling units and power distribution branches in the facility allow the data center resource requirements, such as power and cooling requirements, to be met, and calculating for each electronic enclosure, and/or equipment rack, the remaining data center resource capacity, such as power capacity and cooling capacity, available based on the layout of equipment in the facility.

In another embodiment, builder module 206 exposes interfaces that allow for entry of data center resource supply policies. These policies may detail additional desired characteristics of the data center resources as provided to data center equipment. For example, data center resource supply policies may specify desired data center resource redundancy levels and runtime requirements. Additionally, data center resource supply policies may specify security needs for data center equipment, such as, for example, the need to locate servers with financial data in racks that made be locked and/or under surveillance. As is discussed further below, both system and method embodiments may compare particular data center configurations to data center supply polices to determine whether the particular data center configuration complies with the data center policies. The result of this comparison may be stored on a computer readable medium for later use.

The facility management module 208 is used by the system 200 after equipment is installed in the facility. The management module includes routines to monitor data center resource characteristics, such as power and cooling characteristics, of equipment in a facility. The management module may be coupled, either directly or through one or more networks, to measurement devices and control devices throughout the facility and may record their history for analysis, summarization and exportation. Based at least in part on methods discussed further below, the facility management module 208 may ascertain data center resources provided to a particular space or location in the data center.

According to one embodiment, the integration module 210 is the main module in the system and coordinates flow of data in the system to perform methods of embodiments of the present invention.

The database module is used to store data regarding various devices that may be used in a data center, such as servers, uninterruptible power supplies, power strips, network connectivity equipment (such as network cabling, hubs, routers, wireless routers, switches, patch panels, etc.), automatic transfer switches, power distribution units, air conditioning units, racks and any other data center equipment. The data stored may include data center resource supply policies for data center equipment. The data stored may also include data center resource consumption and production benchmarks for data center equipment such as physical parameters (e.g., dimensions/rack space requirements, power plug types, network cabling specifications, etc.) as well as power and cooling consumption data. In the case of data center equipment that provide data center resources such as network connectivity equipment, power supplies and air conditioning units, data center resource production benchmarks may include network connectivity, cooling and power output characteristics (e.g. total output capacity, number and type of connections/plugs available, etc.). It should be appreciated that benchmarks may indicate that certain data center equipment produce, and/or consume, data center resources. Examples of data center resource providing equipment include electrical generators and CRACs, among others. As described below, the database module may be used in embodiments of the invention to provide a complete bill of materials (BOM) for a completed design. In one embodiment, a centralized web-accessible database server may be used to store equipment information and warnings and error messages, allowing easy access to the information for editing.

In another embodiment, a user may maintain data center equipment information, such as the information handled by database module 212, with the assistance of system 300. System 300 is also depicted in functional block diagram FIG. 3. System 300, which may be hosted by the system provider, includes data center equipment database 304 and data center equipment database interface 302. In general, interface 302 may be an interface to database 304 that may receive or provide any data appropriate for storage in database 304 including data center configuration, equipment or resource information. Database 304, in turn, may receive and store from interface 302 or retrieve and provide to interface 302 data center information including data center equipment resource requirements, data center configurations and data center resource redundancy and runtime requirements.

Database 304 may serve as a master database for the system provider and thus may include several types of information related to data centers. In one embodiment, database 304 includes a data center configuration management database (CMDB), which may encompass various configuration management data including one or more specific data center physical and logical configurations, and a data center equipment characteristics database, which may include theoretical and actual data center resource production and consumption information for data center equipment. More particularly, database 304 may accept and store specific CMDB information for the system provider's installed base of data centers or a subset thereof. This information may include the entire physical layout of a data center, e.g. its physical dimensions, the location and identity of data center equipment, and data center resource capacity, redundancy and runtime requirements, among other information that may have relevance to the design and performance of a data center. The source of this information may include the initial design on the data center as discussed with regard to method 300 below.

The type of information stored by database 304 for data center equipment characteristics may include the information discussed above with regard to database module 212, e.g. nameplate values as referred to in the art. Additionally, database 304 may also store data center resource consumption and production history for data center equipment and may use this information to maintain a set of benchmarks that are specific to the manufacturer and model of data center equipment. These specific historical measurements may be summarized into various forms to establish a benchmark that is specific to the manufacturer and model of data center equipment and that is based on actual, practical usage of the data center equipment rather than theoretical values (e.g. nameplate values). These data center resource consumption and production summaries may include, among others, minimum, maximum and average data center resource consumption or production, data center resource consumption or production as a function of time, e.g. power or cooling consumption or production by day of week, week of year, etc., actual data center resource consumption or production when a change in either is requested, and data center resource consumption or production as a function of data center equipment utilization. The source of this information may include the initial design on the data center, including customer or system provider entered benchmarks, and ongoing parameter measurement as discussed with regard to method 300 below. According to one aspect, it is appreciated that these benchmarks, in turn, may be more accurate than the nameplate values and may be used for simulation purposes during the design and retrofitting processes discussed below.

Interface 302 may expose both user interfaces (UIs) and system interfaces to exchange database 304 information with external entities. These external entities may include systems and/or users. Interface 302 may both restrict input to a predefined information domain and validate any information entered prior to using the information or supplying the information to other modules. For instance, in one embodiment, interface 302 may include a Structured Query Language (SQL) interface to enable a user or application program to interrogate database 304. This SQL interface may include graphical elements that a user may actuate to build SQL statements and may also include elements that enable a user to simply input SQL statement directly.

In other embodiments, interface 302 may include more complex grouping, translation, validation and/or restriction logic. For instance, interface 302 may validate that a SQL statement entered by a user conforms to proper SQL syntax prior to executing it against database 304. In one embodiment, interface 302 may expose a UI with characteristics similar to those of builder module 206 to enable users to create database information representing various data center configurations. In another example, interface 302 may expose a user interface allowing a user to enter new data center equipment resource information, including manufacturer, model and data center resource consumption and production benchmarks. Interface 302 may restrict entry of resource consumption and production benchmarks to predefined data center resources, such as power, cooling, physical space, etc. In still another embodiment, a user may establish groups of data center equipment through interface 302 and approve these equipment groups for use within a set of data centers or upon certain types of computing devices, such as remote or mobile computing devices. Furthermore, interface 302 may enable a user to designate a hierarchical relationship between groups of equipment. As discussed further in regard to method 300 below, arrangement of this information into a hierarchy of groups may ease database maintenance and distribution.

In one embodiment, interface 302 may expose a system interface that imports data center configuration and measured parameter information from a system provider's installed base of data centers or data center equipment providers. Interface 302 may utilize a standard protocol, such as, for example, SQL or SQL wrapped in SOAP, to implement such a system interface and may include non-standard protocol elements that are parsed and resolved to commands to be executed by database 304. Interface 302 may validate database commands prior to execution on database 304. Any customer specific data center equipment, e.g. data center equipment entered by a customer that is not present in the database 304, may be imported into database 304 by interface 302 if any applicable validation is successful. Similarly, equipment not present in database 304 that is made available by data center equipment providers may be imported into database 304 by interface 302 if any applicable validation is successful. These features enable system 300 to easily add new data center equipment to its set of managed elements.

Furthermore, importation of measure parameters may trigger a parameter summarization process that updates data center equipment resource consumption and production benchmarks to reflect actual usage history. The summarization process may include updating, among others, minimum, maximum and average power consumed or produced benchmarks, benchmarks for power consumption or production as a function of time, e.g. power consumed or produced by day of week, week of year, etc., benchmarks for power actually consumed or produced when a change in either is requested, and/or benchmarks for power consumed or produced as a function of data center equipment utilization.

In still another embodiment, interface 302 may expose a system interface that exports data center equipment information, or catalogs, to external storage. This external storage may reside at various locations on various computing devices. Furthermore, as discussed below, the particular information that is exported to these locations and computing devices may be relegated to specific groups of data center equipment.

It should be appreciated that in at least one embodiment, the functionality of system 300 may be included in database module 212 of system 200.

In yet another embodiment, the work order module 214 may enable management of changes to the configuration of the data center, such as those resulting from a data center retrofit process as discussed below with regard to process 600. In general, work order module 214 analyzes any changes made to the data center configuration by the other modules in system 200. Then work order module 214 generates a set of tasks that, once complete, will implement those changes. Next, work order module 214 translates the set of tasks to a set of work orders in human-readable form. Lastly, work order module 214 facilitates tracking of those work orders to completion. To accomplish these objectives, work order module 214 may expose various UIs and system interfaces to enable communication and interoperation with external entities.

In one embodiment, work order module 214 exposes a system interface through which integration module 210 may supply any changes made to the data center configuration. Work order module 214 may also expose a user interface including elements that enable a user, such as a data center manager, to modify and dispatch work orders to other users, such as technicians, for implementation. Work order module 214 may also expose a user interface to enable a user to configure a set of automatic dispatching rules. Further, work order module 214 may expose other user interfaces that enable users, such as technicians, to modify the details, including status information, of work orders. These user interfaces may reside on various computing devices, including remote or mobile computing devices.

Implementing such a user interface on a remote or mobile computing device may allow users, such as technicians, to update the CMDB of the data center as configuration changes are made. This may produce several benefits including increased accuracy of the CMDB, due to the increased compliance with, and promptness of, configuration change updates. Another benefit may be increased productivity for users, such as technicians, because configuration changes may be entered while working on data center equipment, rather than entering changes at a workstation as a separate activity.

Work order module 214 may also implement modification and assignment system interfaces to interoperate with other systems. For example, work order module 214 may, through a system interface, utilize an external email system to notify users of a work order assignments. Lastly, work order module 214 may utilize a system interface that enables it to detect changes in data center resource demands and may use this information, when appropriate, to modify the status information of a work order.

A flow chart of a method 300 in accordance with one embodiment that may be performed using the system 200 will now be described with reference to FIG. 4. Initially, and optionally, at stage 301 of the method 300, a user may create groups of data describing data center equipment. These groups may enable management of multiple types and/or models of data center equipment as a single collective entity. For example, inclusion of data describing data center equipment in a group may designate such equipment as approved for use within all of the data centers owned by a customer or specific subsets thereof. Any data center equipment approved for use within a data center may be used during the design or retrofit of the data center.

Moreover, the user may arrange these groups in a hierarchical fashion. In one embodiment, a first group is created that includes all of the data center equipment supported by the system, a second group is created that is a subset of the first group and that designates equipment that is approved for use within the data centers of a particular customer, and a third group is created that is a subset of the second group and that designates equipment that is preferred for use within a particular customer data center. In one embodiment, a user may target specific groups for exportation to specific customers, customer data centers or specific computing devices within a customer data center, such as remote or mobile computing devices.

Fashioning groups of equipment data may ease maintenance and distribution of electronic data center equipment catalogs, which may include data describing characteristics of data center equipment. For example, specific inclusion of data center equipment data in a group that is lower in the hierarchy, e.g. a group designated for distribution to a remote or mobile computing device within a specific data center, may require that the data be present in ancestor groups. This inclusion may be performed automatically by the system. These groups may also be employed to enforce standardization of data center equipment within the customer organizational hierarchy by requiring that equipment be approved for use by the customer before it is allowed to be used to retrofit a specific customer data center.

In another embodiment, the system provider may create a group of data describing standard data center equipment. A group of the standard data center equipment data may be approved for use in customer data centers. An equipment catalog including data associated with the standard and/or approved data center equipment may be delivered with the initial system installation in a data center. The standard and/or approved equipment data may then be supplemented with customer specific, non-standard equipment data used in a customer data center, as discussed with regard to stage 304 below.

Approved equipment may be further grouped into a preferred set for use with one or more customer data centers. The creation of these preferred groups may be explicitly performed by the user or may be implicitly performed by the system based on usage of specific equipment by a customer or within a customer data center during data center design or retrofit.

In stage 302 of the method 300, information regarding the facility is loaded into the system. The information includes, for example, dimensions of the facility, number of rooms, locations of doors, support columns, other obstructions, parameters of data center resource capabilities, such as available power, cooling capabilities of the facility, whether a raised floor or drop ceiling is in use, and characteristics of any such floor and roof. Data center resource supply policies may also be entered in this stage. For data center resource providing equipment, such as electrical generators or CRACs, capability information may be loaded by receiving data center equipment information from interface 302 of system 300. Thus, this stage of method 300 collects information helpful in determining the data center resources provided to particular data center locations and spaces. In at least one embodiment, as discussed further below with regard to cooling, this information may be further processed to determine the data center resources provided to particular data center locations and spaces.

In stage 304 of the method, information regarding equipment to be installed in the facility is entered. The information includes, for example, the number of racks of equipment, maximum power draw for each of the racks, dimensions of the racks, and cooling requirements for the racks. The need for backup power sources and multiple power sources for equipment and or racks may also be entered at stage 304. In one embodiment, data center resource consumption and production characteristics of individual pieces of equipment that are to be loaded into racks may also be entered. Also, the weight of equipment (including equipment loaded into racks) may be used to ensure that the weight of the installed equipment is within any facility constraints. These characteristics may include, in addition to network connectivity, power and cooling requirements, the amount of rack space that the equipment needs to occupy and the type and/or number of electrical plugs that the equipment requires. In one embodiment, the database module 212 contains information regarding a number of devices, such as uninterruptible power supplies, equipment racks, cooling units, generator systems, power distribution units, automatic transfer switches, electrical routing devices, including cables, and servers and other computer equipment. In this embodiment, when a particular model number of a device is entered, characteristics of the device are retrieved from the database module. In one embodiment, interface 302 of system 300 provides these device/equipment characteristics to database module 212. Equipment related to fire protection and security may also be included in the design. Further, in at least one version, all equipment and components within equipment racks may include RFID tags, which can be used by systems of the invention to track location of equipment and racks. In another embodiment, any data center equipment characteristics that are added or changed by a user at this or the previous stage may be transmitted to interface 302 of system 300 for importation into database 304.

Once all of the information is entered into the system, at stage 306, the system in one embodiment determines a layout for the equipment in the facility, taking into account the data center resource requirements, such as power and cooling requirements, of the equipment as well as other characteristics of the equipment that were entered at stage 304 or retrieved from the database module. In another embodiment, the user may create the layout graphically, adding racks and other equipment where desired, and in this embodiment, the system will provide feedback during the layout process, disallowing some choices and making intelligent suggestions. These rules may include, for example: a standard alternating hot aisle/cold aisle layout must be specified, the plenum must be greater than some minimum value, the total room cooling capacity must exceed total room cooling load, aisles must be wide enough for access purposes and to meet building codes, distance between PDU and IT racks served by the PDU must not exceed some maximum value, PDU must be located immediately adjacent to a UPS, where a cable ladder spans an aisle, the aisle cannot exceed a maximum width, one or more data center resource capacities must be at a level sufficient to support target data center resource redundancy and/or runtime requirements, etc.

Next, at stage 308, a cooling analysis is conducted to determine if the design provides adequate cooling for each of the racks and the equipment installed in the racks. As described further below, in different embodiments of the present invention one of a number of different methods may be used to conduct the cooling analysis. In one embodiment, if the results of the cooling analysis indicate that one or more devices and/or racks are not receiving adequate cool air, then the procedure may return to stage 306 to change the layout of the equipment based on feedback provided from the analysis conducted at stage 308.

At the completion of the cooling analysis, at stage 310, a room model is displayed showing the locations of the equipment in one or more rooms of the facility. The room model may include, for each equipment rack, or for individual data center equipment, information regarding the total data center resources, such as power and cooling, being consumed or produced as well as an indication of total available data center resources, such as power and cooling, to the rack or data center equipment. In one embodiment actual data center resource data, such as power and cooling data, may be displayed, while in other embodiments colors may be used, either alone or in combination with data, to display different levels of data center resource availability, such as power and cooling availability. For example, if a rack is operating with sufficient cooling air with a margin above a threshold, the rack may be indicated in green on the display, if the cooling air availability is closer to the threshold, the rack may be indicated in yellow, and if the rack does not have sufficient cooling air it may be indicated in red. Still further, the results of the analysis may indicate that adequate data center resources, such as power and/or cooling, are being provided for equipment, but that specified redundancy levels and/or runtime margins are not being met, either at the room level, a row level, a rack level, or at a specific piece/element of data center equipment.

In one embodiment, the system may display multiple room models and may allow the user to find one or a series of alternate satisfactory locations for the equipment based on the data center resource requirements of the equipment and any applicable redundancy and/or runtime requirements. Another embodiment may allow the user to find an optimum location followed by a series of alternate satisfactory locations for the equipment. Each series of locations may be arranged consecutively according to an order of preference, such as in order of decreasing excess or stranded capacity. As discussed further below, stranded capacity includes excess capacity that is nominally available, but unusable, due to insufficient associated capacity of another data center resource required by data center equipment.

Yet another embodiment may allow the user to specify both the data center equipment and location and may validate whether the location provides sufficient data center resources to satisfy the requirements of the equipment and any applicable data center supply policies. This validation may be performed by comparing the data center resources provided to the location, the data center requirements of the equipment and any applicable data center resource supply policies. The result of this comparison, a compliance result, may be stored for later use. In still another embodiment, the system may suggest data center equipment to be placed at a user specified location. In this case, the system may ensure that applicable data center resource supply policies, and data center resource requirements of the suggested equipment, are met by comparing the polices, the data center resources provided to the location and the data center resource requirements of the equipment prior to suggesting the equipment based on a compliance result. Specific example details regarding the room model are described further below with reference to FIGS. 5 through 5D.

At decision block 312, a determination may be made by, for example, a facility designer as to whether the layout generated in stage 310 is satisfactory. The determination may be based on additional criteria of importance to the designer that was not included during the design of the original layout. For example, it may be desirable to have certain racks near each other or to have certain racks isolated from one another. At stage 314, additional criteria or other feedback can be provided and the process then returns to stages 306 and 308 where the room model can be refined. Stages 306 to 312 may be repeated until a satisfactory model is achieved at stage 312. In at least one embodiment, at the completion of the design stage, a bill of materials is generated and may be used to provide the cost of the equipment to be installed in the facility and may also be used to generate a sales order for the equipment, providing a simple solution for ordering all equipment associated with a new data center. Further, CAD drawings and electronic files that capture the designed layout may also be generated. In another embodiment, this data center configuration is transmitted to interface 302 of system 300 for storage in database 304 in the form of a CMDB for the installed data center.

At stage 316, the equipment is installed in the facility according to the layout generated at stages 306 to 314. In one embodiment, measurement equipment to measure cooling characteristics and power characteristics, may be installed with the equipment. The measurement equipment is described further below, and may include, for example, devices for measuring power, airflow, humidity and temperature at various locations in the facility and within equipment racks located in the facility.

At stage 318 of the process 300, power and cooling parameters are measured using the measurement equipment. Additional temperature measurements may also be provided by devices, such as servers, that have the capability to detect internal temperatures. The parameters measured may be used continuously by the management module of the system 200 to detect error conditions and to monitor trends that may lead to an error condition. Further, in the process 300, the measured parameters can be compared with predicted parameters calculated during the design process in stages 306 and 308. For example, in one embodiment, the airflow through a perforated floor tile of a raised floor is used to determine the available cooling air of a rack located adjacent the floor tile. The airflow through the perforated tile may be determined in stage 308 using one of a number of computational methods that are described further below, or the airflow may be determined using data from related physical measurements or simulations. Once the equipment is installed in the facility, the perforated floor tile may be instrumented to measure the actual airflow through the tile. The actual measured value may then be compared with the calculated value at stage 320. If the two differ by more than a predetermined threshold, then an indication or warning may be provided and the calculations conducted in stage 308 may be conducted once again at stage 322 using measured values in place of calculated values as appropriate to obtain updated parameters. In another embodiment, measured parameters are transmitted to interface 302 of system 300 for storage in database 304. As discussed above, the storage of these measure parameters by interface 302 may trigger further analysis and summarization of the measure parameters into data center equipment consumption and production benchmarks.

After stage 322, the model of the facility described above with reference to stage 310 may be displayed with values of power and cooling availability and consumption updated to reflect any differences between measured parameters and calculated parameters. Any out of tolerance conditions (for either cooling or power) may be indicated on the display using, for example, a color coded scheme as described above. In one embodiment, a user may be provided with a number of available options to correct an out of tolerance condition. The options may include upgrading or adding facility equipment (i.e., an air conditioning unit or an uninterruptible power supply) or may include moving equipment and/or racks. Stages 318 to 322 of the process may be performed continuously as part of a management system of the data facility.

In one embodiment of the invention, stages 302 to 314 of the process 300 are implemented using a build-out system accessible by a user over the Internet. In this embodiment, the user provides the requested information, and the build-out system provides the processing described above, provides outputs to the user over the Internet, and stores results locally. After the equipment has been installed in the facility, the management system 500 (described below) may access the build-out system to download information related to the equipment. In addition, when a retrofit of the facility is to occur, the management system may contact the build-out system to coordinate the design of the retrofit. In at least one embodiment, electronic files may be imported/exported between the systems to provide a complete transfer of all information related to a data center's design.

FIG. 5 shows an example of a display of a room model that may be generated using the system 200 and the process 300 and shown on a computer display. It should be appreciated that this computer display may be any be coupled to, or included in, any sort of computing device including a remote or mobile computing device. The room model shown in FIG. 5 is essentially the data center 100 previously discussed above with reference to FIGS. 1 and 2. However, in FIG. 5, additional data related to the power and cooling consumption and capacity of each rack, U space positions, and/or elements of data center equipment housed within each rack may be included in an informational block, such as informational blocks 120A and 120B shown on two of the racks 108A and 108B in FIG. 5. Informational blocks may be included on data center equipment, each rack, or on less than all racks, for example, by row, zone, or cluster.

FIGS. 5A and 5B show enlarged views of respectively racks 108A and 108B that may also be shown on a computer display of systems of embodiments of the invention. In the views of FIGS. 5A and 5B, specific information regarding the racks and U space positions is included in the informational block. In the embodiment shown, the information in the block includes a rack identifier 122, a rack type 124, power capacity 126, power usage 128, cooling capacity 130, cooling usage 132, contents of the rack 134, power redundancy 136, cooling redundancy 138, and UPS runtime 140. In other embodiments, such as the embodiment depicted in FIG. 20 discussed below, information for each rack may be included in tabular form, or in the form of columnar bars, on a graphical display showing the room layout. Data center information that may be displayed includes runtime measurements, data center resource redundancy measurements, including relationships between data center equipment working in combination to providing redundancy, and capacity measurements, such as available capacity, utilized capacity, and stranded capacity.

The rack identifier 122 includes a row number and a rack number, however, in other embodiments, the rack identifier may also include an indicator of the type of rack, membership of the rack to a particular row, zone, group, or cluster, manufacturer of the rack, as well as other information. The rack type 124 identifies the particular type of rack, i.e., server rack, router rack or telecommunications rack. The power capacity 126 indicates the maximum power capacity of the rack, and the power usage indicator 128 indicates the percentage of maximum capacity at which the rack is expected to operate. In different embodiments, the power usage indicator may be calculated based on manufacturer supplied data for equipment contained in the rack and/or based on actual power measurements of equipment. The power capacity for a rack, in at least one embodiment, is determined based on limitations of devices and/or power cables that supply power to the rack, such as circuit breakers, UPSs or any other devices. The contents of the rack 134 includes a list of the equipment contained in the rack and may include an indication of remaining space in the rack displayed, for example, in terms of rack units, which are typically referred to as "U" with 1U equal to 1.75 inches. Details regarding the equipment in the rack, including operational status and network addresses, such as an IP address for a device may also be included.

The cooling capacity indicator 130 and cooling usage indicator 132 identify respectively the quantity of cooling air available to the rack and the percentage of that cooling air that is being used by equipment in the rack. In other embodiments power and cooling usage may be indicated using various types of graphical gauges, such as a bar graph, that indicates power and cooling usage and capacity. In the embodiment shown in FIGS. 5A and 5B, the cooling capacity is shown in terms of kilowatts (kW). As known to those skilled in the art, for typical data center applications, many equipment racks typically require approximately 160 cfm (cubic feet per minute) of cooling air per kilowatt of power used by the rack. All the power consumed by computing type devices is typically converted to heat, such that the required cooling (in terms of kW) for a rack can be assumed to be equal to the power consumption of the rack. Accordingly, in one embodiment, the cooling usage indicator is equal to the power consumed by the rack. In other embodiments, depending on the type of equipment that is installed in the racks, the cooling required by a rack may not be equal to that consumed by the rack and may be calculated based on manufacturer's data for the equipment, based on test results, or in any other manner.

The cooling capacity of an equipment rack is determined based on a number of different factors. For example, for a raised-floor environment, these factors may include: location of the rack in the facility, proximity of perforated tiles to the rack, the amount and temperature of cooling air provided through any such perforated tile, the physical or geometric layout of the racks and building, and the cooling requirements of other equipment in the facility located near the rack. The cooling capacity of one rack in a facility may be affected by the cooling usage of nearby racks, and accordingly, in one embodiment, the cooling capacity of a rack is adjusted when the cooling usage of a nearby rack is changed. In at least one embodiment of the present invention, calculations for determining cooling capacity of a rack are based in part on the ability of one rack to borrow cooling air available to adjacent racks. Particular methods for determining cooling capacity for racks in embodiments of the present invention are described further below. In one embodiment, when the cooling usage of one rack is changed, the cooling capacity of that rack, and all racks located near the changed rack is recalculated.

In embodiments of the present invention, during the design as well as during the management of a data center, the true available capacity of a data center can be determined at U space position level, the rack level, at the row level and at the room level. In determining available capacity (including unused capacity), data center resources including both cooling and power capacity are used, and the true available capacity can be determined using the lowest data center resource capacity. In situations where data center resource capacities are not equal, the excess capacity can be considered wasted or stranded capacity that can not be used in the present design. In other words, while stranded capacity is nominally available, it is unusable due to insufficient associated capacity. In embodiments of the present invention, the stranded capacity can be determined at the U space position level or rack level and can be totaled to determine stranded capacity at the row level and at the room level.

In one embodiment, as depicted in FIG. 21, this data resource information may be displayed to the user in the form of graphs. For example, FIG. 21 depicts total capacity 2102, space capacity 2104, cooling capacity 2106 and power capacity 2108, each as a function of time. Each of these representations may include total data center capacity specific to the data center resource shown. In addition, the representations may include data center capacity specific to a specific location in the data center, e.g. high density or medium density racks. Still further, these capacities may be projected into the future to enable a user, such as a data center manager, to predict when capacity may need expansion.

FIG. 23 illustrates an embodiment that a user, such as a data center manager, may reference to assess stranded data center capacity and ascertain the root cause of the stranded capacity. More specifically, FIG. 23 depicts report 2302 which includes rows and columns under various data center resource headings. The intersection of these rows and columns may indicate how much excess capacity of the data resource listed in column 2304 is unusable due to insufficient capacity of the data resource listed in row 2306. For example, intersection 2308 may indicate that 20% of the weight support capacity of the data center is unusable due to insufficient power capacity. In another embodiment, the actual amount of stranded capacity may be used to articulate these relationships and the meaning ascribed to the rows and columns may be transposed. As will be apparent to one of ordinary skill in the art, other embodiments illustrating this relationship are possible without departing from the present invention.

Recommendations are provided for reducing stranded capacity during the design phase as well as during the management phase. The recommendations may include reducing capacity of data center resources, such as power and cooling resources, (thereby reducing operational costs) or adding data center resource capacity, such as cooling capacity or power capacity, appropriately to reduce the stranded capacity. Warnings may be generated when the stranded capacity is greater than preset thresholds, and in addition, recommendations for more optimal locations of equipment, including power and cooling equipment, may also be provided to minimize the amount of stranded capacity. Further, costs of the stranded capacity may be calculated.

In management systems and methods of embodiments of the invention, as described above, data center resource capacity and availability, such as power and cooling capacity and availability, may be monitored in real time. In one version, changes to the availability rate (or the utilization rate) are monitored and based on these changes, the growth rate of a data center may be determined, and predictions of dates when additional capacity will be required can be provided. In one embodiment the forecasting method used to make these determinations is linear regression. Other forecasting methods are possible without departing from the scope of the present invention. The ability to monitor capacity and predict future capacity needs allows data center operators to control costs and plan for upcoming expenses. Further, determinations may be made as to the additional expenses that will be incurred if new equipment is added. The total cost (for example per kilowatt) can also be determined during the design phase or during operation.

In embodiments of the invention described herein, data center layouts may be designed to provide specific redundancy levels (i.e., n, n+1 or 2n) for data center resource design, such as both the power design and the cooling design. In data centers in the past, additional room cooling units are typically provided to include some redundancy in a data center, such that an overall cooling capacity of the data center can be maintained, even when one or more of the room cooling units fails or must be powered down to conduct maintenance. One problem with these past solutions is that the cooling redundancy is designed at the room level and not the rack level, and while overall cooling capacity may meet redundancy requirements, cooling at the rack level may not meet the desired redundancy requirements. In embodiments described herein, the ability to provide accurate airflow data at the rack level and U space position level allows true cooling redundancy to be designed into a solution.

As discussed above, graphical user interfaces may be used with embodiments of the present invention to assist in the design and management of data centers. In one embodiment, these graphical user interfaces may be used to present an interactive representation of a layout of a various spaces in the data center. In another embodiment, interactive representations may be tailored to particular spaces within the data center, such as the entire data center, data center floors, rooms, racks and U spaces. Further these interfaces may be displayed on a local or remote computing device. Remote computing devices may include general computer systems, mobile computing devices and computing devices that are included with, embedded in, or affixed to, another physical structure or device, such as a wall, ceiling, another computer system or an enclosure, e.g. a rack enclosure, etc.

For example, particular user interface screens used in one embodiment to design a layout in a data center will now be described further with reference to FIGS. 5C and 5D. FIG. 5C shows a floor editor interface 402 used in one embodiment to layout equipment in a data center, while FIG. 5D shows a rack editor interface 404 used in one embodiment to provide further details of the contents of equipment in the data center. In one embodiment of a data center design system, tutorials are provided for a user to assist the user by providing best practice design guidelines. The tutorials may be accessed by a user as desired or may be configured to be displayed as a user is taking a particular action.

The floor editor interface includes a main menu 403, a tool bar 406, a configuration box 408, a generic components box 410, a floor layout box 412, a status box 414 a full-image viewing box 416, and an unplaced equipment box 418. The main menu 403 provides a drop-down menu in a format known to those skilled in the art, and allows a user to perform various functions, including the ability to "undo" and/or "redo" changes that are made to the layout. The tool bar 406 provides short hand access to functions of the design system, and in one embodiment includes a floor editor button 406A and a rack editor button 406B. Activation of the floor editor button results in the display of the screen shown in FIG. 5C, while activation of the rack editor button results in display of the screen shown in FIG. 5D.

The floor editor box 412 shows the layout of equipment in a data center being designed and provides text that identifies the equipment contained in the layout. A room perimeter 412A shows the exterior walls of the room along with dimensions of the room that can be set by a user. In one embodiment, when a new design is started, the user is presented with a screen showing a number of basic room configurations that can be selected. Further, the walls of the room can be moved by a user by selecting one of buttons 412B, and additional buttons can be added where needed to expand or shrink an area of the room. In one embodiment, the room size may be changed as equipment is added to the layout. Three rows 412C, 412D and 412E are outlined in the room shown in FIG. 5C. In other embodiments, more or less rows may be included. As shown in FIG. 5C, the rows are configured in a manner to provide alternating hot and cold aisles. Row 412D includes three equipment racks (identified by "R"), two half-rack cooling units (identified by "C") a UPS ("U") and a power distribution unit ("P"). Row 412E includes one rack, and row 412C as presently configured does not include any equipment. During the design phase additional equipment may be added to each of the rows. The room also includes an automatic transfer switch (ATS) 412G and a cooling distribution unit (CDU) 412F. Hatched areas are shown on the display around the ATS and CDU to indicate that these areas should be kept clear of equipment. Each piece of equipment in the room may include identifiers that indicate the type of rack as well as the rack's location in the room and the power source for the rack. Further, as discussed above, each rack may include information regarding data center resource use and availability, such as power and cooling use and availability. Still further, text may be provided on each row to indicate total data center resource information, such as power and cooling information for each row.

The configuration box 408 includes eight configuration options for designing a data center. A room properties configuration option, when selected, allows a user to identify data center resource values, such as physical, power, and cooling values, that affect the data center design as a whole including dimensions of the room, aisle widths and total anticipated power density for the data center. Data center resource redundancy and/or runtime requirements, such as power redundancy requirements (i.e. N, N+1, 2N), cooling redundancy requirements and runtime requirements for UPS systems may also be set. The number of data troughs that will be used and location of power distribution and cooling line distribution (i.e. overhead or under a raised floor) can also be configured. In one embodiment, only in-row cooling is provided, however, in other embodiments other types of cooling solutions may be used as well. In at least one embodiment, individual rows may be rotated to different angles in the data center. Further, while only one room is shown in FIG. 5C, at least one embodiment allows a data center to include multiple rooms. These rooms may be active rooms, which hold active data center equipment, and inactive rooms for storage of spare or decommissioned equipment.

An add rack configuration option in the configurations box 408 is used to add equipment racks to the data center design. When this option is selected, a user is presented with choices of various types of racks to add to the data center. When racks are selected, an indicator is provided in the unplaced equipment box 418, indicating that the racks still need to be placed into the room layout.

An add in-row cooling option in the configuration box is used to add in-row cooling units to the data center design. When this option is selected, a user is presented with various types of cooling units that can be added in the rows. As with equipment racks, when a cooling unit is selected, an indicator is provided in the unplaced equipment box 418, indicating that the cooling unit still needs to be placed in the room layout.

A power zone option in the configuration box is used to identify and select PDUs and UPSs and to indicate which equipment will be powered from the UPSs and PDUs. Characteristics of the PDUs and UPSs may also be selected. Once selected, an indicator is provided in the unplaced equipment box 418 for the UPSs and PDUs. In one embodiment, multiple racks may be included in a selection on the layout to identify the equipment that belongs to a particular power group, also known as power zone. In still another embodiment, after selection of equipment and UPSs and PDUs, an automatic power zone option may be implemented in which the system matches equipment power requirements (i.e., redundancy levels, runtime durations, voltages, phasing) to those of the UPSs and PDUs and assigns power zones automatically and determines lengths of power cables that are needed to power equipment from the assigned PDU. In automatically determining power zones, the system may also identify the need for additional UPSs and PDUs.

A power generation option in the configuration box 408 is used to identify and select an automatic transfer switch (ATS) and generator. Again, once these are selected, an indicator is provided in the unplaced equipment box 418.

An emergency power off option in the configuration box is used to select an emergency power off (EPO) solution for the data center design, and once selected, an indicator for the EPO solution will be added in the unplaced equipment box.

A management option in the configuration box 408 allows a data center manager, such as the InfrastruXure® Manager and/or InfrastruXure® Central discussed above, to be added. In one embodiment, when selecting the manager, a rack location for the manager is also selected.

A service option in the configuration box 408 allows a user to select a level of service to be provided to the data center by a data center services organization.

Other configuration options may include a row planning configurator that allows a user to plan how many racks a row can support by defining the power and cooling settings for the row, prior to placing equipment in a row. In one embodiment, the row planning configurator may provide an estimate on the number of racks that can be supported based on the power components and in-row cooling units contained in the row. In one embodiment, the row planning configurator may provide a complete layout based on design best practices.

The generic components box 410 includes a number of icons to designate pre-existing equipment in a data center. The components may be selected and "dragged" into position in the layout. In one embodiment, the generic components include blocks and gaps. The gaps can be used to identify areas over which cables and conduits can be routed (i.e. a walkway), while the blocks are used to identify areas over which cables and conduits can not be routed (i.e. a column). Once dragged onto the layout, the blocks and gaps can be sized appropriately.

As discussed above, when equipment is selected for use in the data center, an icon appears in the unplaced equipment box 418. To place the equipment in the layout, the icon is selected and dragged into the appropriate location in the layout. Existing equipment may be repositioned using this same method. For example, existing equipment may be dragged from an active room and dropped in an inactive storage room, thus enabling the system to track unutilized equipment available for provisioning elsewhere. In one embodiment, when adding an in-row cooling unit, the icon for the cooling unit can be placed between two adjacent racks and released, and the racks will then move in the row to allow the cooling unit to be inserted between the racks. Further, in one embodiment, a snap-to feature is employed to align equipment properly in rows and along walls, and in addition, rows and equipment may be aligned along and "snapped to" floor tiles when, for example, a raised floor is in use. Using this feature, a user does not need to precisely align objects.

The full-image viewing box 416 provides a "bird's eye" view of the layout contained in the floor layout box 412. In one embodiment, the zoom button on the tool bar can be used to enlarge the view of the data center layout in the floor layout box 412. When the view is enlarged, the entire layout may not appear in the floor layout box. The full-image box 416 still displays the full image of the layout for the user. In one embodiment, when the full layout does not appear in the floor layout box, an overlay is used in the full-image box to indicate on the full-image, the portion of the layout that is displayed in the floor layout box. In one embodiment, when the full image is not displayed in the floor layout box 412, the overlay may be selected and dragged within the full-image viewing box to select which part of the layout is displayed in the floor layout box.

The status box 414 is used to display warnings, errors and other conditions to the user. The warnings may vary in severity and may include indications that design guidelines are being violated and may also include more severe warnings indicating that data center resource capacities, such as power and cooling capacities, have been exceeded, or that redundancy and/or runtime requirements are no longer met. In one embodiment, when the status box indicates that there is an error or warning associated with a particular piece of equipment in the layout, the piece of equipment may be highlighted with a color such as red or yellow. In at least one embodiment, when an error or warning occurs, guidelines for correcting the error or warning are provided by either selecting a highlighted piece of equipment or the error or warning message directly.

The rack editor interface 404 will now be described further with reference to FIG. 5D. The rack editor interface includes the tool bar 406, the status box 414 and the full-image viewing box 416 discussed above. Further, the rack editor interface 404 also includes a rack editor box, a product catalog box 422 and a rack content section 424.

The rack editor box 420 shows the front face of each of the equipment racks in the data center layout with the racks being arranged by row. In FIG. 5, two rows of racks 420A and 420B are shown. As shown in FIG. 5, in one embodiment, only the equipment racks are shown in the rack editor box. When a particular rack is selected in the rack editor box, then the contents of the rack appear in the rack content box 424, and components may be added to the selected rack. Racks may be selected in the rack editor box or may also be selected in the full-image view box 416. When a rack is selected in the full-image view box, then the image in the rack editor box will shift, if necessary, to provide a view that includes the selected rack.

The product catalog box 422 provides a comprehensive listing of components that may be used in equipment racks in data centers. The user may select equipment to be included in each rack, and as equipment is selected, it is included in the rack content box 424. The list may include only equipment of a particular manufacturer or may include equipment from several manufacturers. In one embodiment, all necessary hardware and cabling associated with rack equipment may be selected from the product catalog box.

In one embodiment depicted in FIG. 20, a user may review and manage data center resource capacity and available supplied to data center equipment. Many of the features of this embodiment are similar to those described in reference to FIG. 5C above. In addition, FIG. 20 includes capacity group explorer 2002, which presents a logical grouping of data center equipment, such as racks, based on common capacity requirements. This grouping enables a user, such as a data center designer, to manage sets of data center equipment as one collective entity for capacity planning purposes. Representations of individual elements of data center equipment, such as UPS 2004, Rack 2006, and PDU 2008 may present the user with columnar bars depicting various data center resource redundancy and/or runtime measurements and capacity measurements, such as available capacity, utilized capacity, stranded capacity. For example, Rack 2006 has an as-configured potential power and cooling demand of 28.8 kW and a current actual power and cooling demand of 7.92 kW. In other embodiments, these demand or consumption measurements may be matched against as-configured potential power and cooling supply capacity and actual power and cooling capacity to ensure all capacity, consumption, redundancy and runtime requirements are met.

In another embodiment depicted in FIG. 22, rack editor interface 404 may be displayed on a remote or mobile computing device. Rack editor interface 404 includes user interface elements that allow for adding equipment 2202, deleting equipment 2204, editing equipment 2206 and moving equipment 2208. This embodiment further includes data center explorer 2210 and rack editor box 2212. Because rack editor interface 404 may be provided on a remote or mobile computing device, users, such as technicians, may document as-built conditions, verify rack installations, troubleshoot installation in a more efficient manner and perform other rack-oriented activities.

In the depicted embodiment, equipment racks are shown in data center explorer 2210. The rack editor box 2212 shows the front face of the equipment rack currently selected in data center explorer 2210. In another embodiment, rack editor box 2212 may display the rear face of the rack and/or the front face of the rack. In FIG. 22, rack Front is selected in data center explorer 2210 and houses data center equipment sss, PowerEdge 2650, PowerEdge 6650, etc. When a particular rack is selected in data center explorer 2210, the equipment it houses may be modified using user interface elements 2202 through 2208.

The user may add data center equipment to the currently selected rack by actuating user element 2202 and selecting the desired equipment and position with the rack. The user may delete or edit data center equipment associated with the currently selected rack by selecting the desired equipment from data center explorer 2210 and actuating user element 2204 or 2206, respectively. The user may move data center equipment associated with the currently selected rack by selecting the desired equipment from data center explorer 2210, actuating user element 2208 and selecting the desired position within the rack. In another embodiment, the system may recommend a satisfactory or optimum position. It should be appreciated that the user may select particular data center equipment by drilling down in data center explorer 2210 or by searching the data center using a unique identifier, such as a barcode scanned by the remote or mobile computing device. These methods of searching may allow a user, such as a technician, to quickly obtain information concerning specific data center equipment or modify the CMDB while physically located near the equipment.

According to other embodiments, an interactive representation of an identified space within a data center may be implemented using other interface technology. For example, in another embodiment, in addition to the graphical user interface screens shown above, a three-dimensional option is available allowing a user to view the design of a data center in 3D. In one embodiment, a design system includes software code programmed in Java that is used to generate 3D models that are rendered via OpenGL to allow for hardware acceleration. Further, 3D models may be exported from the design system to CAD tools such as AutoCAD, available from AutoDesk of San Rafael, Calif. As described above, security cameras can be implemented into data centers designed using embodiments of the present invention. In one version that has 3D viewing capabilities, security cameras may be included in the design and the 3D view may be used to view a simulation of a camera's view after installation. In one embodiment, networked cameras and other security monitoring devices available from Netbotz Corporation of Austin, Tex. may be used.

As discussed above, with reference to the process shown in FIG. 4, the system 200, and other systems of the present invention, may be used as part of a data center management system. The management system may include the system 200 described above with the management module containing routines to perform management functions, or in other embodiments, the management functions may be performed by a designated manager controller contained in the data center and implemented, for example, in a computer server located in one of the racks of equipment and accessible by a user using a management console.

FIG. 6 shows a block diagram of a management system 500 that may be used in embodiments of the present invention. The management system includes the manager controller 502, the manager console 504, power measurement devices 506, and airflow, humidity and temperature measurement devices 508. It should be appreciated that manager console 504 may be implemented as any computing device, including a remote or mobile computing device. Implementing manager console 504 on a remote or mobile computing device may allow a user, such as a data center manager, to, for example, dispatch work orders to technicians while physically inspecting, installing, moving, and/or changing data center equipment. In addition, in one embodiment, the management system may include power control devices 520 to control application of power to one or more individual devices or racks contained within a data center, and the system may include airflow controllers 521 to control the airflow or supply temperature of an air conditioning unit or to control, for example, perforated tile dampers. As discussed above, the management system may also include one or more security devices 523, including security cameras. The devices of the management system 500 may be directly coupled to the manager controller or may be coupled to the manager controller using a network 522 that may be a dedicated network, may include the Internet, or may include a LAN or WAN contained in the data center. The manager controller may communicate with one or more servers 524 to obtain information from and control operation of the servers.

In one embodiment, the management controller 502 may be implemented at least in part using an InfrastruXure® Manager and/or InfrastruXure® Central available from American Power Conversion Corporation (APC) of West Kingston, R.I., and devices may be coupled to the manager using, for example a controller area network (CAN) bus or an Ethernet network. The power controllers and airflow controllers may be implemented using available known devices that monitor and/or control power and airflow in facilities. Further, in at least one embodiment, the management system 500 may include systems and methods for monitoring and controlling power as described in U.S. Pat. No. 6,721,672 to Spitaels et al, which is incorporated by reference herein. Further, in at least one embodiment that uses in-row cooling devices, the management controller may communicate with the cooling units to control the units to ensure that adequate cooling at specified redundancy levels is being met. Further details regarding the control of in-row cooling units that can be used with embodiments of the invention are discussed in copending U.S. patent application Ser. No. 11/335,901, discussed above and filed on Jan. 19, 2006.

One aspect of the present invention, which will now be described, is directed to a retrofit system and method that is particularly useful for adding new equipment to a facility. The addition of new equipment may include adding equipment to existing racks or may include adding other data center equipment, such as racks or other floor mounted equipment, to a facility. The retrofit system may be a standalone computer system configured to perform processes described herein, or in one embodiment, the retrofit system is implemented using the system 200 described above. Specifically, the builder module 206 of the system 200 may include routines to assist in retrofitting a data center. A process 600 for using the system 200 (or some other system) to retrofit or upgrade a data center will now be described with reference to FIG. 7, which shows a flow chart of the process 600.

In a first stage 602 of the process 600, data related to a present configuration of a data center to be retrofitted is provided to the builder module. The data related to the present configuration may include the data displayed in the room model of FIG. 5 along with additional data that was generated during design of the data center. Further, in one embodiment, the data related to the present configuration may include data generated during an initial design as updated by actual measurements conducted in a facility. For example, the cooling capacity of individual racks may be calculated in an initial design and then updated by the management module once the system is installed and operating. Cooling capacity data may be updated based on actual measurements of airflow from, for example, perforated floor tiles, while the original data may have been calculated based on predicted airflows. In one embodiment, interface 302 of system 300 provides this data center configuration and measured parameter information from database 304.

Information related to the retrofit is then provided in stage 604. The information related to the retrofit may include information similar to that input at stage 304 of process 300 described above, such as type of equipment, characteristics of equipment, number of racks, as well as other information. In addition, a user may designate one or more desired locations in the data center for the installation of new equipment. For example, a user may desire to add five additional servers to the data center, where the servers are similar to and have a related function to existing servers in the data center. The user may choose one or more preferred locations based on power specifications, cooling specifications and physical dimensions of the servers, and based on power capacity, power plug type and/or number, cooling capacity and contents of existing racks displayed on a floor model of the data center. In addition, the user may indicate whether it is acceptable to move existing equipment to accommodate the installation of new equipment. In another example, a user may desire to replace three servers in the data center. The user may choose the servers targeted for replacement and may make other data center modifications with these replacement servers in mind. In addition, the user may indicate whether the replaced equipment should be removed from the data center or moved into an inactive storage room. Tracking inactive equipment may allow a user, such as a data center manager, to quickly ascertain equipment available for provisioning within the data center.

At stage 606, an updated layout for the data center is generated and cooling and power calculations are performed at stage 608 on the updated layout in the manner discussed above at stage 308 of process 300. If the user has designated specific locations for equipment in the data center, the layout may first be determined using these locations, and if problems arise as a result of the desired layout (i.e., lack of cooling for a rack based on equipment or supply policy requirements), then the user will be able to note any such problems once the layout is displayed and can then choose to change the layout. In one embodiment, the system may suggest one or more elements of data center equipment to be placed at one or more locations. In this case, the system may ensure that applicable data center resource supply policies, and data center resource requirements of the suggested equipment, are met. In another embodiment, the system may provide the user with one or a series of satisfactory locations for the equipment based on the data center resource requirements of the equipment and any applicable data center resource redundancy and/or runtime requirements. In another embodiment, the system may provide the user with an optimum location, followed by other satisfactory locations in a decreasing order of preference, for the new equipment based on the data center resource requirements of the equipment and any applicable data center resource redundancy and/or runtime requirements. If a particular layout is not designated by a user, then the system 200 will determine the layout in the manner discussed above with respect to stage 306 of process 300.

At stage 610, an updated floor model is displayed (for example, in the manner shown in FIGS. 5C and 5D), and at stage 612, a user can review the model and either provide feedback (stage 614) or indicate that the design is satisfactory. Once the floor model has been approved by a user, the retrofit design process is complete, and the equipment may be installed, relocated, or removed and parameters of the data center may be measured and updated in the manner described above in stages 318 to 322 of process 300 using for example a data center management system.

In one embodiment, changes to the configuration of the data center such as those designed by retrofit process 600 may be implemented by work order process 1900 as illustrated by the flowchart in FIG. 19. Initially, at stage 1900, a data center configuration change may be made using a graphical user interface such as those discussed with regard to FIGS. 5C and 5D above. Details of the change may be used to construct a set of tasks to carry out the change. These tasks may be grouped together into work orders. Work orders may be human-readable and may include textual instructions as well as pictorial representations. It should be appreciated that a single configuration change, initiated using a visual editor, may be translated into multiple work orders.

At stage 1902, a work order is dispatched to a user for implementation. In one embodiment, this dispatching may be automatic or manual. Automatic dispatching may occur based on a set of preconfigured rules. These rules may consider characteristics of both the work to be performed and the user to whom the work order may be dispatched. Characteristics of the user that may be considered include the user's physical location, physical area of responsibility, recent and current work load, remaining schedule availability and area of expertise. Alternatively, a work order may be automatically dispatched to one or more users in a "round robin" fashion. In another embodiment, a user, such as a data center manager, may access the dispatch UI exposed by work order module 214, discussed in relation to FIG. 3 above, to modify and/or dispatch work orders to users. In still another embodiment, a user, such as a technician, may access the dispatch UI exposed by work order module 214 to modify and/or dispatch work orders to himself.

At stage 1904, a user performs the work dictated by the work order and modifies the work order appropriately. Modification of the work order may include, for example, changing the details of the work performed such as recording installation of an alternative model of equipment, rearrangement of the order of equipment within the rack, reconfiguration of the flow of a data center's resources, such as power, to the equipment, etc. Modification may also include changing the status of the work order. When a user modifies a work order using a remote or mobile computing device, certain information required to complete the modification may be entered using any interface supported by the remote or mobile computing device, including barcode scanning.

In one embodiment, work order module 214 may monitor a data center resource provider, such as power outlet, that is targeted as part of the work order for a change in demand. When a change in demand is detected, such as an increase in the power demanded at a power outlet, the work order may be marked as complete. In another embodiment, the work order is not marked as complete until the data center resource consumption or production benchmark, such as the power consumption benchmark, of the data center equipment specified on the work order is recognized. For example, if a work order calls for the installation of a particular model of blade server, the system may not mark the work order as complete after initial activation of the blade server, but instead may wait until the power consumption history of the blade server matches a known power consumption benchmark for the model of blade server called for in the work order.

In the processes 300 and 600 described above, design and analysis stages are performed after all data is entered as part of an initial design or a retrofit of a facility. In another embodiment, analysis is performed real-time, and user displays are updated as the user enters data into the system.

In embodiments of the present invention, using the processes described above, data center operators are able to determine, in essentially real-time, whether additional equipment may be added to a data center and may also determine locations for the equipment, where data center resource requirements, such as both power and cooling requirements, of the equipment may be met. Further, reports may be generated that indicate to a user or data center manager how much capacity, redundancy and/or runtime is available for each row, for each rack, for each U space position, for each piece of data center equipment and for the facility in its entirety. Still further, as discussed above, in determining overall capacity, systems and methods are able to identify and display stranded capacity, and provide suggestions for reducing the stranded capacity.

In the processes and systems described above, cooling calculations for a data center and for equipment in the data center are performed as part of the design process for the data center, during operation of the data center, and during an upgrade or retrofit of the data center. In embodiments of the present invention, in determining equipment layout and performing cooling calculations, initial information on characteristics of the facility itself are identified to determine if there is sufficient cooling at the facility level. These characteristics include, for example, whether a raised floor or drop ceiling is used as an air plenum, the location and characteristics of air conditioning units (including in-row cooling units), dimensions of the room that are to house the data center, and total power draw of the data center. Based on this information, an initial determination may be made as to whether there is sufficient cooling provided by the air conditioning units for the expected power draw in the room, and if not, a recommendation may be made for additional air conditioning units. For some facilities, desired redundancy and operating margins may be included in this determination.

Once the determination has been made that there is sufficient cooling at the facility level, an analysis is conducted to determine if there is adequate cooling at each rack in the facility and/or at individual pieces of equipment. In at least one embodiment, the cooling capacity of a rack may be determined by increasing the power level of the rack to determine at what additional power level the airflow to the rack becomes inadequate. This can be performed individually for each of the racks in a data center. In different embodiments of the present invention, one or more of a number of different methods may be used to perform the cooling calculations. These methods include, but are not limited to, a computational fluid dynamics (CFD) analysis, a Coarse-Grid CFD analysis (designated as CGCFD), a control volume analysis (designated as CVA), and an analysis based on empirical rules and/or borrowing concepts. Further, in some embodiments, a combination of two or more of the above methods may be used to conduct portions of an overall analysis. In one embodiment, the principle of superposition is used to combine results of portions of an analysis. In particular, in many applications the airflows may be considered to be ideal, where an ideal airflow is inviscid, incompressible, irrotational without any other forces, such as buoyancy. With such an ideal airflow, a complex application can be reduced to a number of less complex applications, analysis of the less complex applications can be performed using one of the methods described herein, and superposition can be used to combine the results of each of the less complex applications to obtain analysis results for the complex application.

A computational fluid dynamics analysis can be used in one embodiment in association with the design and retrofit of a data center to provide detailed results of the cooling performance of a facility, including determining the availability of adequate cooling air at racks and individual pieces of equipment in the facility and determining cooling capacity for each rack. The techniques for implementing a CFD analysis of a data center are known. A CFD analysis must typically be performed by someone particularly skilled in the art, typically requires detailed information regarding the facility and the layout of equipment in the facility, and depending on the complexity of the analysis conducted, and the computing equipment used to conduct the analysis, may take hours or days to run one iteration of the analysis.

In another embodiment, an improved technique for conducting the cooling analysis is used. The improved technique has been developed based on computational fluid dynamics techniques. The improved technique is referred to herein as a Coarse-Grid CFD or simply CGCFD. In a typical CFD analysis, a data center to be analyzed is typically divided into non-uniform cells in the range of one to eight inches on a side. In at least one embodiment, in the CGCFD analysis, a Cartesian grid system of cells that are one foot cubes are used. The use of uniform one foot cells typically reduces the number of cells used in the calculations from a traditional CFD analysis by at least an order of magnitude. Further, uniform grid cells generally make the CFD analysis faster and more reliable relative to a comparable non-uniform cell analysis. Further, other techniques are employed in the CGCFD analysis to improve the computational efficiency of the analysis. These techniques include: the use of simple turbulence models, initializing the analysis with data obtained from the results from a prior similar solution, using two dimensional or partial two dimensional representations when possible to simplify calculations, and tailoring a CGCFD routine for a specific application. The use of two dimensional representations may be used, for example, in a raised floor or ceiling plenum, where pressure gradients in the depth direction can be neglected in the computations.

The tailoring of a CGCFD routine can be used in embodiments of the present invention to significantly improve computational efficiency and improve robustness (for example, so the tool can be made to work reliably in an autonomous way) of the total analysis, and multiple tailored routines may be used in combination to produce a complete analysis. For example, a first CGCFD routine may be tailored for use with different raised floor configurations to determine the output airflow at each perforated floor tile of a raised floor in a data center, and a second CGCFD routine may be tailored for use with a cluster of racks that include two rows of racks with a cold aisle between the rows. The first CGCFD routine may be run to determine the output air at perforated tiles in the cold aisle of the rack cluster, and the second CGCFD routine may use the results of the first routine to determine the airflows and temperatures at inlets and outlets of the racks. The second routine may be run a number of times to account for all of the clusters of racks located in a data center. As equipment is moved, and as different configurations are established within a cluster to optimize cooling performance, the second routine may be run to obtain new cooling data without the need to repeat the first routine, as the airflows from the perforated tiles generally would not change. In some cases, for perforated floor tiles having a large percentage of open area (for example, greater than 50%), it may be desirable to repeat the first routine as air flows may change based on room configuration.

Embodiments of the invention that utilize the CGCFD approach to conduct the analyses of a data center provide advantages over embodiments that utilize a traditional CFD approach. These advantages include computational efficiency and simplification of use. Iterations of cooling calculations using the CGCFD approach may be conducted in a matter of seconds or minutes versus hours or days with a full CFD analysis. Further, the CGCFD routines may be designed to operate with a limited set of input variables, allowing a less-skilled user to conduct analyses using the CGCFD approach. For example, for a CGCFD routine that is tailored to analyze only the raised floor plenum, the input variables may be limited to the height of the floor, location and type of perforated tiles, length and width of the floor, and the locations and characteristics of air conditioning units that provide cooling air to the raised floor. For a CGCFD routine that is tailored to conduct an analysis on a cluster of racks, the input data may be limited to airflow per tile (could be obtained automatically from the output of a separate CGCFD routine or using other methods), the number of racks in the cluster, the power draw of each of the racks, and room environmental details including the temperature of the surrounding environment, ceiling height, the presence of nearby walls, etc. The output data for a cluster of racks may include the input temperature at each server, or other piece of equipment in a rack. In other embodiments, the output data may simply be a measure of the amount of warm recirculated air drawn into each rack. The data may be expressed as an absolute number (e.g. in terms of cfm) or expressed as a fraction of the total air consumed by the rack. A system, such as system 200 described above, may use the output data to determine if the cooling performance of the cluster is satisfactory.

In another embodiment, another improved technique for conducting the cooling analysis is used. The improved technique is referred to herein as a control volume analysis or simply CVA. The control volume analysis may be used in conjunction with a CFD analysis and/or a CGCFD analysis, or may be used as a stand alone process. The CVA technique is similar in some aspects to the CGCFD technique described above, however, further simplification of the analysis process is provided. As will be discussed below, the CVA technique is a computationally efficient technique that is particularly effective for computing the three-dimensional airflow, pressure and temperature distributions in the cold aisle of a raised floor data center. However, the CVA technique is not limited in its use to this application and may be used for other applications as well. The CVA technique can provide output data in essentially real-time, allowing a user to try various locations for equipment as part of an initial design or a retrofit and obtain cooling data for the different locations in real-time.

The CVA technique will be described with reference to FIG. 8, which shows a subsection 700 of a data center. The subsection of the data center includes a cluster of racks that includes a first row of racks 702, and a second row of racks 704, which are located on a raised floor and separated by two rows of perforated tiles 706, 708.

In data centers that have clusters of racks arranged like those in FIG. 8, it is not uncommon for undesirable hot spots to develop even though the total supply of cool air to the cluster should be sufficient to meet the needs of the racks. For example, if the airflow rate through one or more perforated tiles is too great, a rack may be unable to capture all of the tile airflow and some of the cooling air may escape the cold aisle. Racks will generally draw their required air, and in this situation, if a rack can not capture cool air, it may draw hot exhaust air over the top of the rack creating a hot spot. Further, due to widely varying cooling airflow requirements, racks may compete with one another for cooling airflow. In particular, a high-power rack may borrow under-utilized air from an adjacent rack, or in some cases from a rack separated by several tiles. With several racks contained in a cluster, with each having different cooling needs, the airflow patterns and temperature distribution in the cold aisle are complex functions. The CVA technique can be used to simplify the solutions to these complex functions.

In the CVA analysis for the rack cluster of FIG. 8, the airflow and temperature analysis is conducted on the volume of air contained in the cold aisle, between the racks, from the perforated tiles up to a height equal to the top height of the racks. The volume of air is divided into a number of control volumes equal to the number of racks in the cluster. Each control volume is defined as the volume above one of the perforated tiles extending from the perforated tile to the top of the racks. The control volume analysis includes determining for each control volume, the airflow through each of the six faces of the control volume. Once the airflows are known, temperatures and mass species concentrations can be determined for each of the control volumes. In the CVA technique, the temperature analysis can be decoupled from the airflow analysis because, as discussed above, buoyancy forces in the control volumes can be ignored. Similarly, mass species concentrations are not coupled to the airflow solution and may also be computed separately if desired in order to compute the fraction of recirculated air ingested by each rack.

In conducting a CVA analysis in the embodiment described herein, there are several initial assumptions made to simplify the analysis. In other embodiments, the analysis could be changed if these assumptions would not apply. The first assumption is that airflow across each face of a control volume (and therefore into the front face of a rack) is considered uniform. Resulting airflow and temperature values effectively represent an average of the airflow and temperature at each face.

The second assumption is that buoyancy forces within each control volume are negligible. Unless a significant hot spot develops, then there is insufficient heating of the air in a cold aisle to substantially affect airflow patterns, and even if some heating occurs, any buoyancy effects are small compared to the momentum of the airflow from typical perforated tiles.

The third initial assumption is that viscosity and turbulence within each control volume are negligible. In the control volumes, air is introduced through the perforated tiles and is pulled into the racks. The air is not required to change direction rapidly and there is no flow of air parallel to solid objects. Accordingly, viscosity and turbulence may be ignored and the competition of forces driving the airflow reduces to an interplay between pressure and momentum.

The CVA analysis may be further simplified by dividing a cluster of racks into slices of two racks separated by two perforated tiles 718A, 718B. FIG. 9 shows a cluster of six racks 710 that can be divided into three two-rack slices 712, 714, 716. The nomenclature used for identifying racks, and airflows in FIG. 9 is defined in Table 1 below, along with other variables that will be used herein in the description of the CVA technique.

TABLE 1

| | |
|---|---|
| $A_s$, $A_t$ | Control volume side and perforated tile area |
| $C_1$, $C_2$ | Dimensionless empirical constants in the y and x-momentum equations |
| C | Species Concentration |
| CV | Control volume |
| N | Number of 2-rack slices in cluster |
| $\hat{n}$ | Outward unit normal vector |
| $PA_i$, $PB_i$ | Pressure in control volume above perforated tiles $A_i$ and $B_i$ |
| $P_{amb}$ | Ambient reference pressure |
| $M_L$, $M_R$, $M_T$ | z-direction momentum flux terms through left, right, and top surfaces of staggered CV at slice i |
| $TA_i$, $TB_i$ | Temperature in control volume above perforated tiles $A_i$ and $B_i$ |
| $Q_t$ | Airflow rate through each perforated tile |
| $QA_i$, $QB_i$ | Airflow rate through racks $A_i$ and $B_i$ |
| $QAx_i$, $QBx_i$ | Airflow rates in the x-direction above perforated tiles $A_i$ and $B_i$ |
| $Qz_i$ | Airflow rates in the z-direction above perforated tiles between tiles $A_i$ and $B_i$ |
| $QAtop_i$, $QBtop_i$ | Airflow rates in the y-direction above perforated tiles $A_i$ and $B_i$ at top-of-rack height |
| $\vec{V}$ | Velocity Vector |
| α | Linear relaxation factor |
| ρ | Density of air |

At the start of the CVA analysis, the rack airflows $QA_i$, $QB_i$ and the tile airflows are known. The tile airflows can be estimated based on the mean perforated tile airflow for the entire facility or determined using a CFD analysis, a CGCFD analysis, physical measurement, or using one of a number of known programs. The rack airflows can be determined based on characteristics of equipment installed in the rack. In one embodiment, each rack airflow is determined on the basis of the power usage of the rack and using the relationship of 160 cfm per kilowatt of power as discussed above. To determine the airflow patterns, all airflows $QAx_i$, $QBx_i$, $Qz_i$, $QAtop_i$, and $QBtop_i$, and pressures $PA_i$, and $PB_i$ are computed based on the principle of conservation of mass and momentum. To perform this computation, a total of 7n−2 unknowns (5n−2 internal airflows plus 2n pressures) may be determined using a total of 7n−2 equations, where n is the number of 2-rack slices (or length of cluster expressed in tile or rack widths). Optionally, an energy balance or mass species balance can then be used to compute the 2n temperatures or 2n species concentrations based on the airflows.

In one embodiment, rather than solve all equations simultaneously, a semi-simultaneous approach is taken. In this embodiment, the five unknowns for each two-rack slices of a rack cluster, airflows $Qz_i$, $QAtop_i$, and $QBtop_i$, and pressures $PA_i$, and $PB_i$, are first determined simultaneously. During these initial computations, each two-rack slice is considered in isolation, which is the equivalent of having the ends of the slices blocked, such that $QAx_i$ and $QBx_i$ are equal to zero. After an initial sweep through each two-rack slice is complete, the side-to-side airflows ($QAx_i$, $QBx_i$) can be computed based on the calculated pressures within each control volume. The side-to-side airflows affect the pressures, and after computing the side to side airflows, a second computation of the airflows and pressures is conducted for each of the two-rack slices. This process is repeated until there are no significant changes in the computed variables. Once all airflows are known, all temperatures or mass species concentrations can be computed directly without the need to do multiple iterations.

The fundamental equations used to compute the unknowns described above, assuming steady state, incompressible and inviscid fluid flow rely on conservation of mass (m), conservation of momentum (M) conservation of energy (e) and conservation of species concentration (C), and can be written as follows:

$$\int_A (\vec{V} \cdot \hat{n}) dA = 0 \quad \text{(m)}$$

$$\int_A (\rho \vec{V} \cdot \hat{n}) \vec{V} dA = -\int_A p \hat{n} dA \quad \text{(M)}$$

$$\int_A T(\vec{V} \cdot \hat{n}) dA = 0 \quad \text{(e)}$$

$$\int_A C(\vec{V} \cdot \hat{n}) dA = 0 \quad \text{(C)}$$

Applying the conservation of mass equation (m) to the two-rack slices for the conditions described above results in the following equations:

$$Q_t + QA_i + QAx_{i-1} = Qz_i + QAx_i + QAtop_i \quad (1)$$

$$Q_t + Qz_i + QBx_{i-1} = QB_i + QBx_i + QBtop_i \quad (2)$$

Where $QA_i$ is always negative based on the sign convention of FIG. 9.

As will now be described, staggered control volumes are used to formulate the z-momentum equations. Three staggered control volumes 730A, 730B and 730C are shown in FIG. 9A. The number of staggered control volumes is equal to the number of 2-rack slices. The staggered control volumes are the same size as the main control volumes, but are shifted so that they are located midway between opposing racks. The staggered control volumes allow pressure to be considered more easily for each face which is normal to the z-direction. If the original control volumes are used, then each control volume would have one face coplanar with a rack inlet, which is a face over which the pressure is not known and need not be known in the calculations. Applying the conservation of momentum equation (M) in the z-direction to the staggered control volume in slice i results in the following equation:

$$PA_i - PB_i = (\rho/(4A_s^2))\{(Qz_i+QB_i)^2 - (QA_i+Qz_i)^2\} + M_L + M_R + M_T \quad (3)$$

In equation (3), the first term on the right hand side of equation (3) is generally dominant, as it accounts for the effect of rack airflow rates on control volume pressures. $M_L$, $M_R$ and $M_T$ account for losses or gains in z-momentum through the sides and the top of the control volume.

Using an "upwind" estimate for incoming/outgoing z-momentum and assuming that the velocity of the air in the z-direction is negligible above the racks, $M_L$, $M_R$ and $M_T$ are determined using the equations of Table 2 below

TABLE 2

| IF | THEN | ELSE |
|---|---|---|
| $QAx_{i-1} + QBx_{i-1} \geq 0$ | $M_L = -(\rho/(2 A_s^2)) (QAx_{i-1} + QBx_{i-1}) Qz_{i-1}$ | $M_L = -(\rho/(2 A_s^2)) (QAx_{i-1} + QBx_{i-1}) Qz_i$ |
| $QAx_i + QBx_i \geq 0$ | $M_R = (\rho/(2 A_s^2)) (QAx_i + QBx_i) Qz_i$ | $M_R = (\rho/(2 A_s^2)) (QAx_i + QBx_i) Qz_{i+1}$ |
| $QAtop_i + QBtop_i \geq 0$ | $M_T = (\rho/(4 A_s^2)) (QAtop_i + QBtop_i) Qz_i$ | $M_T = 0$ |

The relationship between Y-momentum and pressure may be written using equations (4) and (5) as follows:

$$PA_i - P_{amb} = (\rho/A_t^2)\{C1[Q_t + \tfrac{1}{2}(QAi+QAx_{i-1}-QAx_i-Qz_i)]^2 - \tfrac{1}{2}QAtop_i^2\} \quad (4)$$

$$PB_i - P_{amb} = (\rho/A_t^2)\{C1[Q_t + \tfrac{1}{2}(Qzi+QBx_{i-1}-QBx_i-QB_i)]^2 - \tfrac{1}{2}QBtop_i^2\} \quad (5)$$

In one embodiment, equations (1) through (5) are solved simultaneously for each 2-rack slice of a cluster sequentially using the process 800 shown in FIG. 10. In the first stage 802 of process 800, the user defines $Q_T$ (the airflow through the perforated tiles), the number of 2-rack slices in the cluster, and the power draw of each of the racks. As discussed above, $Q_T$ may be estimated as the mean perforated tile airflow rate for the entire facility or determined separately using, for example, a CFD or CGCFD analysis or other analysis or physical measurement. At stage 804, all airflow variables (except $Q_T$ and the rack inlet airflows) are initialized to zero. At stage 806, equations (1) through (5) are solved simultaneously for each slice. At decision block 808 a determination is made as to whether the equations have been solved for all slices, and if not, stage 806 is repeated. Once the equations have been solved for all slices, then at stage 810, the x-direction airflow variables are updated based on the computed pressures in the control volumes, $PA_i$ and $PB_i$ as discussed below. At stage 812, a determination is made as to whether the computed pressures have changed by more than a predetermined threshold since the previous iteration and if so, stages 806 to 812 are repeated. Once there is no significant change in the computed variables, the process 800 stops at stage 814, at which point the pressures and airflows for all of the control spaces have been determined.

In the process 800, at stage 810, new x-direction airflow values ($QA_{xi}$ and $QB_{xi}$) are determined based on the assumption that the pressure drop between adjacent cells is proportional to the square of the airflow rate using the equations in Table 3.

In one embodiment, because of non-linearities of the equations, adjustments to the x-direction airflow values at stage 810 are achieved gradually by introducing damping into the iterative process and updating the values of $QAx_i$ and $QBx_i$ using the following equations (6) and (7).

$$QAx_i = \alpha QAx_i^{new} + (1-\alpha)QAx_i^{old} \quad (6)$$

$$QBx_i = \alpha QBx_i^{new} + (1-\alpha)QBx_i^{old} \quad (7)$$

In equations (6) and (7), $\alpha$ is a linear relaxation factor. If $\alpha$ is set to zero, then no changes will occur from iteration to iteration. If $\alpha$ is set to 1, then there will be no damping introduced. For smaller values of $\alpha$, more iterations will be required, however, the chances of obtaining a stable solution increase. The particular optimum choice of $\alpha$ is problem specific, however, it has been found that values of $\alpha$ around 0.05 work well in the process described above. Once the airflows are computed using the process above, temperatures and mass species concentrations can be calculated, if desired. It should be noted that control volumes may be used to compute temperatures or concentrations regardless of the method used to initially compute airflows.

The CVA technique described above can be conducted separately, one for each cluster of racks in a facility to obtain a complete cooling analysis of the facility. When a retrofit of a facility is to be done, the control volume analysis may be done for all clusters, or only for those in the vicinity of any changes to the facility.

Three different methods, CFD, CGCFD and CVA, have been described above for determining cooling data in embodiments of the present invention to determine placement of location of equipment in data centers. In still another embodiment, empirical rules are used either alone or in combination with one of the methods described above to determine proper placement of equipment and the adequacy of cooling air. The empirical rules that are used may take a number of different forms, and programs incorporating the empirical rules may be updated as more data is generated to support the empirical rules. In one embodiment, empirical rules are based, at least in part, on the ability of equipment racks to borrow unused capacity from surrounding neighbors. The amount that may be borrowed may be limited to an allowable fraction (or weight) of the unused capacity and the particular allowable fraction may differ depending on a number of variables such as borrower-donor separation distance, tile flow rate, and the total power draw of both the borrower and the donor.

In one particular embodiment, the cooling air available to a given rack is computed based on a weighted summation of the available airflows from airflow sources (i.e., supply

TABLE 3

| IF | THEN | ELSE |
|---|---|---|
| $PA_i \geq PA_{i+1}$ | $QAx_i = A_s\{(PA_i - PA_{i+1})/(\rho C_2)\}^{1/2}$ | $QAx_i = -A_s\{(PA_{i+1} - PA_i)/(\rho C_2)\}^{1/2}$ |
| $PB_i \geq PB_{i+1}$ | $QBx_i = A_s\{(PB_i - PB_{i+1})/(\rho C_2)\}^{1/2}$ | $QBx_i = -A_s\{(PB_{i+1} - PB_i)/(\rho C_2)\}^{1/2}$ | devices, including in-row cooling units, or vents), net of airflows computed to be used by other racks, where the weights associated with the available airflows for a given rack decrease with distance between the rack and the air supply devices or vents. For example, with reference to FIG. 9, the cooling air available to each rack may initially be set equal to the cooling air supplied by the perforated tile in front of the rack, or to reflect possible losses, and provide safety margin, the cooling air available may be set equal to some amount (i.e. 90%) of the total air from the perforated tile. The cooling load for each rack is then subtracted from the available air to provide a net available cooling air figure for each perforated tile and to provide an initial indication of a lack of cooling air for any equipment rack. For each equipment rack, the available cooling air is then increased by assigning to each rack, a percentage of the net available cooling air from nearby perforated tiles. For example, the cooling air available may include 10% of the net available cooling air from a perforated tile associated with either an adjacent rack or a rack across an aisle, and 5% of the net available cooling air from a perforated tile of a diagonal rack or a rack two positions over in a row. The particular percentages or weights used may be changed based on actual results or as a result of analyses conducted. The loads of each rack may then be compared with the total available cooling air to determine remaining cooling capacity and to identify any potential problem racks.

In at least one embodiment, empirical rules may be used in combination with superposition to analyze data centers and provide recommended equipment layouts. Using superposition, complex problems may be broken down into simpler problems that can then be solved using empirical rules.

In one embodiment, empirical rules are established by initially performing a number of CFD analyses on typical rack layouts, and the results of these analyses are used to produce simple equations or look-up tables that can be used in real-time to design layouts of equipment. In such an analysis, the side-to-side airflows, such as those shown in FIG. 9 may be determined for each rack one at a time with one rack turned "on" and all other racks turned "off". The airflows at the ends of a cluster for a number of different configurations may also be determined using CFD. The airflows may be determined for a number of different air intake values for each rack and a number of different values of air flow from the perforated tiles. The total air flows for different configurations can then be determined in real-time using superposition and the stored results. The airflows through the top (in or out) of the volume in front of each rack may then be determined based on conservation of mass. In one embodiment, when the airflow into the top of one of the volumes exceeds some percentage (i.e., 20%) of the total air flow into the rack associated with the volume, then an overheating problem may exist requiring a design around. In other embodiments, mass species concentration analyses may be used in combination with empirical rules to determine what percentage of the total air entering a control volume is recirculated air to determine when an overheating problem may exist.

In determining the airflows for each rack of a cluster, symmetry of the clusters can be used to reduce the number of CFD analyses that need to be performed, and the control volumes discussed above with respect to FIG. 9 may be used to establish a reference grid for the analysis. For example, with reference to the cluster of racks 710 of FIG. 9, CFD analyses need only be performed for Rack $A_{i-1}$ and Rack $A_i$, and the results for each other rack may be determined based on the resulting airflows and the relative position of the racks. For example, the airflows in the cluster associated with Rack $B_{i+1}$ are the same as those associated with Rack $A_{i-1}$ with the direction of some of the airflows changed for corresponding Rack A and Rack B inlet airflow and tile airflow rates.

In one example, which will now be described, the concepts of symmetry and superposition are used in conjunction with CFD analyses and empirical rules to provide a practical real-time solution for determining air flows in a cool aisle. Further, air flows are used to determine a recirculation index (RI) for a row of racks, which can be used to identify potential "hot spots" in a data center. As discussed above, one cooling objective in a data center is to manage the equipment rack inlet air temperatures. The rack inlet air temperatures are dominated by the airflow patterns within the cold aisle and the temperatures within and around the cold aisle. Air drawn in from outside the cold aisle is generally heated to some degree by the rack exhaust and will be hereafter referred to as "recirculated air". While the temperature of the recirculated air is highly application dependent, air that passes directly from a perforated tile to a rack inlet will be very near the supply temperature. Thus, good cooling performance can be achieved if all of the airflow ingested by a rack comes directly from the perforated tiles.

A cluster of racks, which receives its required cooling air exclusively from the perforated tiles within the cluster, represents an autonomous scalable unit from which a larger facility with predictable cooling performance may be constructed. A reasonable requirement is therefore to ensure that racks are adequately cooled by air originating from the racks own cold aisle. Conversely, it is acceptable for the rack to ingest no more than a small fraction of recirculated air.

With the above in mind, the recirculation index (ri) is defined as the fraction of recirculated air ingested by the rack. An ri of 0% implies that all of the rack inlet air was drawn directly from the perforated tiles while an ri of 100% implies that all of the rack inlet air was drawn from outside of the cold aisle. Note that a low ri is sufficient to guarantee cool inlet temperatures; however, a high ri does not guarantee excessively high inlet temperatures.

The concepts of control volumes, symmetry and superposition are used in the present example to determine air flows and ultimately RI for a cold aisle. In using superposition, a sum of velocity potentials (or actual velocity components or total airflows over a consistent area) of simpler, elemental flow solutions is used to obtain a new, composite flow solutions. For example, assume we know the airflow pattern associated with only Rack A1 "on" subject to a particular tile airflow rate and we also know the airflow pattern with Rack B3 "on" subject to the same perforated tile airflow rate. The relevant horizontal airflow components can be added to obtain a solution, which approximates the airflow pattern resulting from Racks A1 and B3 both "on" simultaneously. The airflow pattern resulting from the superposition of the two separate airflow patterns is not exactly the same as the full solution—even for an ideal flow. Using superposition two solutions are added together which individually (and when added together) satisfy conservation of mass criteria. The use of superposition does not guarantee that the combined solution will be the unique solution and the difference is in the boundary conditions. As an illustration of this, consider a 2-rack example. In using superposition, the top airflow condition floats freely as a constant-pressure boundary condition in all cases. In reality, the airflow pattern constructed from superposition may not provide a perfect match to air velocity over the top surface of the cold aisle. Also, when one rack is off, an assumption is made that the face (inlet) of the rack is a symmetry boundary condition (which is consistent with an inviscid analysis). This result creates the opportunity for some flow parallel to the face of the rack, which would probably not exist when the rack is actually drawing air.

In the example, superposition is used to establish only the 3n–2 internal horizontal airflows (n being equal to the length of the row in terms of racks) while end-of-row horizontal airflows are computed based on separate empirical correlations. Vertical airflow components are computed from a mass balance performed on each control volume. The horizontal airflows clearly depend on tile airflow. For example, a rack of a given airflow rate may be able to draw cooling air from a distance of many tile-widths when the perforated tile airflow rate is very low. However, this range of influence is much less as the tile flow rate is substantially increased. (As we know from the non-dimensional argument, the results would be identical if all airflows are scaled by the tile flow rate.) Therefore, the tile airflow rate is included in the analysis; the floor tiles should be "turned on" in the CFD analysis used to correlate airflow patterns. However, if the floor tiles are left "on" and the effect of each rack is considered individually, when the flows for each rack are summed, the sum would have more airflow leaving the top of the cold aisle than in reality. The answer is to correlate only the horizontal airflows and then simply compute the correct airflow into or out of the top of each control volume based on conservation of mass.

It is worth emphasizing that the use of the non-dimensional airflow and, in particular, superposition, simplifies the method. Without these simplifications, there would be many combinations of rack and tile airflows to evaluate and store empirically to cover a range of practical applications.

Based on the above discussion, the complete airflow solutions to any rack layout of interest can be constructed using superposition. Elemental building-block airflow patterns are associated with each rack and each of the four end-of-row airflows are turned on individually as illustrated in FIG. 11 for the case of a 2-rack cluster 1002. It is important to stress that FIG. 11 illustrates which airflow boundary conditions are turned on and off in each of the elemental airflow solution to yield the total solution with all airflow boundary conditions "on". Each of arrows 1004a to 1004f represents one of the airflows. It is the airflow components internal to the cold aisle that are actually being combined. There are, in general, a total of 2n+4 elemental solutions for any layout, which makes up a complete airflow solution. Obviously, fewer elemental solutions are required if some racks have zero airflow and the ends of the cold aisle are sealed (e.g. with doors).

The elemental airflows used with superposition may be determined in any manner including physical testing. In the present example, CFD modeling for the cold aisle is performed using the following boundary conditions:

Fixed velocity of air leaving the computational domain over the area of a rack face for any rack which is "on"

Fixed velocity entering or leaving the domain over the area of the end of the rows for any end-of-row flow "on".

The top of the solution domain is "open" for air to enter or exit to the surrounding environment held at constant pressure.

All other surfaces are "symmetry" surfaces.

As stated above, there are in general 2n+4 elemental solutions for each row length; 2n elemental solutions associated with each rack turned on plus four end-of-row elemental solutions. Each elemental solution covers a range of dimensionless flow rates so that any arbitrary, but practical, rack or end airflow rate can be considered. So, the task is reduced to determining and storing the 3n–2 internal horizontal control volume airflows over an appropriate range of dimensionless airflow rates.

Because of the geometric symmetry of a cluster of racks, only the 3n–2 internal airflows for approximately one quarter of the 2n+4 rack and end-of-row boundary conditions are considered and stored; n/2+1 boundary conditions if n is even and (n+1)/2+1 if n is odd. The remaining internal airflows are determined from an appropriate reinterpretation of the smaller data set by changing variable indices and signs. In addition to being efficient, this use of symmetry, forces the final output from the rack cooling performance tool to be perfectly symmetric. Each of these boundary conditions are driven individually through a range of dimensionless airflow rates while keeping track of all of the "response" airflow rates internal to the cluster. The result can be summarized in a plot of "response" airflow rates; one plot for each elemental boundary condition.

As an example, internal horizontal airflows associated with boundary condition Rack A1 for an n=2 cluster are shown in FIG. 12. There are 4 curves in FIG. 12 because there are 4 horizontal internal airflows associated with an n=2 cluster of racks. All of these curves can be conveniently approximated with a least-squares fit to a cubic polynomial of the generic form $$Q^* = c_1(QRA_1^*) + c_2(QRA_1^*)^2 + c_3(QRA_1^*)^3 \qquad (8)$$

so that only the coefficients $c_1$, $c_2$, and $c_3$ must be stored for all airflows associated with all unique boundary conditions for all n's. Storing the "response" airflow as an equation offers the additional benefit compared to a simple look-up table in that results outside the domain of FIG. 12 are automatically interpolated.

The process involved in compiling the curves in FIG. 12 and the constants of Equation 8 is repeated for all unique boundary conditions for all n's considered. Determining all internal airflow correlations, for example, up to n=30 requires several hundreds of CFD runs. Therefore, in at least one embodiment, the process of converting the raw CFD data into the curve-fit constants of Equation 8 is automated. In at least some examples above, the flow in the cold aisle is considered to be ideal with no viscosity or turbulence. To verify this assumption, sample CFD cases were run with turbulence and viscosity included, and little difference was detected between models that included viscosity and turbulence and those that did not.

The discussion above describes a process for all internal cold-aisle airflows for any row length, perforated tile airflow, and rack airflow distribution assuming that that the end airflow is known. A process for predicting the end airflow will now be described. Unlike the airflow within the cold aisle, the end airflow is strongly coupled to the airflow in the surrounding room environment. Buoyancy forces can be significant; direct superposition of rack-induced airflows may not work well and the end airflows do not depend simply on the dimensionless rack airflow rates. The end airflow can still be determined using empirical correlations of CFD data; however, a relatively large number of CFD simulations typically should be performed in order to achieve reasonable accuracy over a useful range of actual layouts. A comprehensive model for end airflow, which takes into account different geometric and thermal environments, may be included in other embodiments. In one embodiment, described herein, a method includes predicting end airflow as a function of rack power and airflow distribution for any row length and perforated tile flow rate while assuming a fixed room environment. The example environment is large and free of other racks or objects. Air is supplied at 60° F. and is exhausted uniformly over a 14 ft-high ceiling. As discussed above, under ideal-flow conditions, we can expect air velocity at points near the racks to scale with the dimensionless rack inlet velocities. Further, as discussed above these "response" velocities vary nearly linearly with dimensionless rack flow rate (or velocity). It is, therefore, reasonable to estimate the dimensionless end airflows based on the following expression:

$$QAx_0^* = a_0 + a_{A1}QRA_1^* + a_{A2}QRA_2^* + \ldots + a_{An}QRA_n^* + a_{B1}QRB_1^* + a_{B2}QRB_2^* + \ldots + a_{Bn}QRB_n^* \quad (9)$$

where $QAx_0^*$ is one of four dimensionless end airflows for a cluster and the coefficients $a_{Ai}$ and $a_{Bi}$ effectively weight the relative importance of each rack on the end airflow. The weighting coefficients associated with racks located near the end of the row will be much larger than those associated with more interior racks. Further, empirically it is found that only racks in the first four or five positions nearest the end of the row need be retained in Equation 9. For the fixed conditions considered, the constant $a_0$ is negative, implying that the flow is "out" (driven by buoyancy) when there is zero rack airflow.

To determine the values of the coefficients in Equation 9 for a particular set of room environment and cluster geometry, many (on the order of 100) CFD simulations may be performed at a number of different perforated tile flow rates. A large pool of rack power values may be created from which the many CFD simulations draw rack power and airflow data from, either randomly or systematically. The rack power values may be based on the frequency distribution of actual data center racks as determined from a survey. The rack power and airflow values used in the CFD simulations may be scaled as necessary to achieve practical total supply-to-equipment airflow ratios in the range of, for example, 0.9 to 3 for each perforated tile flow rate considered. The CFD data is then used to determine a least-squares fit of the coefficients in Equation 9 for each tile flow rate considered.

In summary, a simple end airflow model has been described which accurately accounts for a non-uniform distribution of rack airflow and power for a fixed set of room conditions. In at least one embodiment, the model is generalized to include the effects of geometric environment, the thermal environment, and supply airflow rate. The effects of the end airflow penetrate only a few rack distances down the row; for longer row lengths predictions for the majority of the racks in the cluster will be good even if the end airflow model is not as accurate as desired.

The airflow into or out of the top of each control volume has been left "floating" as necessary degrees of freedom in the above example. Now, with all of the horizontal airflows computed as discussed above, the airflow at the top of each control volume is computed based on the conservation of mass. With reference to FIG. 13, using dimensional quantities, the equations for A-row and B-row control volumes are determined using equations 9(a) and 9(b).

$$QA\text{top}_i = Q_T - QRA_i + QAx_{i-1} - Qz_i - QAx_i \quad (10a)$$

$$QB\text{top}_i = Q_T - QRB_i + QBx_{i-1} + Qz_i - QBx_i \quad (10b)$$

Applied to all control volumes, equations 9a and 9b represent a total of 2n equations. At this stage, there is only one unknown per equation ($QA\text{top}_i$ and $QB\text{top}_i$) so they may be solved sequentially.

At this point, all airflows within the cold aisle are known for the example. What remains is to track the airflow into each rack so that its origin may be identified and the recirculation index (RI) can be calculated for each rack. As discussed above, RI is the fraction of recirculated air ingested by a rack. The recirculated air can enter the cold aisle at any point where there is inflow at the ends of the rows or along the top of the cold aisle. Further, the warm recirculated air need not directly enter the cold aisle via the control volume immediately adjacent to a rack of interest; it may enter anywhere, travel anywhere the airflow patterns take it, and end up at the inlet of any rack.

To compute RI for each rack the cool supply air is distinguished from the warm recirculated air at all points in the cold aisle. Mathematically, this is accomplished by defining the concentration of recirculated air at any point in the cold aisle using Equation 11.

$$C_{recirc} = (\text{mass of recirculated air})/(\text{total mass of air}) \quad (11)$$

It follows from Equation 11 that the supply airflow emerging from the tiles has a $C_{recirc} = 0$ and that anywhere the recirculated air enters the cold aisle along the sides or top of the cold aisle and $C_{recirc}$ may be set equal to 1. In practice, $C_{recirc}$ may be set to a value less than 1 for the ends of the cold aisle recognizing that, on average, the top is generally much warmer than the ends of the cold aisle. Accordingly, in one embodiment, $C_{recirc} = 0.5$ for any inflow at the ends of the cold aisle.

The recirculated air can be assumed to have the same physical properties as the cool supply air so that it has no effect, e.g. due to a density difference, on the airflow patterns in the cold aisle.

Now consider a small volume just covering a rack inlet. Equation 11 applied to this volume represents the average $C_{recirc}$ over this volume. Dividing the numerator and denominator by a small time increment $\Delta t$ and taking the limit as $\Delta t \to 0$, demonstrates that the average $C_{recirc}$ over a rack inlet is precisely the rack recirculation index. Thus, to determine the RR's for each rack the average $C_{recirc}$ over each rack inlet is determined. Referring back to FIG. 8, we can estimate the RR for each rack as the average $C_{recirc}$ of the control volume immediately adjacent to the rack of interest. $C_{recirc}$ over all 2n control volumes can be computed from the conservation of mass of the recirculated air using Equation 12.

$$\sum_{\substack{All\ CV \\ Faces}} C_{recirc} Q = 0 \quad (12)$$

where Q is the total airflow rate through each control volume face and is a known value at this stage of the calculation.

FIG. 13, shows control volumes 1008 and 1010 of a transverse section of a cold aisle 1006. Equation 12 is applied to the control volumes 1008 and 1010. For convenience, we label the $C_{recirc}$ crossing each control volume surface with same convention used for airflows while dropping the "recirc" subscript. The result is $$C_T Q_T + (CAx_{i-1})(QAx_{i-1}) = (CRA_i)(QRA_i) + (CAx_i)(QAx_i) + (Cz_i)(Qz_i) + (CA\text{top}_i)(QA\text{top}_i) \quad (13a)$$

$$C_T Q_T + (CBx_{i-1})(QBx_{i-1}) + (Cz_i)(Qz_i) = (CRB_i)(QRB_i) + (CBx_i)(QBx_i) + (CB\text{top}_i)(QB\text{top}_i) \quad (13b)$$

Equations 13a and 13b are not solved directly because the number of $C_{recirc}$ values exceeds the number of equations. Estimating each $C_{recirc}$ as the average $C_{recirc}$ from the "upwind" control volume, results in a proper balance of 2n unknown $C_{recirc}$'s and 2n equations. Based on this "upwind" approach, the appropriate $C_{recirc}$ values are inserted into Equations 13a and 13b after the airflow patterns in the cold aisle have been computed thereby establishing the direction of airflow crossing each face of each control volume.

TABLE 4

$C_{recirc}$ Settings Based on Airflow Direction

| Airflow | Upwind Value of $C_{recirc}$ | |
|---|---|---|
| | Airflow ≥0 | Airflow <0 |
| $Q_t$ | 0 | 0 |
| $QAx_i$ | $CA_i$ | $CA_{i+1}$ |
| $QBx_i$ | $CB_i$ | $CB_{i+1}$ |
| $Qz_i$ | $CA_i$ | $CB_i$ |
| $QAtop_i$ | $CA_i$ | 1 |
| $QBtop_i$ | $CB_i$ | 1 |

Table 4 shows the appropriate upwind values of $C_{recirc}$ to be used in Equations 13a and 13b where the $CA_i$ and $CB_i$ are the average $C_{recirc}$ over the relevant "A" or "B" control volumes respectively. Not shown in the table are the settings for $QAx_i$ and $QBx_i$ at the end of the row, i.e. $Qax_0$, $QBx_0$, $QAx_n$, and $QBx_n$. In this case $C_{recirc}$ may be set to 0.5 as discussed above for any "inflow".

With the values of $C_{recirc}$ taken from Table 4, the 2n Equations represented by 13a and 13b may be solved simultaneously for the 2n $CA_i$ and $CB_i$ values. These simple linear equations can be solved without iteration virtually instantaneously for any practical row length using common computing hardware. Finally, as discussed above, the computed $CA_i$ and $CB_i$ values may be directly interpreted as the recirculation index of the adjacent "A" and "B" racks respectively. In other embodiments, because of the similarity between the energy and concentration equations, bulk average temperature could be determined over each control volume instead of RI following a very similar procedure.

A summary of a process 1050 for determining recirculation index for a cluster of racks using the methodology described above will now be provided with reference to FIG. 14. In a first stage 1052 of the process, the row length, tile airflow, rack airflow and rack power are defined for a cold aisle to be analyzed. Next, in stage 1054, empirical data used for computing airflows is imported from a CFD analysis as described above. The end airflows are then determined at stage 1056 based on details of the cluster and details of the room environment. All horizontal airflows are then determined at stage 1058. At stage 1060, horizontal airflows induced by the 4 end airflows are computed, and at stage 1062, complete horizontal airflows are computed by adding the airflows from stages 1058 and 1060. Vertical airflows are computed at stage 1064, and then at stage 1066, the recirculation index may be determined for each rack by solving a set of conservation equations for the recirculated air as described above.

In one embodiment, to determine cooling capacity for a given rack based on the recirculation index, a threshold recirculation index is first established, below which a design is considered unsatisfactory. For each rack, after a satisfactory design is achieved, the power of the rack is increased until the recirculation index of the that rack (or any other rack) reaches the threshold level, and the power at which that occurs represents the maximum cooling capacity for the rack. A similar method for determining cooling capacity can be used with other analyses described herein, including the analysis using capture index values described below.

In other embodiments, the control volume and superposition methods described above may be modified. These modifications may include the use of more complex statistical methods (e.g., the use of neural networks) to determine end airflow conditions from large pools of CFD data. Further, the number of control volumes may be substantially increased to improve accuracy and resolution of computed variables. In particular, the latter improvement would allow airflow variations at various rack elevations (e.g., due to a variety of equipment installed in a rack) to be considered. The basic methodology could further be modified to include layouts beyond the scope discussed above including layouts involving an arbitrary number of perforated tiles of arbitrary flow rate, an arbitrary cold aisle width, arbitrary rack dimensions or other such variations from examples discussed above.

In processes described above, cooling analyses of a data center have focused primarily on determining airflows in the cool aisle for a cluster of racks located in a data center having a raised floor. Embodiments described above, however, are not limited for use in data centers having raised floors, and aspects of the embodiments are also applicable to data centers that do not include raised floor cooling systems. At least one embodiment described above provides a decoupling of the cold aisle from the remainder of the data center to compute airflows in the cold aisle. The effect of the room environment is then built back into the analysis using end-of-row airflows that are computed, for example, in separate CFD calculations that may be computed offline and made available through look-up tables or empirical correlations. As described below, in a similar manner to that described above, a hot aisle in a data center can be analyzed by decoupling the aisle from the remainder of the room and later building the effects of the room environment back into the analysis.

In additional embodiments that will now be described, processes are provided for evaluating a cluster of racks based on airflows that occur in a hot aisle for a cluster of racks. In at least one version of the additional embodiments, a raised floor data center is not used, but rather, cooling is provided using in-row cooling units as described above. In one particular process of one embodiment, a capture index (CI) is calculated and used to analyze a cluster of racks in a data center. The capture index is used in one embodiment with a row or cluster of racks having one or more in-row cooling units, and the capture index is defined as the percentage of air released by a rack into a hot aisle, which is captured by cooling units bounding the hot aisle. The CI may be considered as a complementary metric to the RI described above for use with the hot aisle. However, CI techniques may also be used with cold aisle analysis as discussed further in U.S. Provisional Application 60/897, 076, filed on Jan. 24, 2007 which is hereby incorporated herein for all purposes. The CI is useful when the focus of a design is to keep the hot air within the hot aisle. As discussed above, rack inlet temperatures are typically the ultimate cooling metric, however, if all of the hot air is captured in the hot aisle, the rest of the data center (including rack inlets) can be designed and controlled to remain at "room temperature."

The cold-aisle capture index is defined as the fraction of air ingested by the rack which originates from local cooling resources (e.g., perforated floor tiles or local coolers). The hot-aisle capture index is defined as the fraction of air exhausted by a rack which is captured by local extracts (e.g., local coolers or return vents). CI therefore varies between 0 and 100% with better cooling performance generally indicated by greater CI values. In a cold-aisle analysis, high CI's ensure that the bulk of the air ingested by a rack comes from local cooling resources rather than being drawn from the room environment or from air which may have already been heated by electronics equipment. In this case, rack inlet temperatures will closely track the perforated-tile airflow temperatures and, assuming these temperatures are within the desired range, acceptable cooling will be achieved. In a hot-aisle analysis, high CI's ensure that rack exhaust is captured locally and there is little heating of the surrounding room environment.

While good (high) CI values typically imply good cooling performance; low CI values do not necessarily imply unacceptable cooling performance. For example, consider a rack in a raised-floor environment which draws most of its airflow from the surrounding room environment rather than from the perforated tiles. The rack's cold-aisle CI will be low; however, if the surrounding room environment is sufficiently cool, the rack's inlet temperature will be acceptable anyway. However, in this case, the rack's cooling needs are met by the external room environment rather than perforated tiles within the rack's cluster. If this process is repeated many times across the data center, facility cooling will be complex and unpredictable. Thus, high CI values lead to inherently scalable cluster layouts and more predictable room environments.

Note that, although CI has been defined above as a rack-level quantity relative to local cooling resources, the definition of CI could be extended to any grouping of inlets and outlets, for example, a single server with reference to a single perforated tile. In this case, the metric would indicate the fraction of airflow ingested by the server which originated from the single perforated tile.

In one embodiment, the use of chemical concentrations with, for example a CFD analysis, can be used to quantitatively determine CI for both a hot aisle and a cold aisle. For the hot aisle, the exhaust of each rack is identified in such an analysis as a separate species having the same properties as air, so as not to change the physics of airflow. The fraction of hot air released from $rack_i$ (identified as $C^i$) which is captured by an in-row cooler identified as $cooler_j$ may be computed using Equation 14 below.

$$f_{ij} = C_j^i (Q_{coolerj}/Q_{racki}) \quad (14)$$

where:
$C_{ji}$ is the concentration of at the inlet of cooler j
$Q_{coolerj}$ is the airflow rate (e.g. in cfm) through $cooler_j$
$Q_{racki}$ if the airflow rate (e.g. in cfm) through $rack_i$ As an example, if the cooler and rack airflow are equal, and the concentration of exhaust air $C^i$ from rack i at the cooler inlet is measured to be 0.5, then this implies that half of the exhaust air from rack i is captured by cooler j. In a hot aisle having N coolers, then the capture index (CI) is the sum of all of the $f_{ij}$'s over all N coolers and can be expressed using Equation 15 below.

$$CI_i = \sum_{j=1}^{N} C_j^i \frac{Q_{coolerj}}{Q_{racki}} \quad (15)$$

As will now be described, with reference to FIG. 15, which shows a cluster of racks 1080, a set of empirical rules can be used to determine the CI for each rack 1082 of the cluster. As shown in FIG. 15, the resulting CI values may be displayed on a display with the associated racks. In one example, racks having a CI less than 60% are identified in red indicating a warning, racks having a CI between 60% and 80% are indicated in yellow as a caution, and racks having a CI greater than 80% are indicated in green indicating that the CI is satisfactory.

In one embodiment, a large pool of CFD runs can be performed to establish and refine empirical rules. In other embodiments, neural networks and other techniques may be used to refine rules. The cluster 1080 includes two rows (row A and row B) of parallel racks that exhaust air to a common hot aisle 1084. Each Rack is labeled A1-A6 and B1-B7, identifying the row and position in the row of the rack, and for the example shown each rack has a power draw of 2 kW. The cluster also includes in-row cooling units 1086. In FIG. 15, a number of half-rack cooling units 1086 are shown, but embodiments of the invention may also be used with full-width rack cooling units or other devices. The half-rack cooling units used in the example associated with FIG. 15 have a nominal cooling capacity of 17 kW. Also shown in FIG. 15 is the CI in terms of percentage for each rack. The CI is shown as a percentage and indicates for each rack, the percentage of its exhaust air that is captured by one of the cooling units.

The CI is determined based on the concept that all rack-cooling unit interactions depend only on the magnitude of airflow associated with the racks and cooling units and their relative geometric positions. Each rack location can be thought of as having a certain potential to supply airflow to other rack locations. This potential varies inversely with the distance of separation. For example, rack A1 in FIG. 15 could potentially supply a large portion of its airflow to the area near rack A2. However, much less of rack A1's airflow could make its way to position A6. Further, the amount of airflow a rack can supply to other locations is in direct proportion to its own total airflow. The net airflow which can be supplied to a particular rack location A1 can be represented using Equation 16 below.

$$(Q_{Ai})_{net} = (Q_{Ai})_{self} + \sum_{\text{all other racks } j} (Q_{Aj})_{self} Ae^{-B\Lambda x} + \quad (16)$$

$$c \left\{ (Q_{Bi})_{self} + \sum_{\text{all other racks } j} (Q_{Bj})_{self} Ae^{-B\Lambda x} \right\}$$

where
$(Q_{Ai})_{net}$=The net maximum airflow that can be supplied to location Ai including contributions from all other racks.
$(Q_{Ai})_{self}$=The actual airflow supplied by the rack at location Ai.
A=empirical constant.
B=empirical constant.
C=empirical "coupling" constant for accounting for effects from opposite row.

The net maximum airflow that can be supplied to various locations in the B row is computed using a similar expression. Finally, the same expression is used to compute the net maximum airflow, which can be captured at any rack location—with the sum over all coolers instead of racks. The CI is then estimated as the ratio of net airflow captured and net airflow supplied at any location expressed as a percentage and with values capped at 100%. The constants A, B, and C are selected to provide the best statistical fit to benchmark CFD data. Different values of the constants may be used to account for alternative configurations including different cooler types, different average rack power or peak-to-average power ratios and alternative hot-aisle spacing, row lengths, or room environments. As an example, consider a cluster of average power racks with modest rack-to-rack power variations. The cluster is 14 ft. long, contains a 3 ft. wide hot aisle, and is assumed to be in a fairly tightly packed data center environment with a 12 ft. ceiling height. In this case, reasonable predictions are made with the empirical constants taken as A=0.56, B=0.33, and C=0.65.

In the embodiment described above, the CI is calculated for a cluster of racks having uniform depth and width. In other embodiments, the same processes may be used for racks of non-uniform depth and width. In one embodiment, the CI calculations described above are programmed into a Microsoft Excel Spreadsheet program that allows a user to add and move cooling units to see the effect of different numbers of cooling units and their placements. In other embodiments, the process for determining CI described above may be incorporated into data center design and management systems, such as system 200 discussed above.

In the embodiment above, an exponential expression is used for modeling the rack and cooler interactions. In other embodiments, other expressions may be used, such as a polynomial or any other mathematical expression which contains a number of parameters which may be tuned to provide the best fit to benchmark performance data. Further, different curves and/or different coefficients may be used for the portion of the calculation associated with determining air supplied by racks than used in the portion of the calculation used for determining air captured by cooling units. In another embodiment, the rules may be further refined to address specific situations. For example, a Rack A may have no effect on another Rack B where a third rack C is located between Rack A and Rack B and has greater airflow than either Rack A or Rack B.

In still another embodiment, the effects of the ends of rows may be accounted for explicitly in hot aisle and cold aisle CI analysis. Separate CFD simulations may be conducted to determine the net inflow or outflow of air at each end of a row for given layouts of racks and cooling units. The results of the CFD simulations may be incorporated into the empirical methods described above to determine CI for racks in a cluster. The results of the CFD simulations can be used to provide correct airflow estimates at the ends of the row, while one of the algorithms discussed above may be used to determine CI at more interior portions of the row. Similarly, the effects of a missing rack or racks may be simulated using CFD with the results incorporated into the empirical methods.

The capture index method of analysis discussed above provides a rack-by-rack, or local, cooling performance metric for equipment racks in a data center. In addition to using CI as a rack-level metric in a hot aisle analysis or cold aisle analysis, in another embodiment, cluster-wide performance metrics are determined, and the overall cooling performance of the cluster may be determined based on both the CI metric and the global metric. The cluster-wide performance metrics indicate whether the cluster as a whole will have adequate cooling performance. The CI identifies which racks are not having their exhaust airflow adequately captured. If a rack having a low CI is a low power rack, this may not result in a problem. Furthermore, a rack may have a relatively high CI, yet still cause problems if it is a high power rack with a high outlet temperature. In one embodiment, for a hot aisle analysis the global metric that is used is a determination of the net power which escapes the hot aisle. The net escaped power can be determined using equation 17.

$$\sum_{all\ racks\ i} (1 - CI_i)P_i \qquad (17)$$

where,
$CI_i$=the capture index for rack i expressed as a fraction (rather than percentage), and
$P_i$=the power of rack i.

The net escaped power determined by equation 17 may be correlated to maximum cluster inlet temperatures (e.g., a net escaped power of 25 kW may imply a maximum cluster rack inlet temperature of seventy-nine degrees F.) for clusters of particular geometric layouts (e.g., hot aisle width, row length, etc.), room environments and rack and cooler details (e.g., cooling unit flow rate and rack airflow/power (cfm/kW)). Accordingly, the net escaped power may be used to determine the highest rack inlet temperature.

In other embodiments, other techniques described above for calculating airflows in a cool aisle may be applied to a hot aisle or cold aisle analysis to determine CI, including the use of CFD, CGCFD and control volumes. The use of superposition may be less applicable in hot aisle analyses because the airflow patterns are not ideal. In still another embodiment, a process 1100 is provided for determining CI in a hot aisle using a CFD analysis. The CFD analysis is performed only on the hot aisle itself and end of row airflows are determined separately and may be patched into the CFD solution. Common computer hardware can be used to conduct such a CFD analysis in 10 to 20 seconds. The process 1100 is shown in flowchart form in FIG. 16. In a first stage 1102 of the process 1100 data related to the layout is loaded either manually, read from a database, or in any other manner. The data related to the layout may include row length, power draw and airflow for each rack, rack dimensions, cooling unit types, locations and flow rates, hot aisle widths and room environment details (i.e., size, temperatures).

At stage 1104 of the process 1100, hot-aisle end of row airflows are determined using best-fit curves, or look-up tables based on prior CFD studies. Hot aisle end of row calculations may be performed using the same techniques used to determine cold aisle end of row airflows with the input rack airflow provided as a positive value and the cooling units airflow input as a negative value. At stage 1106, a CFD analysis of just the hot aisle is performed using results of the end airflow analysis of stage 1104 and with the top of the hot aisle taken as a constant-pressure boundary. In the analysis, the exhaust air for each rack is "tagged" with a particular concentration. At stage 1108, the CI for each rack is determined based on the ratio of captured and supplied airflows computed by equation 16 and the results of stage 1106. The global cluster cooling metric may also be determined at this point using equation 17. At stage 1110, the rack CI's and the global cluster cooling metric can be used to determine if cooling for the cluster is adequate.

In addition to the cooling analysis methods discussed above, which provide real-time analysis of data centers, additional cooling analysis methods may be used in embodiments of the invention. These additional methods include a panel method, a potential analysis method, flow network/zonal modeling, principal component analysis or a combination of any of these and the methods discussed above. These additional cooling analysis methods are generally known to those of skill in the art.

Various embodiments according to the invention may be implemented on one or more computer systems as discussed above. These computer systems may include cellular phones, personal digital assistants and/or other types of mobile computing devices. Moreover, a computer system may include any sort of computing device such as a personal computer, a workstation, a mainframe, a networked client, a server, media servers and application servers. For example, system 200 may be implemented in a single computer system or in multiple computer systems. These computer systems may be, for example, general-purpose computers such as those based on Intel PENTIUM-type processor, Motorola PowerPC, Sun UltraSPARC, Hewlett-Packard PA-RISC processors, or any other type of processor.

For example, various aspects of the invention may be implemented as specialized software executing in a general-purpose computer system 900 such as that shown in FIG. 17. The computer system 900 may include a processor 903 connected to one or more memory devices 904, such as a disk drive, memory, or other device for storing data. Memory 904 is typically used for storing programs and data during operation of the computer system 900. The computer system 900 may also include a storage system 906 that provides additional storage capacity. Components of computer system 900 may be coupled by an interconnection mechanism 905, which may include one or more busses (e.g., between components that are integrated within a same machine) and/or a network (e.g., between components that reside on separate discrete machines). The interconnection mechanism 905 enables communications (e.g., data, instructions) to be exchanged between system components of system 900.

Computer system 900 also includes one or more input devices 902, for example, a keyboard, mouse, trackball, microphone, touch screen, and one or more output devices 907, for example, a printing device, display screen, speaker. In addition, computer system 900 may contain one or more interfaces (not shown) that connect computer system 900 to a communication network (in addition or as an alternative to the interconnection mechanism 905).

The storage system 906, shown in greater detail in FIG. 18, typically includes a computer readable and writeable nonvolatile recording medium 911 in which signals are stored that define a program to be executed by the processor or information stored on or in the medium 911 to be processed by the program to perform one or more functions associated with embodiments described herein. The medium may, for example, be a disk or flash memory. Typically, in operation, the processor causes data to be read from the nonvolatile recording medium 911 into another memory 912 that allows for faster access to the information by the processor than does the medium 911. This memory 912 is typically a volatile, random access memory such as a dynamic random access memory (DRAM) or static memory (SRAM). It may be located in storage system 906, as shown, or in memory system 904. The processor 903 generally manipulates the data within the integrated circuit memory 904, 912 and then copies the data to the medium 911 after processing is completed. A variety of mechanisms are known for managing data movement between the medium 911 and the integrated circuit memory element 904, 912, and the invention is not limited thereto. The invention is not limited to a particular memory system 904 or storage system 906.

The computer system may include specially-programmed, special-purpose hardware, for example, an application-specific integrated circuit (ASIC). Aspects of the invention may be implemented in software, hardware or firmware, or any combination thereof. Further, such methods, acts, systems, system elements and components thereof may be implemented as part of the computer system described above or as an independent component.

Although computer system 900 is shown by way of example as one type of computer system upon which various aspects of the invention may be practiced, it should be appreciated that aspects of the invention are not limited to being implemented on the computer system as shown in FIG. 17. Various aspects of the invention may be practiced on one or more computers having a different architecture or components shown in FIG. 17. Further, where functions or processes of embodiments of the invention are described herein (or in the claims) as being performed on a processor or controller, such description is intended to include systems that use more than one processor or controller to perform the functions.

Computer system 900 may be a general-purpose computer system that is programmable using a high-level computer programming language. Computer system 900 may be also implemented using specially programmed, special purpose hardware. In computer system 900, processor 903 is typically a commercially available processor such as the well-known Pentium class processor available from the Intel Corporation. Many other processors are available. Such a processor usually executes an operating system which may be, for example, the Windows 95, Windows 98, Windows NT, Windows 2000 (Windows ME) or Windows XP operating systems available from the Microsoft Corporation, MAC OS System X operating system available from Apple Computer, the Solaris operating system available from Sun Microsystems, or UNIX operating systems available from various sources. Many other operating systems may be used.

The processor and operating system together define a computer platform for which application programs in high-level programming languages are written. It should be understood that embodiments of the invention are not limited to a particular computer system platform, processor, operating system, or network. Also, it should be apparent to those skilled in the art that the present invention is not limited to a specific programming language or computer system. Further, it should be appreciated that other appropriate programming languages and other appropriate computer systems could also be used.

One or more portions of the computer system may be distributed across one or more computer systems coupled to a communications network. For example, as discussed above, a computer system that performs build-out functions may be located remotely from a system manager. These remote computer systems also may include remote general-purpose computer systems and/or remote computing devices. For example, various aspects of the invention may be distributed among one or more computer systems configured to provide a service (e.g., servers) to one or more client computers, or to perform an overall task as part of a distributed system. For example, various aspects of the invention may be performed on a client-server or multi-tier system that includes components distributed among one or more server systems that perform various functions according to various embodiments of the invention. These components may be executable, intermediate (e.g., IL) or interpreted (e.g., Java) code which communicate over a communication network (e.g., the Internet) using a communication protocol (e.g., TCP/IP). For example, one or more database servers may be used to store device data that is used in designing layouts, and one or more servers may be used to efficiently perform cooling calculations associated with embodiments of the present invention.

It should be appreciated that the invention is not limited to executing on any particular system or group of systems. Also, it should be appreciated that the invention is not limited to any particular distributed architecture, network, or communication protocol.

Various embodiments of the present invention may be programmed using an object-oriented programming language, such as SmallTalk, Java, C++, Ada, or C# (C-Sharp). Other object-oriented programming languages may also be used. Alternatively, functional, scripting, and/or logical programming languages may be used. Various aspects of the invention may be implemented in a non-programmed environment (e.g., documents created in HTML, XML or other format that, when viewed in a window of a browser program, render aspects of a graphical-user interface (GUI) or perform other functions). Various aspects of the invention may be implemented as programmed or non-programmed elements, or any combination thereof.

A variety of system elements including inputs, outputs and interfaces may exchange information with various external entities that may be information providers and/or information consumers. These external entities may include users and/or systems. Each of these system elements may both restrict exchanged information to a predefined set of values and validate any information exchanged prior to using the information or providing the information to other components.

In embodiments of the invention discussed above, systems and methods are described that provide indications of remaining cooling capacity for equipment enclosures. The indication of remaining cooling capacity may be a direct indication of remaining cooling in terms of, for example, kilowatts or BTU per hour, or the indication may be indirect such as providing the total capacity of cooling available to an enclosure along with an indication of how much cooling is being used, for example, in terms of percentage. Further, calculated values, including the capture index and the recirculation index may be used to determine the sufficiency of a particular design and to determine additional cooling capacity before a warning or error condition will result.

Embodiments of a systems and methods described above are generally described for use in relatively large data centers having numerous equipment racks, however, embodiments of the invention may also be used with smaller data centers and with facilities other than data centers. Further, as discussed above, embodiments of the present invention may be used with facilities having raised floors as well as with facilities that do not have a raised floor.

In embodiments of the present invention discussed above, results of analyses are described as being provided in real-time. As understood by those skilled in the art, the use of the term real-time is not meant to suggest that the results are available immediately, but rather, are available quickly giving a designer the ability to try a number of different designs over a short period of time, such as a matter of minutes.

Having thus described several aspects of at least one embodiment of this invention, it is to be appreciated various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

What is claimed is:

1. A computer-implemented method for managing a data center configuration using a computer, the computer including a memory and at least one processor coupled to the memory, the method comprising acts of:
   receiving, by the at least one processor, from a user, a proposed change to the data center configuration through a displayed graphical user interface including an interactive representation of a first layout of an identified space in a data center and including a plurality of displayed and selectable user interface elements including: a user interface element for adding equipment in the first layout, a user interface element for deleting equipment in the first layout, a user interface element for editing equipment in the first layout, and a user interface element for moving equipment in the first layout, the proposed change including a selection of one of the plurality of displayed user interface elements and including data identifying at least one element of data center equipment to be provisioned in the data center, the at least one element of data center equipment having a plurality of data center resource requirements, wherein receiving the proposed change includes scanning an identifier to provide the data identifying the at least one element of data center equipment;
   determining in real-time, by the at least one processor, a series of locations in the data center arranged consecutively according to an amount of excess data center resource capacity that is unusable due to insufficient associated capacity of at least one other data center resource, at least one location of the series of locations having a plurality of data center resources that satisfy the plurality of data center resource requirements of the at least one element of data center equipment;
   updating the interactive representation in real-time, by the at least one processor, to display a second layout including the at least one element of data center equipment to be provisioned in the data center;
   generating, by the at least one processor, a work order identifying a set of tasks required to complete the proposed change;
   presenting, by the at least one processor, the set of tasks via an output of a computer system of an external entity; and
   storing, by the at least one processor, the at least one location and status information associated with the work order on a computer readable medium.

2. The method according to claim 1, wherein the act of receiving, from the user, the proposed change includes an act of receiving, from the user, the proposed change to the data center configuration though an interactive representation of a layout of a rack or a data center room.

3. The method according to claim 1, wherein the identifier is a barcode.

4. The method according to claim 1, wherein the act of determining the at least one location includes an act of determining at least one location in near real-time.

5. The method according to claim 1, wherein the act of determining the at least one location includes an act of determining a location that minimizes, relative to at least one other location, the amount of excess data center resource capacity that is unusable.

6. The method according to claim 1 wherein the act of receiving, by the at least one processor, from the user, the proposed change includes an act of presenting, to the user, a representation of the at least one element of data center equipment as placed in inactive storage, and the method further includes an act of recording the at least one element of data center equipment as placed in inactive storage.

7. The method according to claim 6, wherein the act of receiving, by the at least one processor, from the user, the proposed change includes an act of presenting, to the user, an interactive representation that is updated based on the proposed change.

8. The method according to claim 7, wherein the act of presenting, to the user, the interactive representation that is updated based on the proposed change includes an act of presenting, to the user, the interactive representation updated in near real-time.

9. The method according to claim 1, further comprising acts of:
   detecting a change in the power demanded at a power distribution device associated with the work order; and
   recording the work order as completed based on the change in power demanded.

10. The method according to claim 1, wherein the set of tasks is grouped together into the work order, the work order dictating work to be performed and including textual instructions and pictures.

11. The method according to claim 10, wherein in response to grouping the set of tasks into the work order, dispatching the work order for implementation.

12. The method according to claim 11, wherein dispatching the work order occurs automatically and is based on a set of preconfigured rules based on characteristics of the work order and an additional user's physical location, physical area of responsibility, recent and current work load, remaining schedule availability, and area of expertise.

13. The method according to claim 11, wherein in response to dispatching the work order and the work dictated by the work order being performed, the work order is modified by one or more of recording installation of an alternative model of equipment, rearranging of an order of equipment within a rack, reconfiguring a flow of power, and changing a status of the work order; and
   in response to the user modifying the work order using a remote computing device, information required to complete the modification is entered using an interface supported by the remote computing device by scanning the identifier.

14. The method according to claim 1, wherein the work order specifies the at least one element of data center equipment, and the method further comprises:
   marking the work order complete in response to recognizing a resource consumption benchmark or a production benchmark of the data center.

15. The method according to claim 1, wherein storing, by the at least one processor, the at least one location on the computer readable medium further comprises:
   transmitting the data center configuration including the proposed change to a data center configuration management database (CMDB); and
   updating the CMDB as configuration changes are made.

16. The method according to claim 1, wherein each data center resource of the plurality of data center resources is one of power, cooling, physical space, weight support, remote equipment control capability, physical and logical security, and physical and logical network connectivity.

17. The method according to claim 1, wherein
   at least one data center resource of the plurality of data center resources includes one of a power distribution resource, power available for distribution, power generated by an onsite generator, and power supplied by UPSs;
   at least one data center resource of the plurality of data center resources includes one of data center floor space and rack U space;
   at least one data center resource of the plurality of data center resources includes cooling distribution capacity and cooling generation capacity;
   at least one data center resource of the plurality of data center resources includes one of security cameras and door locks;
   at least one data center resource of the plurality of data center resources includes one of Virtual Local Area Networks, Domain Name Services, and Dynamic Host Configuration Protocol Services;
   at least one data center resource of the plurality of data center resources includes one of network cabling and patch panels; and
   at least one data center resource of the plurality of data center resources includes one of Keyboard Video Mouse services.

\* \* \* \* \*